(12) United States Patent  
Hara

(10) Patent No.: US 8,149,486 B2  
(45) Date of Patent: Apr. 3, 2012

(54) RECORDING DEVICE, RECORDING/REPRODUCING METHOD, AND REPRODUCING METHOD

(75) Inventor: Masaaki Hara, Tokyo (JP)

(73) Assignee: Sony Corporation, Tokyo (JP)

( * ) Notice: Subject to any disclaimer, the term of this patent is extended or adjusted under 35 U.S.C. 154(b) by 601 days.

(21) Appl. No.: 12/373,743

(22) PCT Filed: Mar. 19, 2008

(86) PCT No.: PCT/JP2008/055043  
§ 371 (c)(1),  
(2), (4) Date: Jan. 14, 2009

(87) PCT Pub. No.: WO2008/142903  
PCT Pub. Date: Nov. 27, 2008

(65) Prior Publication Data  
US 2009/0262406 A1    Oct. 22, 2009

(30) Foreign Application Priority Data

May 22, 2007    (JP) .................................. 2007-135624

(51) Int. Cl.  
*G02B 5/32* (2006.01)
(52) U.S. Cl. ............................................ 359/21; 359/32
(58) Field of Classification Search .................. None  
See application file for complete search history.

(56) References Cited

U.S. PATENT DOCUMENTS

| 5,285,308 A | 2/1994 | Jenkins et al. |
| 7,623,279 B1 * | 11/2009 | Ayres ............................... 359/22 |
| 2008/0144147 A1 * | 6/2008 | Hara et al. ......................... 359/3 |

FOREIGN PATENT DOCUMENTS

| EP | 1 280 143 A1 | 1/2003 |
| EP | 1 306 732 A1 | 5/2003 |

(Continued)

OTHER PUBLICATIONS

Horimai, H. et al., "Holographic Medium ready for taking off, turning 200 gigabytes storage capacity into reality in 2006", Nikkei Electronics, pp. 106-114, (2005) (partial English translation only).

(Continued)

*Primary Examiner* — Derek S Chapel  
(74) *Attorney, Agent, or Firm* — Oblon, Spivak, McClelland, Maier & Neustadt, L.L.P.

(57) ABSTRACT

A hologram recording and reproduction method is configured such that the number of values which can be implemented per one pixel is increased from two according to a conventional method to three or more to achieve increase of the data recording capacity. While two values are conventionally represented by two different values of "0" and "1" of the amplitude, for example, phases "0" and "π" are combined with the amplitudes "0" and "1" thereby to make it possible to represent three values of "0," "1" and "−1" (amplitude "1"×phase "π"). In particular, a two-value data train of "0" and "1" is converted into another data train of three values of "0," "1" and "−1" in accordance with a rule for encoding determined in advance, and the amplitude "0" is allocated to pixels of the value "0"; the amplitude "1" (phase "0") is allocated to pixels of the value "1"; and the amplitude "1" and the phase "π" are allocated to pixels of the value "−1," to carry out recording. Increase of the data recording capacity can be achieved thereby.

15 Claims, 27 Drawing Sheets

FOREIGN PATENT DOCUMENTS

| | | |
|---|---|---|
| GB | 1 536 434 A | 12/1978 |
| JP | 2006 107663 | 4/2006 |
| JP | 2007 250076 | 9/2007 |
| JP | 2007 335056 | 12/2007 |
| JP | 2008 46248 | 2/2008 |
| WO | WO 02/05270 A1 | 1/2002 |

OTHER PUBLICATIONS

European Search Report issued Aug. 30, 2011, in Patent Application No. 08722433.3.

John Renu, et al., "Content-addressable Holographic Digital Data Storage Based on Hybrid Ternary Modulation with a Twisted-Nematic Liquid-Crystal Spatial Light Modulator", Optical Review, vol. 12, No. 3, XP019353265, May 1, 2005, pp. 155-160.

Geoffrey W. Burr, et al., "Gray-scale data pages for digital holographic data storage", Optics Letters, vol. 23, No. 15, XP000783067, Aug. 1, 1998, pp. 1218-1220.

W. Züehlke, "Vergleich verschiedener 4-B-3-T-Codierungen", Nachrichtentechnik Elektronik, vol. 28, No. 6, XP000760171, Jun. 1, 1978, pp. 252-256.

* cited by examiner

FIG. 7
(a)
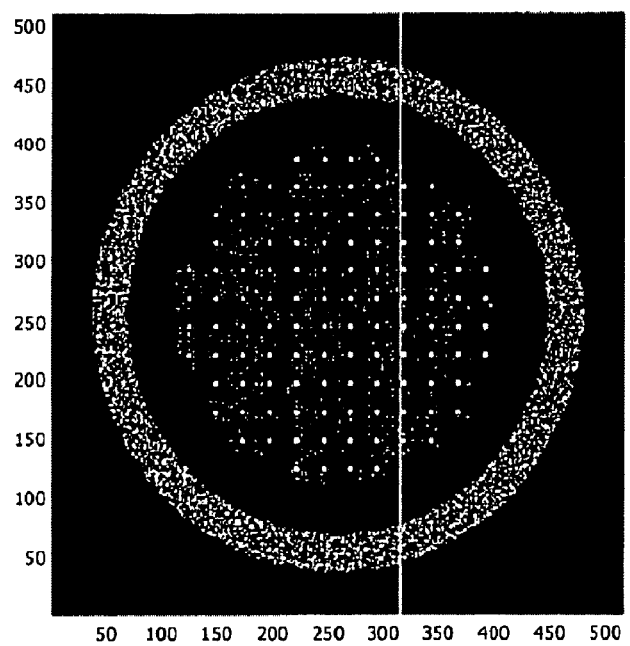
BLACK···0
WHITE···1
(b)
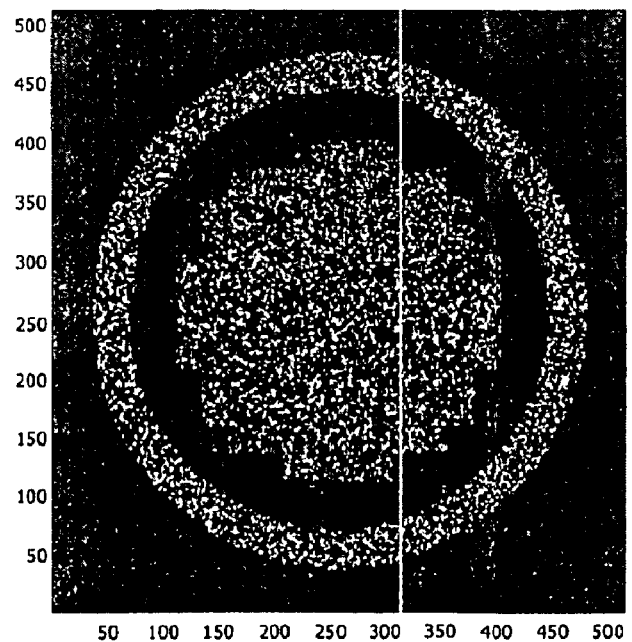
BLACK····1
GRAY···0
WHITE···+1

FIG. 8
(a)
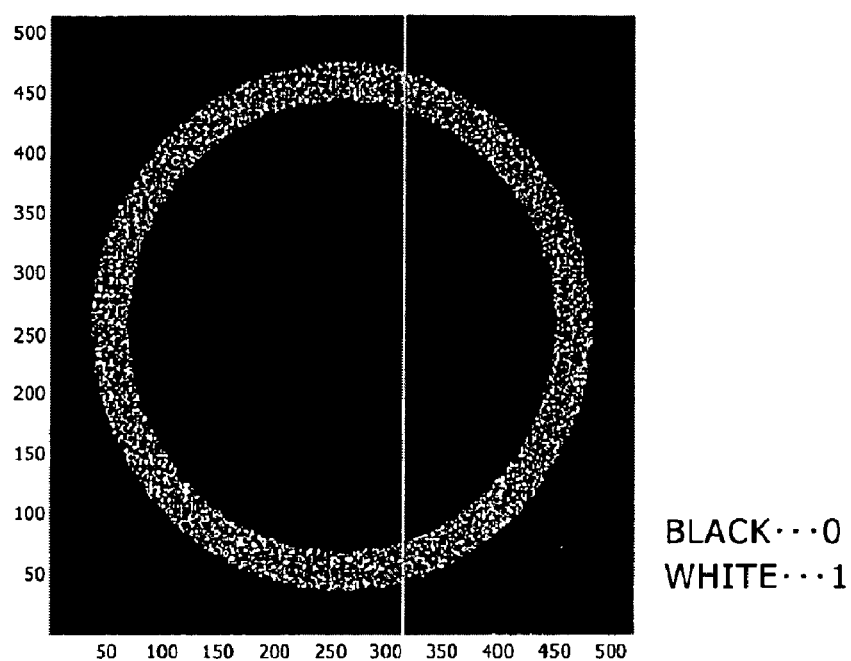
BLACK⋯0
WHITE⋯1
(b)
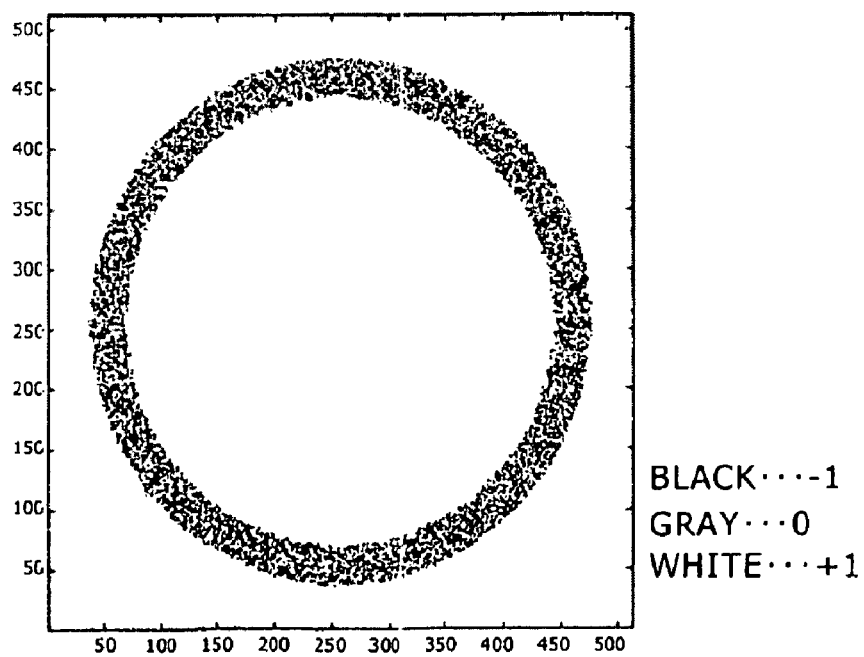
BLACK⋯−1
GRAY⋯0
WHITE⋯+1

FIG. 10
(a)
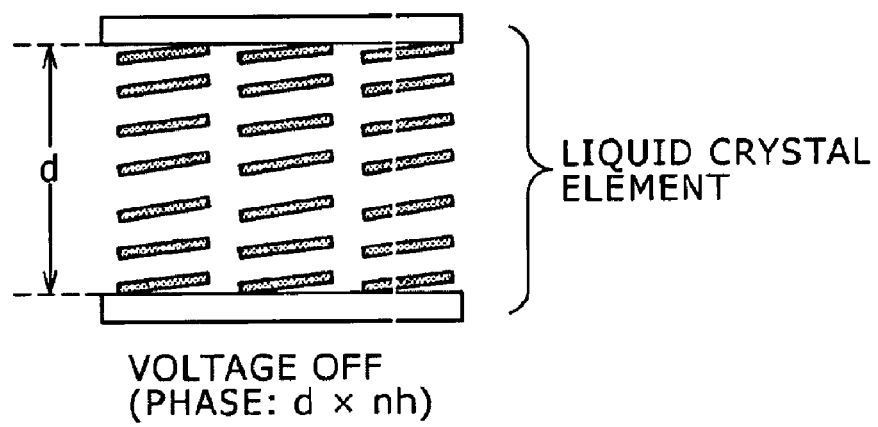
VOLTAGE OFF
(PHASE: d × nh)
(b)
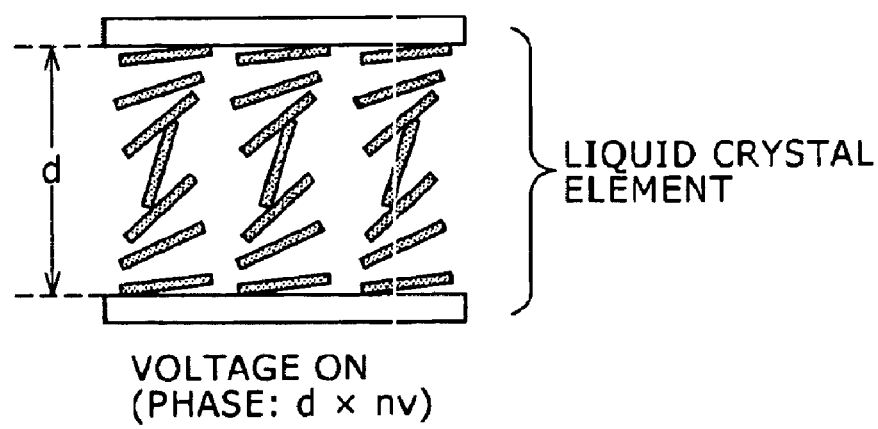
VOLTAGE ON
(PHASE: d × nv)

BLACK···0
WHITE···1

ADDITION OF COHERENT LIGHTS

FIG.20
(a)
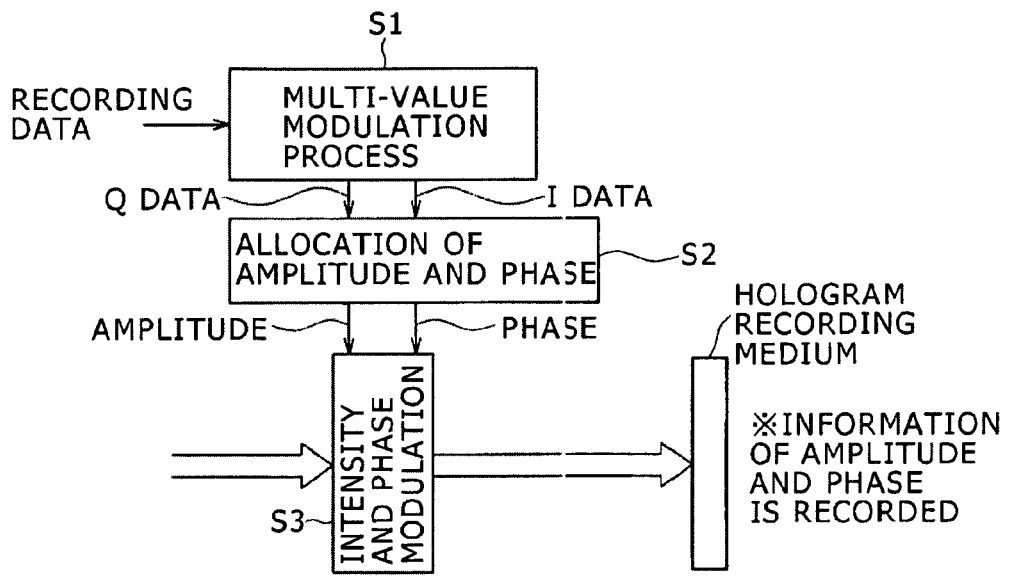
(b)
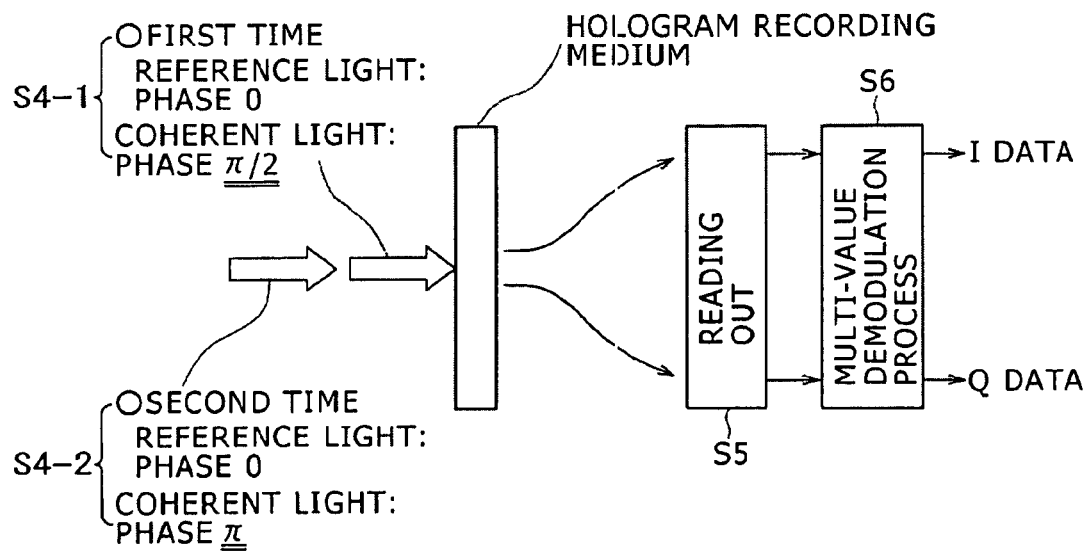

(x,y): AMPLITUDE OF RECORDED SIGNAL ON I AXIS AND Q AXIS
a: ADDED AMPLITUDE ON I AXIS
b: ADDED AMPLITUDE ON Q AXIS
c: SQUARE ROOT OF SENSOR OUTPUT OF I-AXIS ADDITION
d: SQUARE ROOT OF SENSOR OUTPUT OF Q-AXIS ADDITION (x,y): AMPLITUDE OF RECORDED SIGNAL ON I AXIS AND Q AXIS
a: ADDED AMPLITUDE ON I AND Q AXES (a = b FOR SIMPLIFICATION)
c: SQUARE ROOT OF SENSOR OUTPUT OF I-AXIS ADDITION
d: SQUARE ROOT OF SENSOR OUTPUT OF Q-AXIS ADDITION

FIG.27
(a)
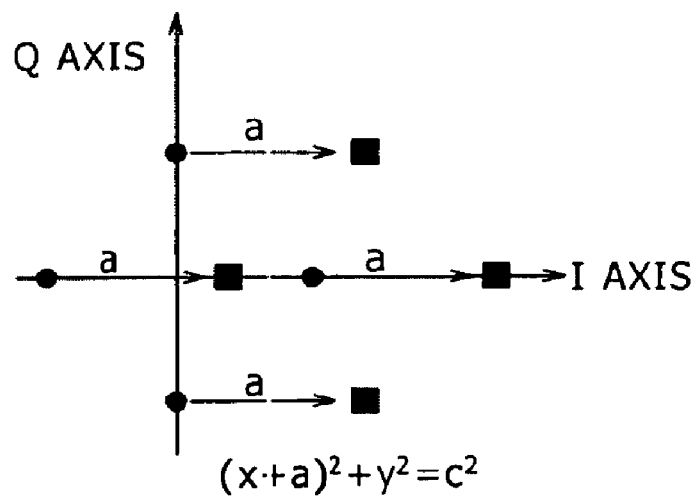
(b)
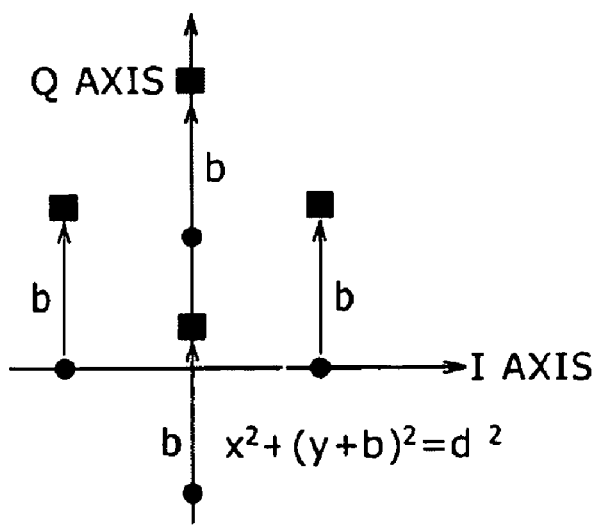

RECORDING DEVICE, RECORDING/REPRODUCING METHOD, AND REPRODUCING METHOD

TECHNICAL FIELD

This invention relates to a recording apparatus for carrying out recording on a hologram recording medium on which data are recorded as interference fringes of reference light and signal light, and a recording and reproduction method for carrying out recording on and reproduction from the hologram recording medium. The present invention further relates to a reproduction method for carrying out reproduction from a hologram recording medium on which information of the light intensity and the phase based on a combination of I data and Q data obtained by a modulation process according to a PSK method or a QAM method is recorded as interference fringes of reference light and signal light.

BACKGROUND ART

In a hologram recording and reproduction method, particularly in a hologram recording and reproduction method in the field of optical storage systems, an SLM (Spatial Light Modulator) such as, for example, a transmission type liquid crystal panel or a DMD (Digital Micro mirror Device) is used for light intensity modulation, and such intensity modulation that a pattern array of bit 1 (for example, the light intensity=high) and bit 0 (for example, the light intensity=low) is obtained is applied to signal light.

At this time, in the SLM, light intensity modulation is applied at a central portion of the SLM in response to recording data to produce signal light while light is transmitted in the form of a ring around the signal light to produce reference light, for example, in such a manner as illustrated in FIG. 2. Then, the signal light modulated in response to the recording data is irradiated upon a hologram recording medium together with the reference light, whereupon interference fringes of the signal light and the reference light are recorded as data on the hologram recording medium.

On the other hand, upon reproduction of data, only the reference light described above is produced by the SLM and is irradiated upon the hologram recording medium to obtain diffraction light corresponding to the interference fringes. An image according to the diffraction light is formed on an image sensor such as, for example, a CCD (Charge Coupled Device) sensor or a CMOS (Complementary Oxide Semiconductor) sensor to obtain values of recording bits to carry out data reproduction.

A hologram recording and reproduction method wherein signal light and reference light are irradiated on the same optical axis in this manner is known as a coaxial method.

It is to be noted that, as a related prior art, Nikkei Electronics, Jan. 17, 2005 pp. 106-114 can be listed up.

Here, such a technique of hologram recording and reproduction as described above is expected as a large capacity data storage technique of the next generation which is to replace various optical disk media, an HDD (Hard Disc Drive) and so forth which are placed in practical use in the present situation. From this point, it is desired to further increase the data recording capacity as a technique for hologram recording and reproduction.

DISCLOSURE OF INVENTION

Taking such a subject as described above, according to the present invention, a recording apparatus is configured in the following manner.

In particular, the recording apparatus of the present invention is a recording apparatus for carrying out recording on a hologram recording medium on which data are recorded as interference fringes of reference light and signal light, and includes spatial light intensity modulation means for carrying out spatial light intensity modulation in a unit of a pixel, and spatial light phase modulation means for carrying out spatial light phase modulation in a unit of a pixel.

The recording apparatus further includes an optical system for introducing light emitted from a light source to the hologram recording medium through the spatial light intensity modulation means and the spatial light phase modulation means. The recording apparatus further includes conversion means for converting an input data train formed from combinations of two different values into another data train formed from combinations of three or more different values.

Furthermore, the recording apparatus further includes amplitude and phase controlling means for controlling the light intensity and the phase of each of the pixels of the spatial light intensity modulation means and the spatial light phase modulation means in response to each of the values of the data train obtained from the conversion means.

Here, on the hologram recording medium, also information of the phase can be recorded together with information of the light intensity (information of the amplitude).

Where a data train formed from combinations of two different values is converted into another data train formed from combinations of three or more values and the amplitude and the phase of each pixel are controlled in response to each value of the data train formed from such three or more different values as in the present invention described above, information can be recorded with a smaller number of bits than that in an alternative case wherein a data train formed from combinations of two different values is recorded while only ON/OFF of the amplitude is controlled as in the prior art. In other words, a greater amount of information can be recorded under the condition of a limited number of pixels.

In this manner, according to the present invention, by using recording modulation encoding wherein also the phase is combined together with the amplitude, the same information can be represented with a number of bits smaller than that by the prior art. As a result, increase of the data recording capacity can be achieved.

BRIEF DESCRIPTION OF DRAWINGS

FIG. 7 is a view illustrating that suppression of a DC component is achieved by phase modulation by a phase mask.

FIG. 8 is a view schematically showing reference light upon reproduction in a case wherein a phase mask is provided.

FIG. 10 is a view illustrating a structure of a liquid crystal element which can carry out phase modulation in a unit of a pixel.

FIG. 20 is a view illustrating an outline of hologram multi-value recording/reproduction as a second embodiment.

FIG. 27 is a view illustrating a modification to the second embodiment.

BEST MODE FOR CARRYING OUT THE INVENTION

In the following, the best mode (hereinafter referred to as embodiments) for carrying out the invention is described.

It is to be noted that the description is given in the following order.

Figure 1:
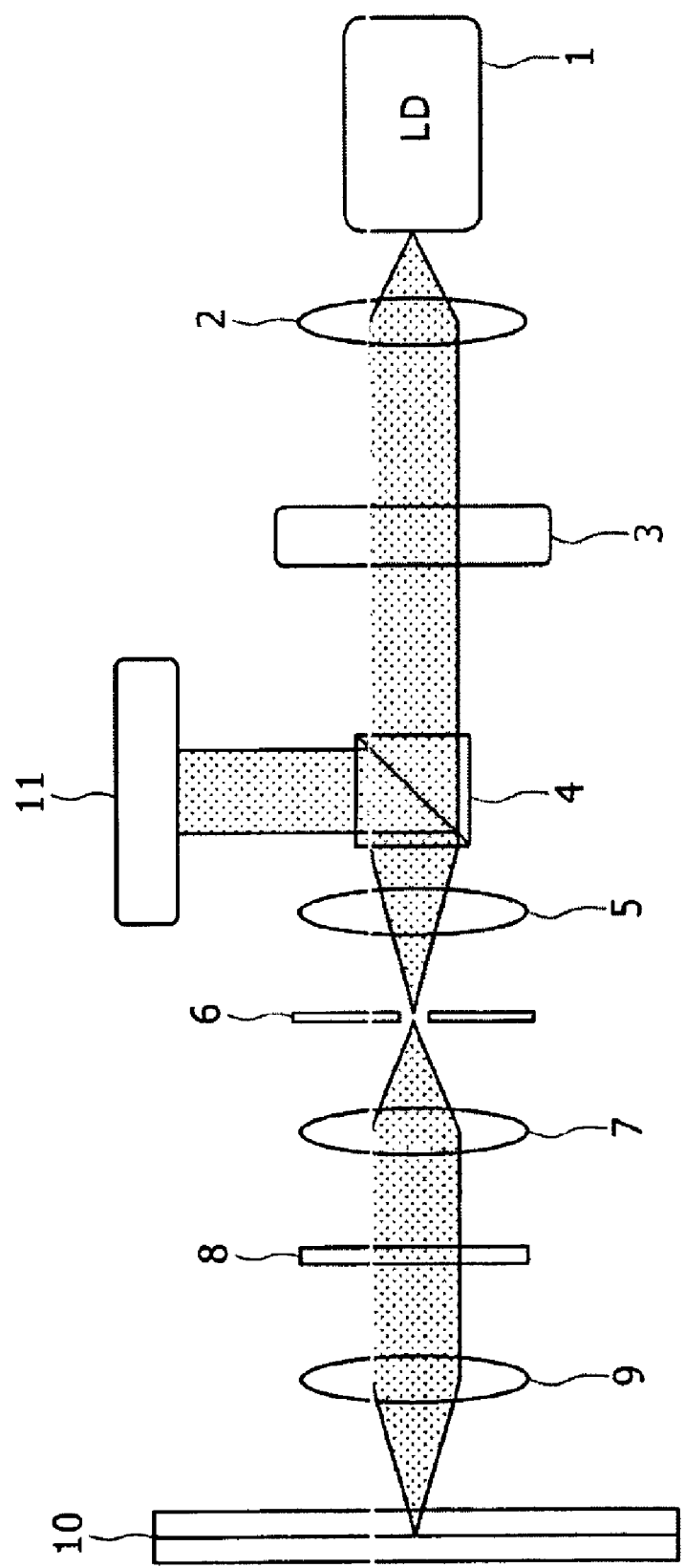
FIG. 1 is a view showing an example of an internal configuration of a hologram recording and reproduction apparatus in which the coaxial method is adopted as a view illustrating basic operation of hologram recording and reproduction.

1. Description of Basic Operation of Hologram Recording and Reproduction
 1-1. Example of a Basic Apparatus Configuration and Operation
 1-2. Recording Method Using a Phase Mask
2. Linear Reading Out by Coherent Light Addition
 2-1. Irradiation of Coherent Light
 2-2. Reproduction Signal Process for Linear Reading Out
3. Recording/Reproduction as Embodiments
 3-1. First Embodiment (three-value recording/reproduction)
 3-2. Second Embodiment (multi-value recording/reproduction)
 3-3. Modification to the Second Embodiment
4. Modifications 1. Description of a Basic Operation of Hologram Recording and Reproduction 1-1. Example of a Basic Apparatus Configuration and Operation FIG. 1 is a view showing an internal configuration of a hologram recording and reproduction apparatus in which, for example, a coaxial method is adopted. It is to be noted that, in FIG. 1, only the configuration principally of an optical system of the recording and reproduction apparatus is shown in an extracted fashion while the other part is omitted.

It is to be noted that, according to the coaxial method, signal light and reference light are disposed on the same axis as described hereinabove, and both of the signal light and the reference light are irradiated upon a hologram recording medium set at a predetermined position to carry out data recording by interference fringes. On the other hand, upon reproduction, the reference light is irradiated upon the hologram recording medium to carry out reproduction of the data recorded in the form of interference fringes.

In this FIG. 1, a configuration of a recording and reproduction apparatus compatible with a hologram recording medium of the reflection type including a reflection film is illustrated as a hologram recording medium.

First, a laser diode (LD) 1 is provided as a light source for obtaining a laser beam for recording and reproduction. As this laser diode 1, for example, a laser diode with an external resonator is adopted, and the wavelength of the laser beam is, for example, 410 nm.

The emergent light from the laser diode 1 passes through a collimator lens 2 and enters an SLM (Spatial Light Modulation section) 3.

The SLM 3 is formed, for example, from a transmission type liquid crystal panel or the like and carries out light intensity modulation for incident light in accordance with recording data as each pixel is driven and controlled in response to a driving signal from a driving circuit not shown. Specifically, the SLM 3 can carry out ON/OFF control of light in pixel unit (in a unit of a pixel) such that, for example, a pixel which is turned ON in accordance with the driving signal transmits the incident light therethrough while another pixel which is turned OFF does not transmit the incident light therethrough. By such ON/OFF control of the SLM 3 as just described, it is possible to record data of "0" and "1" in a unit of a pixel.

The light subjected to the spatial light modulation by the SLM 3 described above is transmitted through a polarizing beam splitter 4 and passes through a relay lens optical system including a relay lens 5→light blocking mask 6→relay lens 7 and then through a quarter wave plate 8, whereafter it is condensed by an objective lens 9 and irradiated upon a hologram recording medium 10.

Here, upon recording, signal light subjected to spatial light intensity modulation in accordance with the recording data by the SLM 3 in such a manner as hereinafter described and reference light of a ring shape which forms a concentric circle with the signal light are produced. Namely, the signal light and the reference light produced in this manner are condensed on the hologram recording medium 10 after they pass along the route described above.

On the other hand, upon reproduction, light from the laser diode 1 is introduced into the SLM 3 through the collimator lens 2 similarly as upon recording. Upon reproduction, the SLM 3 carries out spatial light intensity modulation for reproduction for the incident light to produce only reference light. In other words, upon reproduction, no signal light is irradiated, but only the reference light is irradiated upon the hologram recording medium 10.

In response to the irradiation of the reference light, diffraction light in accordance with the recorded data on the hologram recording medium 10 is obtained in such a manner as hereinafter described. This diffraction light passes as reflected light from the hologram recording medium 10 through the objective lens 9 and is introduced to the polarizing beam splitter 4 through the quarter wave plate 8→relay lens 7→light blocking mask 6→relay lens 5. By the polarizing beam splitter 4, the reflection light from the hologram recording medium 10 introduced along the route described above is reflected, and the reflected light is introduced to an image sensor 11 as seen in the figure.

The image sensor 11 includes an image pickup element such as, for example, a CCD (Charge Coupled Device) sensor or a CMOS (Complementary Oxide Semiconductor) sensor, and receives the reflected light (diffracted light) from the hologram recording medium 10 introduced in such a manner as described above and converts the received light into an electric signal.

Figure 2:
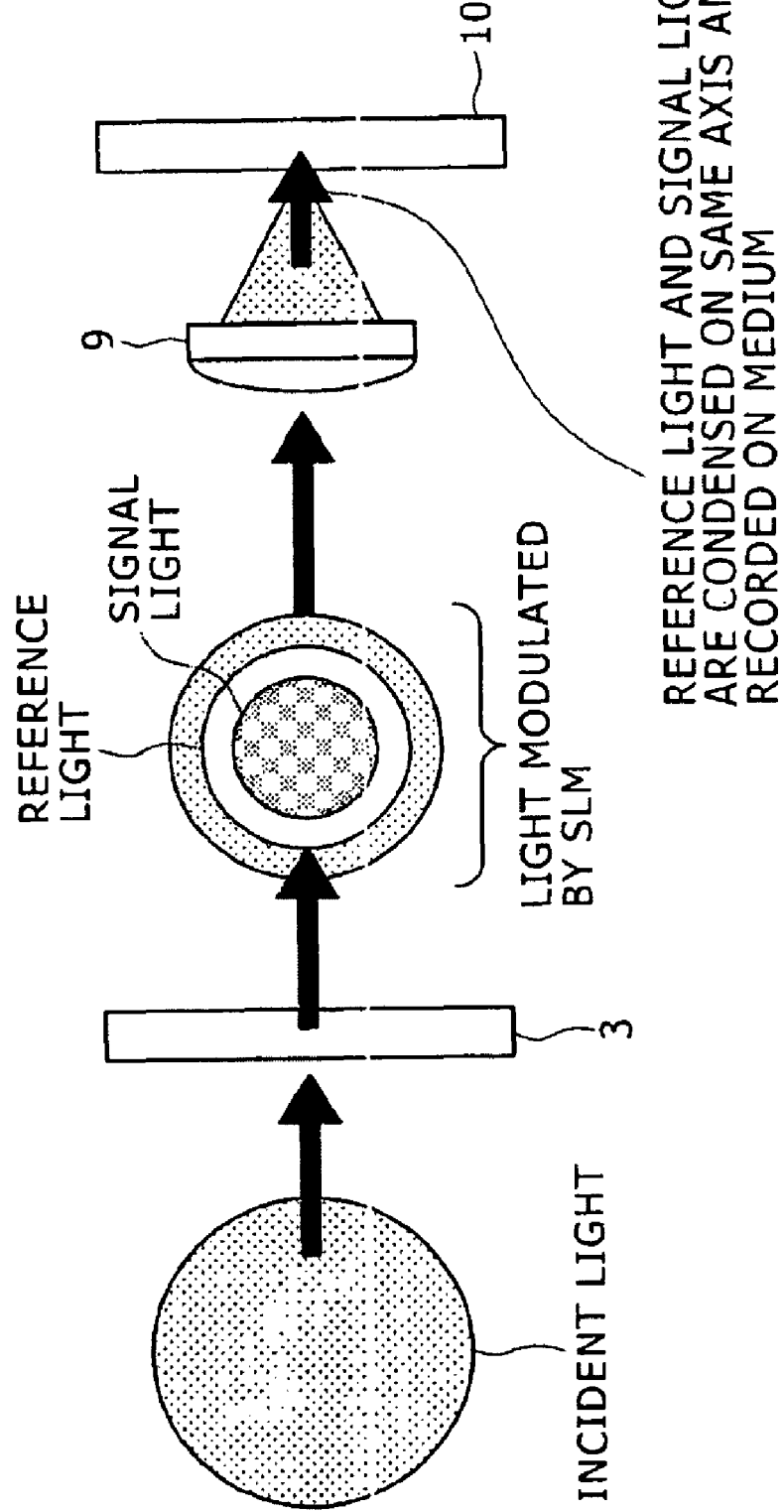
FIG. 2 is a view illustrating a recording technique of a hologram recording medium.
Figure 3:
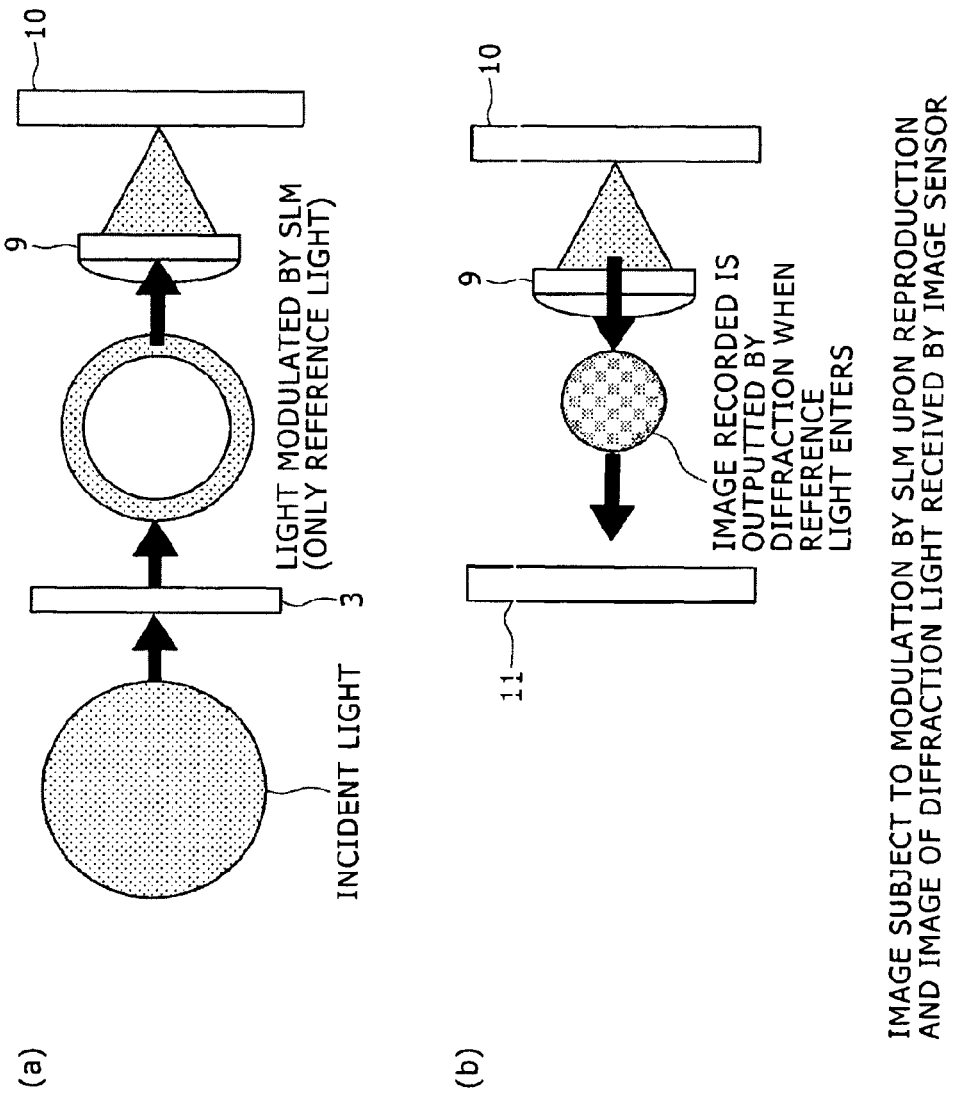
FIG. 3 is a view illustrating a reproduction technique of a hologram recording medium.

FIGS. 2 and 3 are views illustrating basic operation of hologram recording and reproduction implemented by the configuration of the optical system described above. FIG. 2 illustrates operation upon recording, and FIG. 3 illustrates operation upon reproduction.

It is to be noted that, in FIG. 2, only the SLM 3 and the objective lens 9 of the optical system shown in FIG. 1 are shown in an extracted fashion. Meanwhile, in FIG. 3, (a) of FIG. 3 shows only the SLM 3 and the objective lens 9 similarly, and (b) of FIG. 3 shows only the objective lens 9 and the image sensor 11 in an extracted fashion.

First, upon recording in FIG. 2, the SLM 3 carries out intensity modulation for the incident light so that the reference light described above and light (called signal light) to which a light intensity pattern based on a data pattern of "0" and "1" is provided are disposed on a concentric circle based on recording data.

This intensity modulated light (that is, the reference light and the signal light) is condensed on the hologram recording medium 10 by the objective lens 9, and interference fringes of the reference light and the signal light formed thereby are recorded on the hologram recording medium 10.

On the other hand, upon reproduction, the SLM 3 carries out spatial light intensity modulation for the incident light to produce only the reference light in such a manner as seen in (a) of FIG. 3 first, and this reference light is condensed on the hologram recording medium 10. Thereupon, the condensed light undergoes diffraction by the interference fringes recorded in accordance with the data pattern on the hologram recording medium 10 and is outputted as reflected light from the hologram recording medium 10. Namely, this diffracted light has a light intensity pattern which reflects the recording data in such a manner as seen in the figure, and data reproduction is carried out based on a result of detection of the intensity pattern which the diffracted light has by means of the image sensor 11.

Figure 4:
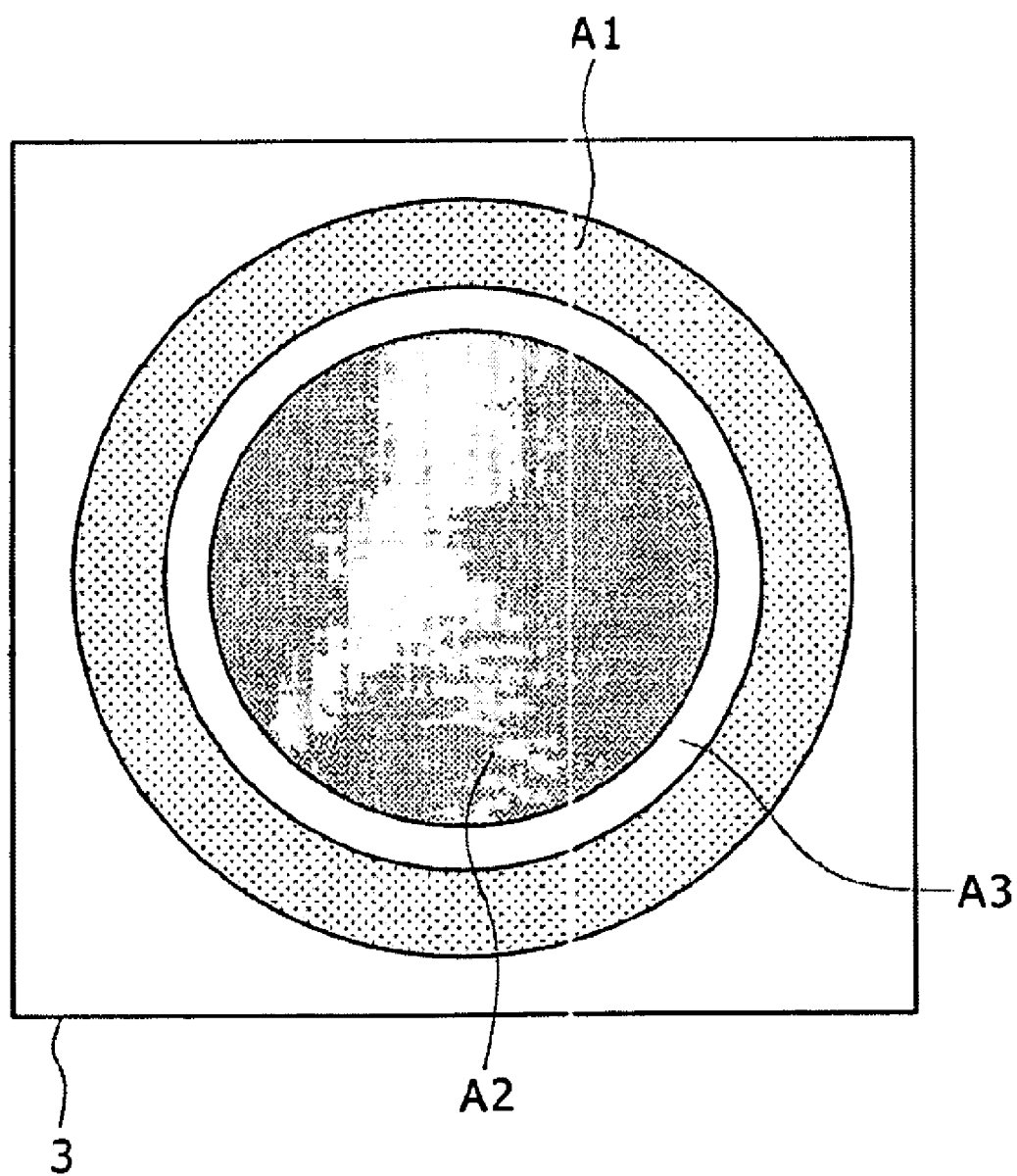
FIG. 4 is a view illustrating various areas including a reference light area, a signal light area and a gap area defined by a spatial light modulation section.

Here, as described hereinabove, in the SLM 3, reference light and signal light are produced corresponding to recording/reproduction as described above. Therefore, in the SLM 3, such a reference light area A1, a signal light area A2 and a gap area A3 as shown in the next FIG. 4 are defined. Namely, as seen in FIG. 4, a predetermined circular area including a central portion of the SLM 3 is defined as the signal light area A2. And, on an outer circumferential portion of the signal light area A2, the reference light area A1 of a ring shape which forms a concentric circle with the signal light area A2 is defined with the gap area A3 interposed therebetween.

It is to be noted that the gap area A3 described above is defined as a region for avoiding that reference light leaks into the signal light area A2 and makes noise.

Upon recording, pixels determined in advance in the reference light area A1 are set to "1" (light intensity=high) and the other pixels are set to "0" (light intensity=low), and besides the pixels in the gap area A3 and an outer peripheral portion with respect to the reference light area A1 are all set to "0." Further, the pixels in the signal light area A2 are set to a pattern of "0" and "1" in accordance with recording data. By this such reference light and signal light as illustrated in FIG. 2 can be produced and outputted.

On the other hand, upon reproduction, the pixels in the reference light area A1 are set to the pattern of "0" and "1" same as that upon recording while the pixels in the other region are all set to the bit "0." By this, only the reference light can be produced and outputted in such a manner as seen in (a) of FIG. 3.

1-2. Recording Method Using a Phase Mask

Here, where the basic operation itself of the hologram recording and reproduction described as above is carried out, there is the possibility that a DC component of a very high signal intensity which increases in proportion to the number of "1" in the signal light area A2 may be recorded.

Generally in hologram recording and reproduction, it is supposed that hologram pages are recorded in a multiplexed state on the hologram recording medium 10. If this is taken into consideration, then a portion on which such a DC component as described above is recorded becomes a portion on which another hologram page cannot be recorded in an overlapping relationship. As a result, individual hologram pages must be recorded in a spaced relationship from each other, and expansion of the recording capacity cannot be achieved.

Therefore, as a method for suppressing such a DC component as described above to achieve increase of the recording capacity, a technique which uses such a phase mask as disclosed, for example, in Japanese Patent Laid-Open No. 2006-107663 is proposed conventionally.

Figure 5:
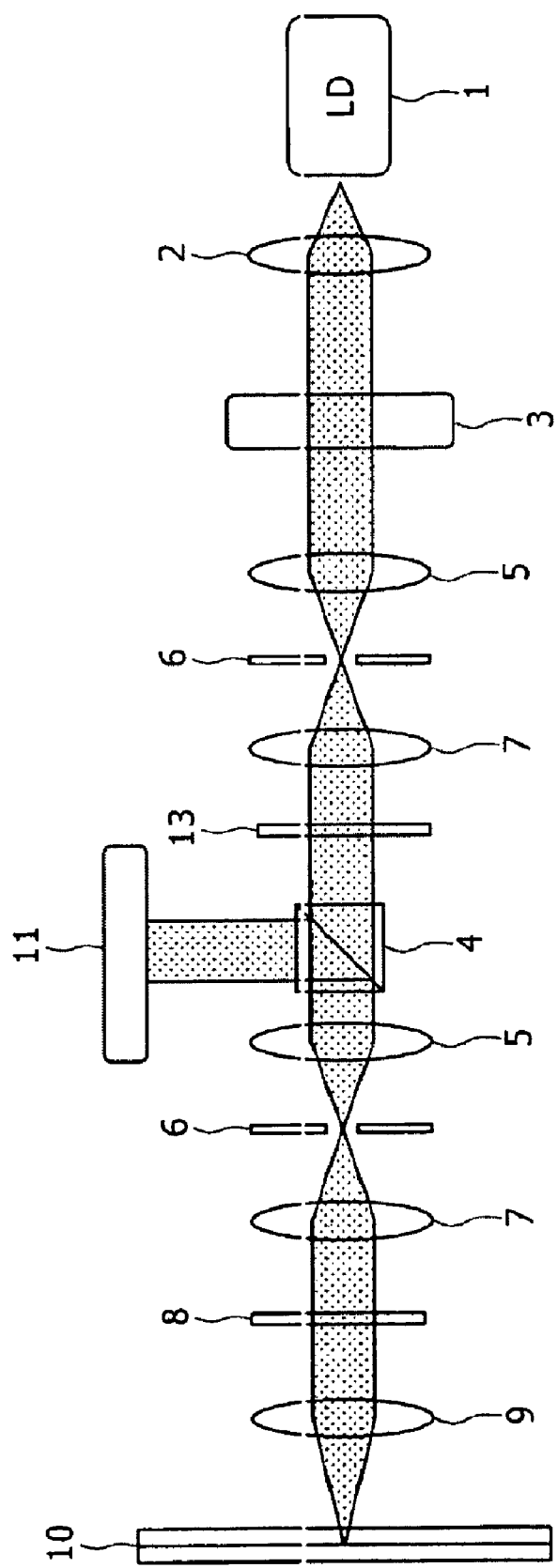
FIG. 5 is a view showing an example of an internal configuration of a recording and reproduction apparatus in a case wherein a phase mask is provided.

FIG. 5 shows an example of a configuration of a recording and reproduction apparatus where a phase mask is used. It is to be noted that, in FIG. 5, those elements which are already described with reference to FIG. 1 are denoted by like reference numerals and description of them is omitted.

Here, the phase mask should be provided in such a manner as to apply phase modulation on a real image plane in a light path. In the example of FIG. 5, a set of the relay lens 5→light blocking mask 6→relay lens 7 is added between the SLM 3 and the polarizing beam splitter 4 in the configuration of FIG. 1, and a phase mask 13 is inserted on a real image plane between the added relay lens 7 and the polarizing beam splitter 4.

Figure 6:
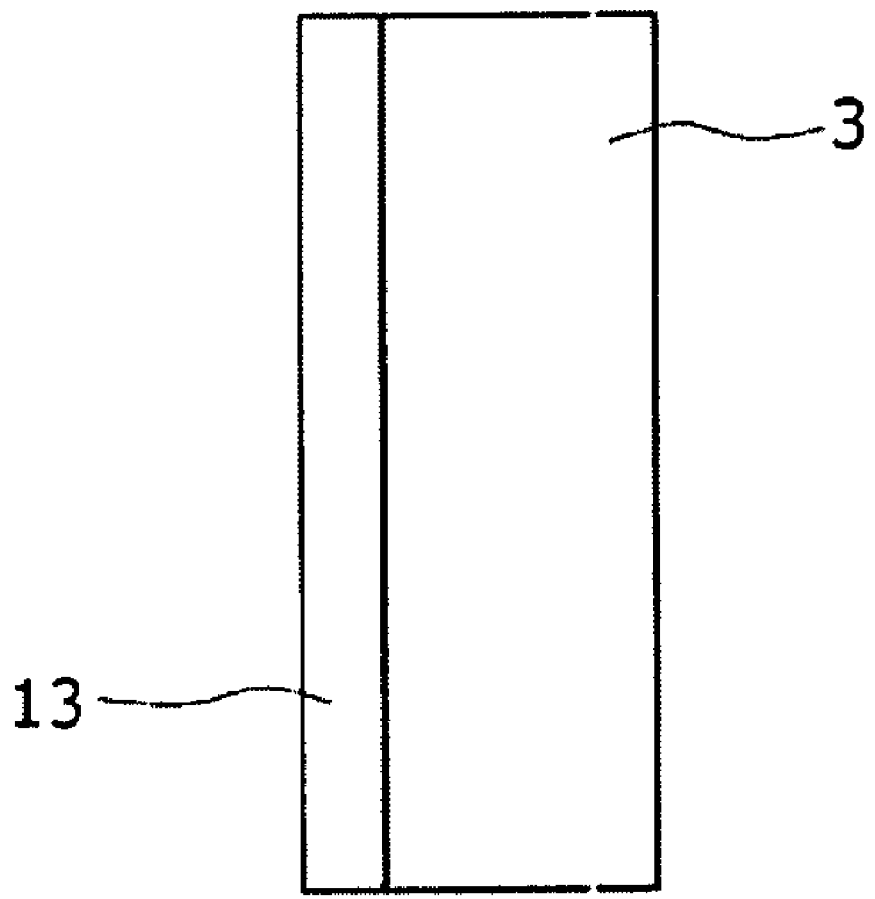
FIG. 6 is a view showing a configuration in a case wherein a phase mask and a spatial light modulator are formed integrally.

Or, as shown FIG. 6, the phase mask 13 may be provided in a form integral with the SLM 3. In particular, since a portion at which emergent light from the SLM 3 is obtained corresponds to the real image plane, the phase mask 13 is formed integrally with the light emergent face side of the SLM 3.

Here, phase modulation by such a phase mask 13 as described above is carried out in a unit of a pixel for incident light. Specifically, for example, a random phase modulation pattern wherein those pixels which modulate the phase by π and those pixels which do not carry out phase modulation (that is, the phase=0) are set so as to be fifty-fifty.

As an example of a particular configuration of the phase mask 13 which can carry out such random phase modulation in a unit of a pixel, a configuration wherein the thickness is made different in a unit of a pixel is generally known. For example, a configuration is known wherein an optical material such as glass is used, and pixels of the phase "0" and pixels which carry out modulation by the phase "π" are set depending upon the light path length difference provided by the difference in thickness of the optical material.

Specifically, where phase modulation by "π" is to be provided, when the wavelength of the incident light is λ and the refractive index of the member used is n, the difference t in thickness should be set to $t=\lambda/\{2(n-1)\}$.

By the insertion of the phase mask 13 described above, upon recording, phase modulation of random "0" and "π" can be provided in a unit of a pixel to signal light. Here, the phase "0" corresponds to the amplitude "1" and the phase "π" corresponds to the amplitude "−1."

Since phase modulation according to a random pattern of two values is applied to the signal light in this manner, improvement of the interference efficiency between the reference light and the signal light can be achieved. Further, the spectrum can be distributed uniformly to a Fourier plane (image on the medium) simultaneously, and since the numbers of "1" and "−1" are substantially equal to each other, suppression of a DC component in the signal light can be achieved.

FIG. 7 is a view illustrating that suppression of a DC component can be achieved by phase modulation by the phase mask 13.

First, in (a) of FIG. 7 for comparison, signal light and reference light obtained upon recording where no mask is applied is schematically shown. It is to be noted that, in this figure, the light intensity is represented by the shade of color, and it is indicated that the light intensity increases from a dark color to the white color. Specifically, in this instance, the block color represents the light intensity=low (data "0") and the white color represents the light intensity=high (data "1").

From (a) of FIG. 7, it can be recognized that, where the phase mask 13 is not provided, only a pattern of "0" and "1" in accordance with recording data is applied to signal light. As described hereinabove, the DC component is generated in proportion to the number of "1."

It is to be noted that, from this figure, it can be recognized that a required data pattern of "0" and "1" is provided also to reference light.

(b) of FIG. 7 schematically illustrates signal light and reference light obtained upon recording where a phase mask is included. Also in this figure, it is indicated that the light intensity increases from a dark color to the white color. In this instance, however, the black color indicates "−1," a gray color "0" and the white color "+1." Referring to (b) of FIG. 7 while this is taken into consideration, it can be recognized that, where the phase mask 13 is provided, signal light is modulated not only to "0" and "+1" but also to "−1." The reason why such a result of "−1" is obtained is that, by such random phase modulation by "0" and "π" of the phase mask 13 as described above, pixels of the data "1" (that is, the light intensity=high) are divided into those of the phase "0" and those of the phase "π." Namely, from the data "1," where phase modulation is not carried out (phase "0"), a result of "+1" is obtained, but where modulation by the phase "r" is carried out, another result of "−1" is obtained. Describing for confirmation, since no transmission light from the SLM 3 is obtained with regard to the data "0," even if phase modulation of "0" or "π" by the phase mask 13 is carried out, a result of the phase modulation exhibits "0" without any change.

It is to be noted that, according to (b) of FIG. 7, it is indicated that, in this instance, phase modulation by the phases "0" and "π" is carried out also for the reference light and three values of "0," "+1" and "−1" are obtained.

Since the data "1" are divided into "+1" and "−1" by phase modulation of random "0" and "π" in signal light in this manner, the spectrum can be distributed uniformly on a medium. Further, where the numbers of "1" and "−1" are made substantially coincide with each other, suppression of the DC component in the signal light can be achieved, and multi-recording of hologram pages becomes possible and increase of the recording capacity can be achieved.

Incidentally, in FIG. 8, reference light upon reproduction where the phase mask 13 is provided is schematically shown. While, in (a) of FIG. 8, reference light where no phase mask is provided is shown for comparison, such reference light upon reproduction where no phase mask is provided is similar to that upon recording where no phase mask is provided in (a) of FIG. 7. In other words, also in this instance, a predetermined data pattern by "0" and "1" is provided to the reference light by the SLM 3.

Meanwhile, reference light where a phase mask is provided in (b) of FIG. 8 is similar to that in the case upon recording where a phase mask is provided in (b) of FIG. 7. In other words, since, also in this instance, a predetermined data pattern by "0" and "1" is provided to the reference light by the SLM 3 and phase modulation by the same phase mask 13 is carried out, a result similar to that in the case of (b) of FIG. 7 is obtained.

It is to be noted that what is important here is that, where phase modulation is carried out in a unit of a pixel as in the case by the phase mask 13, the phase modulation patterns of the reference light upon recording and upon reproduction must coincide with each other as described hereinabove. Namely, data recorded using reference light having a certain phase modulation pattern upon recording can be reproduced only where reference light having a pattern same as the phase modulation pattern is used upon reproduction. From this point, where phase modulation is carried out in a unit of a pixel for DC component suppression, the phase modulation patterns of reference light upon recording and upon reproduction must be set to the same pattern.

In the configuration described hereinabove with reference to FIG. 5, since light irradiation upon the hologram recording medium 10 is carried out through the phase mask 13 common to recording/reproduction, phase modulation by the same pattern can be applied to the reference light upon recording and upon reproduction.

2. Linear Reading Out by Coherent Light Addition

2-1. Irradiation of Coherent Light

Incidentally, as can be recognized also from the fact that a spectrum diffusion effect by the phase mask 13 is obtained in such a manner as described above, it is possible to record, on a hologram recording medium, also information of the phase together with information of the light intensity (also called amplitude). In other words, it is possible to record also information of the phase by "0" and "π" together with information of the amplitude of "0" and "1" like "−1," "0" and "1" described hereinabove.

In this manner, if, in addition to information of the amplitude, also information of an arbitrary phase such as, for example, "0" or "π" can be recorded, then it is a possible idea to increase the data capacity which can be recorded by combining such amplitude and phase to carry out recording modulation encoding.

However, even if recording modulation encoding by a combination of the amplitude and the phase is carried out to allow recording of a greater amount of data, since, according to the hologram recording and reproduction method, only information of the intensity of a reproduction image can be detected by the image sensor 11, the recorded information of the phase cannot be reproduced, and data reproduction cannot be carried out appropriately.

Here, generally an optical system by a hologram recording and reproduction method including also the optical system of the recording and reproduction apparatus shown in FIG. 1 has a configuration called Fourier transform hologram having a configuration based on a $4f$ optical system wherein an SLM, an objective lens, a medium, an eye-piece and an image sensor are disposed in a spaced relationship from each other by a focal distance of the lens.

With such a configuration of a Fourier transform hologram, a series of operations of recording and reproduction described hereinabove can be considered in the following manner.

In particular, an SLM recording data pattern is Fourier transformed and projected on a hologram recording medium (medium), and a readout signal (reproduction image) of the medium is inverse Fourier transformed and projected on the image sensor. Then, the image sensor detects the intensity of the light by squaring the absolute value of the amplitude of the wave front of light inputted thereto.

In the manner, in the hologram recording and reproduction method, only information of the intensity of light which can be represented as a square value of the amplitude of a signal recorded on a medium can be reproduced. In other words, the hologram recording and reproduction method has such non-linearity that, while both of the amplitude and the phase can be recorded, the reproduction side can reproduce only the information of the amplitude.

From such a problem of the non-linearity which the hologram recording and reproduction system as described above has, it has not been carried out to combine the amplitude and the phase to record three or more values at a time.

However, the applicant of the present application formerly established a technique which makes linear reading out possible as a result of various experiments conducted regarding such a problem of the non-linearity which a hologram recording and reproduction system has as described above.

In the following, the technique for implementing such linear reading out is described.

Figure 9:
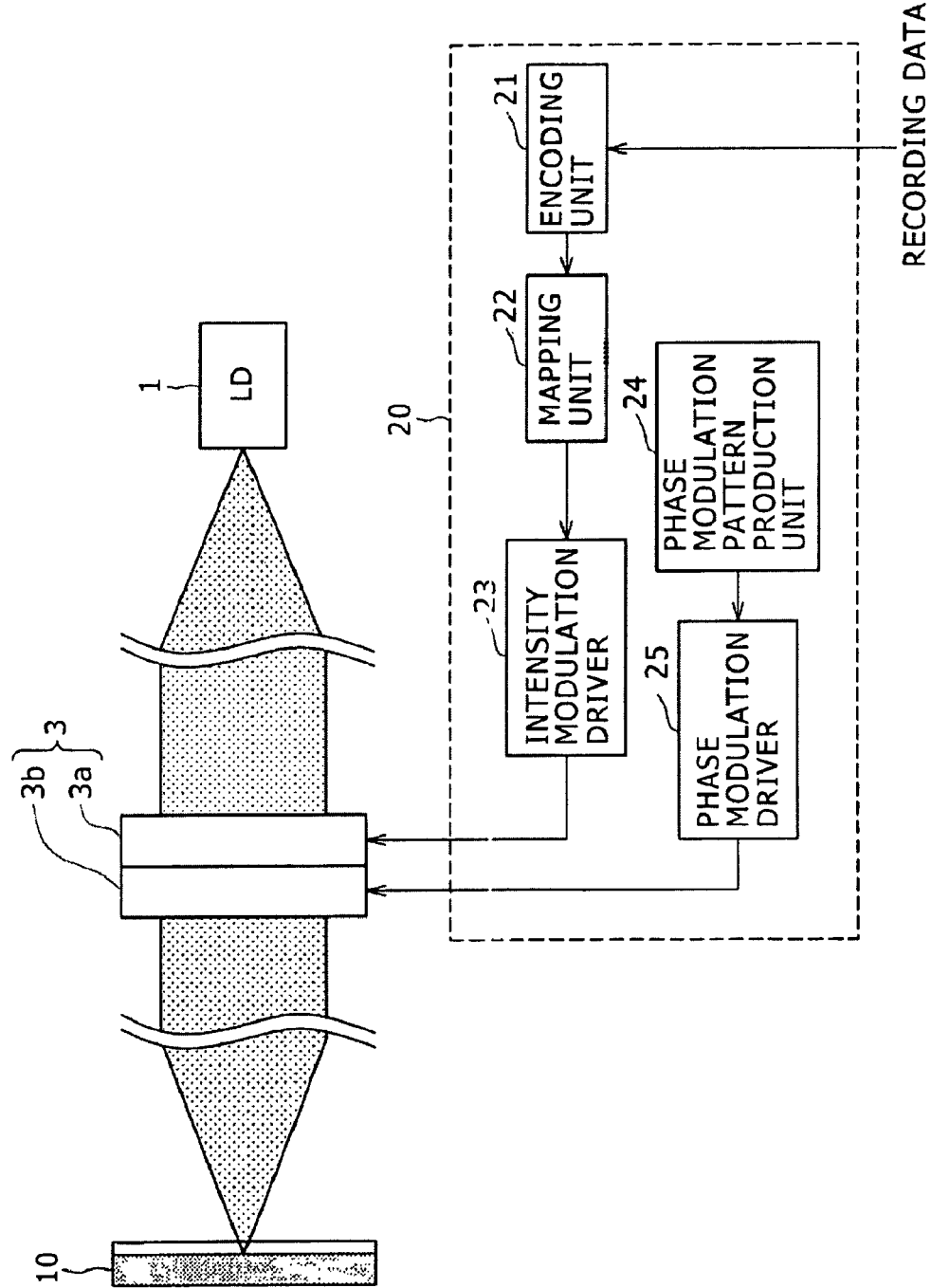
FIG. 9 is a view showing a configuration of an SLM (Spatial Light Modulation section) and an internal configuration of a data modulation and phase modulation control section for driving and controlling the SLM as a view illustrating a configuration which implements linear reading out.

FIG. 9 shows, as a view illustrating a configuration for implementing linear reading out, a configuration of the SLM 3 used in the present technique and an internal configuration of a data modulation and phase modulation control section 20 for driving and controlling the SLM 3.

It is to be noted that, in this figure, from within the configuration of the recording and reproduction apparatus shown in FIG. 1, only the laser diode 1 and the SLM 3 are shown while the other components are omitted. Further, in this figure, also the hologram recording medium 10 set in the inside of the recording and reproduction apparatus, light emitted from the laser diode 1 and introduced to the SLM 3 and light transmitted through the SLM 3 and introduced to the hologram recording medium 10 are shown additionally.

First, the configuration of the SLM 3 shown in FIG. 9 is described.

As shown in the figure, the SLM 3 in this instance has an intensity modulator 3a as a portion for carrying out light intensity modulation for producing signal light and reference light, and further has a phase modulator 3b for carrying out light phase modulation for signal light and reference light produced by the intensity modulator 3a.

The intensity modulator 3a is a portion for implementing a light intensity modulation function which the SLM 3 described hereinabove with reference to FIG. 1 has. Namely, the intensity modulator 3a is formed, for example, from a transmission type liquid crystal panel and varies the transmission factor of each pixel in response to a driving signal from a driving circuit thereinafter described (intensity modulation driver 23). In other words, the intensity modulator 3a carries out light intensity modulation for the incident light in response to the level of the driving signal described above.

Further, the phase modulator 3b is formed using a liquid crystal panel of the transmission type wherein variable phase modulation is possible in a unit of a pixel.

Here, a liquid crystal panel wherein phase modulation is possible in a unit of a pixel in this manner can be implemented by configuring an internal liquid crystal element based on an idea illustrated in FIG. 10.

(a) of FIG. 10 illustrates a manner of liquid crystal molecules in a state wherein no driving voltage is applied to the liquid crystal element in the liquid crystal panel (that is, in a state wherein the driving voltage is OFF), and (b) of FIG. 10 illustrates a manner of liquid crystal molecules in another state wherein a driving voltage of a predetermined level is applied to the liquid crystal element (in a state wherein a driving voltage is ON).

As seen in the figures, in the state of (a) of FIG. 10 wherein the driving voltage is OFF, the liquid crystal molecules have horizontal orientation, and in the state of (b) of FIG. 10 wherein the driving voltage is ON, the liquid crystal molecules indicate variation to vertical orientation.

At this time, where, regarding the refractive index n of the liquid crystal element, the refractive index in the above-mentioned horizontal orientation state by an OFF state of the driving voltage is represented by nh and the refractive index in the above-mentioned vertical orientation state by an ON state of the driving voltage at a predetermined level is represented by nv, if the thickness of the liquid crystal element is represented by d, then the phase variation amount provided when the driving voltage is OFF is "d×nh" and the phase variation amount provided when the driving voltage is ON is "d×nv." Accordingly, from this, the phase difference Δnd which can be provided by turning ON/OFF of the driving voltage is represented by $$\Delta nd = d \times nh - d \times nv$$

From this relational expression, in order to prove a required phase difference in a unit of a pixel, the thickness d of the liquid crystal element should be adjusted.

The phase modulator 3b used in the present technique is set such that, for example, the phase difference Δnd=π is satisfied by adjusting the thickness d of the liquid crystal element. In particular, this makes it possible to apply light phase modulation by the two values of "0" and "π" by carrying out changeover of the driving voltage between ON/OFF described above.

Further, where the modulation of the phases "0" and "π" by the predetermined level when the driving voltage is ON and when the driving voltage is OFF can be carried out as described above, by controlling the driving voltage level stepwise up to the predetermined level, the phase can be varied stepwise from "0" to "π." For example, if the driving voltage level is set to ½ of the predetermined level, then also modulation by the phase "π/2" becomes possible.

Description is given referring back to FIG. 9.

In the SLM 3, the phase modulator 3b which can carry out variable phase modulation for each pixel in this manner is formed integrally with the intensity modulator 3a. Namely, the intensity modulator 3a and the phase modulator 3b are formed integrally such that the pixels of the intensity modulator 3a and the pixels of the phase modulator 3b are positioned so as to correspond to each other in a one-by-one corresponding positional relationship.

Since such a structure as described above is adopted, it is possible to carry out light phase modulation with a phase modulation pattern which is made coincide strictly in a unit of a pixel with each of light beams, which are to serve as signal light and reference light obtained by transmission through the intensity modulator 3a.

Then, the data modulation and phase modulation control section 20 shown in FIG. 9 is configured so as to control modulation operation of the intensity modulator 3a and the phase modulator 3b of such an SLM 3 as described above.

As shown in the figure, an encoding unit 21, a mapping unit 22, an intensity modulation driver 23, a phase modulation pattern production unit 24 and a phase modulation driver 25 are provided in the data modulation and phase modulation control section 20.

First, operation upon recording is described.

Upon recording, to the encoding unit 21, recording data are inputted in such a manner as seen in the figure, and a predetermined recording modulation encoding process in accordance with a recording format is carried out for the recording data. For example, as sparse encoding which is generally applied in a hologram recording and reproduction method, one byte (=8 bits) of the recording data is converted into a data array of a square block shape of 4×4=16 bits. This data array of 4×4=16 bits is called symbol and is a minimum unit of recording encoding.

The mapping unit 22 arrays data encoded by the encoding unit 21 upon recording in one hologram page in accordance with the recording format. The hologram page points to the entire data array filled in the signal light area A2. In other words, a unit of data which can be recorded at a time by interference of signal light and reference light is called hologram page.

Further, the mapping unit 22 produces, together with such mapping of data into the signal light area A2 as just described, a data pattern wherein predetermined pixels in the reference light area A1 are set to "1" while the other pixels are set to "0" and besides the gap area A3 and an outer peripheral portion with respect to the reference light area A1 are all set to "0" is produced. The data pattern and the data pattern in the signal light area A2 are joined together to produce a data pattern of all effective pixels of the intensity modulator 3a.

The data pattern for all effective pixels of the intensity modulator 3a produced in this manner is supplied to the intensity modulation driver 23, and the intensity modulation driver 23 drives and controls the pixels of the intensity modulator 3a based on the data pattern.

Consequently, light on which signal light to which light intensity modulation is applied with a pattern according to the recording data is based and light on which reference light to which light intensity modulation is applied with a predetermined pattern is based are produced.

It is to be noted that, where description is given for confirmation, upon recording, the mapping unit 22 successively carries out mapping of data encoded by the encoding unit 21 for each hologram page, and consequently, a data pattern wherein only the data pattern in the signal light area A2 successively varies in response to the substance of the recording data is supplied to the intensity modulation driver 23. In other words, the intensity modulation driver 23 successively drives and controls the pixels of the intensity modulator 3a based on the data pattern for such a hologram page unit as just described.

Consequently, the data can be recorded on the hologram recording medium 10 for each hologram page unit.

Further, upon recording, the data modulation and phase modulation control section 20 carries out also operation for driving control for the phase modulator 3b together with such operation for the driving control for the intensity modulator 3a.

Here, in the description of the present technique, a case wherein "−1," "0" and "1" based on a random phase pattern of two values are recorded upon recording in order to achieve suppression of a DC component as in the case of the phase mask 13 described hereinabove is described as an example.

For example, if it is assumed that a random phase pattern of two values is recorded in such a manner as described above, the phase modulation pattern production unit 24 produces a phase modulation pattern to be set in the signal light area A2 of the phase modulator 3b based on a predetermined data pattern set in advance.

Further, together with this, the phase modulation pattern production unit 24 produces a predetermined phase modulation pattern as a phase modulation pattern to be set to the reference light area A1 of the phase modulator 3b.

Then, the phase modulation pattern production unit 24 joins the phase modulation patterns (control patterns of the corresponding pixels) regarding the signal light area A2 and the reference light area A1 produced in such a manner as described above to produce a phase modulation pattern for all effective pixels of the phase modulator 3b. At this time, to the pixels other than those in the signal light area A2 and the reference light area A1, for example, a value corresponding to the phase "0" may be set.

Then, the phase modulation pattern produced in this manner is supplied to the phase modulation driver 25.

The phase modulation driver 25 drives and controls the pixels of the phase modulator 3b based on the phase modulation pattern supplied from the phase modulation pattern production unit 24. By this, the phase modulation driver 25 can apply light phase modulation with a predetermined pattern as a phase mask to signal light to be finally outputted from the SLM 3, and also with regard to the reference light, light phase modulation with a predetermined phase modulation pattern is carried out.

As a result, upon recording, a signal which depends upon the light intensity of "−1" is recorded on the hologram recording medium 10 together with the signal which depends upon the light intensities of "0" and "1."

Now, operation upon reproduction is described.

In the present technique, when a signal recorded on the hologram recording medium 10 in such a manner as described above is read out linearly, a reproduction technique different from a conventional technique is adopted. Specifically, while conventionally a reproduction image obtained by irradiation only of reference light is formed on the image sensor 11 to carry out signal reading out, according to the present technique, coherent light produced by allocating a solid pattern which depends upon All "1" into the signal light area A2 is irradiated together. Namely, by using this, the coherent light is added to a reproduction image obtained in response to irradiation of reference light so as to form an image on the image sensor 11, and signal reading out from a result of the image formation is carried out.

To this end, the data modulation and phase modulation control section 20 shown in FIG. 9 carries out the following operation as operation upon reproduction.

In this instance, upon reproduction, in the data modulation and phase modulation control section 20, the mapping unit 22 produces a data pattern for production of such coherent light as described above. Specifically, the mapping unit 22 produces a data pattern wherein the reference light area A1 has a pattern of "0" and "1" similar to that upon recording and the pixels in the gap area A3 and the region on the outer circumferential side with respect to the reference light area A1 are all set to "0" and besides the pixels in the signal light area A2 are set to a predetermined value other than "0." Then, the mapping unit 22 supplies the data pattern to the intensity modulation driver 23.

Here, as described hereinabove, the intensity modulator 3a varies the transmission factor in response to the driving voltage level of each pixel. Namely, the intensity modulator 3a can vary the transmission factor not to the two values of "0" and "1" but, for example, variably to "0" to "1."

Corresponding to this, the intensity modulation driver 23 drives a pertaining pixel with a driving voltage level with which the light intensity becomes highest in response to "1" (if 256 gradations are used, a value corresponding to "255") supplied from the mapping unit 22, but drives a pertaining pixel with another driving voltage level with which the light intensity becomes lowest in response to "0." If a predetermined value other than "0" is allocated as a data pattern in the signal light area A2 from the mapping unit 22 in such a manner as described above, then the pixels in the signal light area A2 of the mapping unit 22 are driven with a driving voltage level corresponding to the value. In other words, coherent light having the intensities corresponding to the values allocated in the signal light area A2 by the mapping unit 22 is obtained.

While the intensity of coherent light can be set variably with the value allocated in the signal light area A2 by the mapping unit 22 in this manner, in the present technique, the intensity of the coherent light, that is, the addition amount of the coherent light, is a very significant factor in order to make linear reading out possible.

Specifically, it is a condition in the present technique that the addition amount of coherent light has a value higher than the highest value of the absolute values of the amplitude of a reproduction image.

In order for the configuration shown in FIG. 9 to obtain the intensity of coherent light which satisfies such a condition as just described, a value which satisfies the condition should be acquired from the value set by the mapping unit 22 in advance, a result of an experiment conducted with regard to the intensity of coherent light obtained with the thus set value and so forth is acquired in advance, and the value should be allocated as a value to be set in the signal light area A2.

Figure 11:
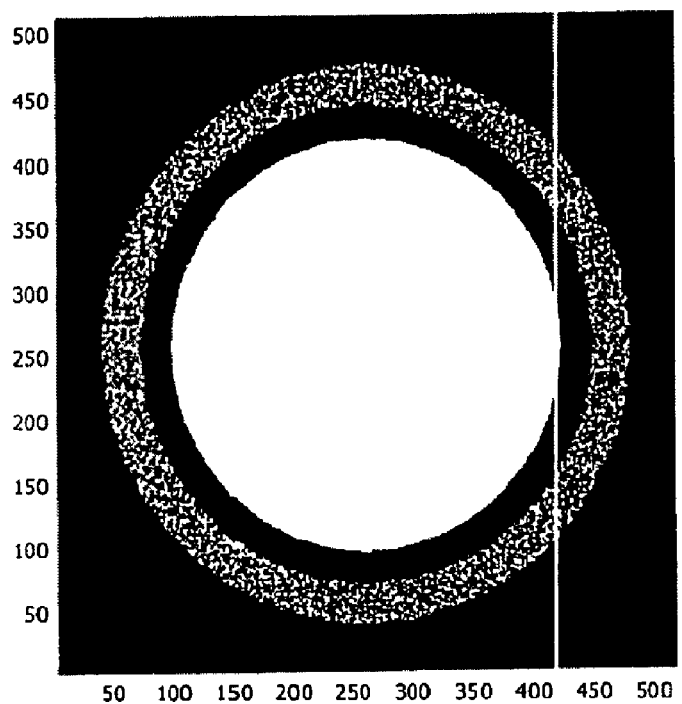
FIG. 11 is a view schematically showing an output image of an intensity modulation section upon reproduction when addition reading out of coherent light is carried out.

Here, the next FIG. 11 schematically shows an output image of the intensity modulator 3a based on such operation of the mapping unit 22 and the intensity modulation driver 23 as described above.

While, in FIG. 11, the bit "1" is indicated by the white and the bit "0" is indicated by the black, according to the description above, it is recognized that, in this instance, as the signal light area A2 is driven by a driving voltage of a predetermined level, light is transmitted in the signal light area A2. This figure indicates a case wherein the value of the entire signal light area A2 is set to "1," and the signal light area A2 exhibits the white in the overall area.

It is to be noted that, in the reference light area A1, a pattern of "0" and "1" similar to that upon recording is obtained also in this instance. This is because, if the patterns of reference light irradiated upon recording and upon reproduction do not coincide with each other in the hologram recording and reproduction system as described hereinabove, then a recorded signal cannot be read out appropriately.

Further, in FIG. 9, upon reproduction, the following operation is further carried out by the phase modulation pattern production unit 24.

In particular, the phase modulation pattern production unit 24 produces a data pattern as a phase modulation pattern similar to that upon recording with regard to the reference light area A1 of the phase modulator 3b and further produces a data pattern wherein the overall signal light area A2 is filled with the predetermined value. Then, the phase modulation pattern production unit 24 joins the data patterns to produce data for all effective pixels of the phase modulator 3b and supplies the produced data to the phase modulation driver 25.

As described hereinabove, also the phase modulator 3b is configured such that the pixels can be variably driven in response to the driving voltage level similarly to the intensity modulator 3a described above. Namely, the phase can be variably controlled to "0" to "π" for each pixel in response to the driving voltage level. Then, corresponding to this, also the phase modulation driver 25 is configured such that the pixels of the phase modulator 3b are driven with a driving voltage level in accordance with the value "0" to "1" (for example, if 256 gradations are applied, 0 to 255) from the phase modulation pattern production unit 24.

Where the inside of the signal light area A2 is filled with the predetermined value according to the data pattern produced by the phase modulation pattern production unit 24 in such a manner as described above, the phase modulation driver 25 drives the pixels in the signal light area A2 of the phase modulator 3b with a driving voltage level corresponding to the value. By this, the phase of coherent light obtained by transmission through the signal light area A2 can be set in response to the predetermined value described above.

Here, it is a condition that the phase of the coherent light is same as the phase of the reproduction image. In short, as described hereinabove, while the present technique is a technique which presupposes that coherent light is added to a reproduction image so as to form an image on the image sensor 11, if a phase difference appears between the reproduction image and the coherent light, then the coherent light cannot be added appropriately (in the amplitude direction). Therefore, it is a condition in the present technique that the phase of the coherent light is made same as that of the reproduction image.

It is to be noted that what is to be noticed here is that, as described also in Kogelnik, H "Coupled wave theory for thick hologramgrating." Bell System Technical Journal, 48, 2909-

47, the phase of the reproduction image does not become the same phase as the phase of the reference light irradiated in order to obtain the reproduction image, but a predetermined phase difference appears between them. Specifically, it is known that the phase of the reproduction image is displaced by "π/2" with respect to the phase of the reference light.

If this point is taken into consideration, then it can be recognized that, in order to obtain "the same phase as that of the reproduction image" as described above, the phase to be provided to the coherent light should be set to "π/2."

In order to provide such a phase of "π/2" as described above, the phase modulation pattern production unit 24 allocates "0.5" (where 256 gradations are adopted, a value corresponding to "127") as a value in the signal light area A2. Namely, by this, the phase difference between the coherent light and the reference light can be set to "π/2," and as a result, it is possible to make the phase of a reproduction image obtained by irradiation of the reference light and the phase of the coherent light same as each other.

By such operation of the data modulation and phase modulation control section 20 as described above, upon reproduction, coherent light having the phase same as that of the reproduction image and having an intensity which is higher than the highest value of the absolute values of the amplitude of the reproduction image is irradiated upon the hologram recording medium 10 together with the reference light.

Figure 12:
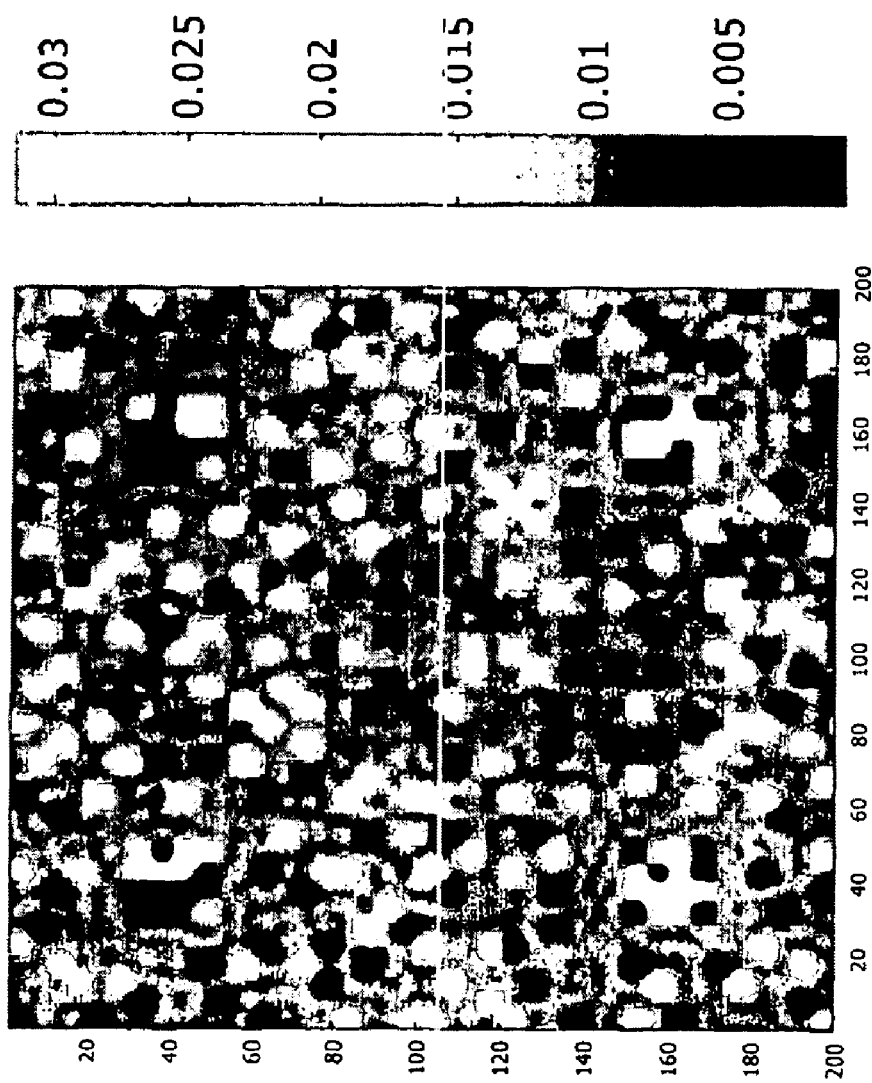
FIG. 12 is a view showing a reproduction image when the addition amount of coherent light is 0.1.
Figure 13:
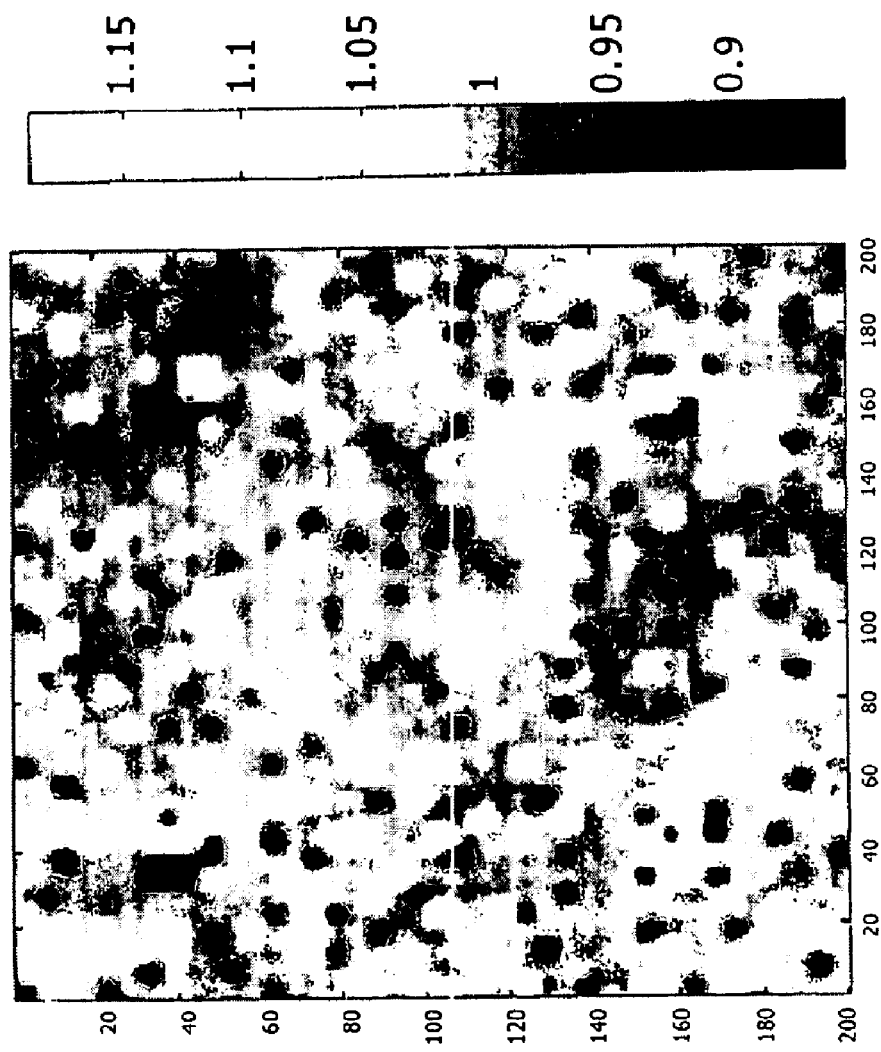
FIG. 13 is a view showing a reproduction image when the addition amount of coherent light is 1.0.

FIGS. 12 and 13 show reproduction images where such coherent light as described above is added. FIG. 12 shows a reproduction image where the addition amount of the coherent light is 0.1 (base+0.1), and FIG. 13 shows a reproduction image where the addition amount of the coherent amount is 1.0 (base+1.0).

It is to be noted that, in those figures, the amplitude (light intensity) of the reproduction image is indicated by the shade value. The dark color side indicates the amplitude=low, and the light color side indicates the amplitude=high.

Referring to those figures, it can be confirmed that, also where coherent light is added, an image according to recording data is obtained appropriately as a reproduction image. In other words, also where addition of coherent light is carried out, a reproduction image which appropriately reflects recording data is obtained.

Further, where FIGS. 12 and 13 are compared with each other, it is recognized that, where the addition amount of coherent light is increased, the difference between a maximum value and a minimum value of the amplitude of the reproduction image increases. This indicates that the amplitude of the reproduction image can be amplified uniformly over an overall area in proportion to the addition amount of coherent light.

2-2. Reproduction Signal Process for Linear Reading Out

Subsequently, operation of the reading out side regarding a reproduction image to which coherent light is added in this manner is described.

As can be recognized from the foregoing description, in the present technique, coherent light having a phase same as that of the reproduction image and having an intensity higher than the highest value of the absolute values of the amplitude of the reproduction image is added to the reproduction image and forms an image on the image sensor 11. In the present technique, with regard to an image signal obtained by detection of a result of addition of the reproduction image and the coherent light by the image sensor 11 in this manner, operation that the square root of the value is calculated and the component of the coherent light is removed from a result of the square root calculation is carried out.

Figure 14:
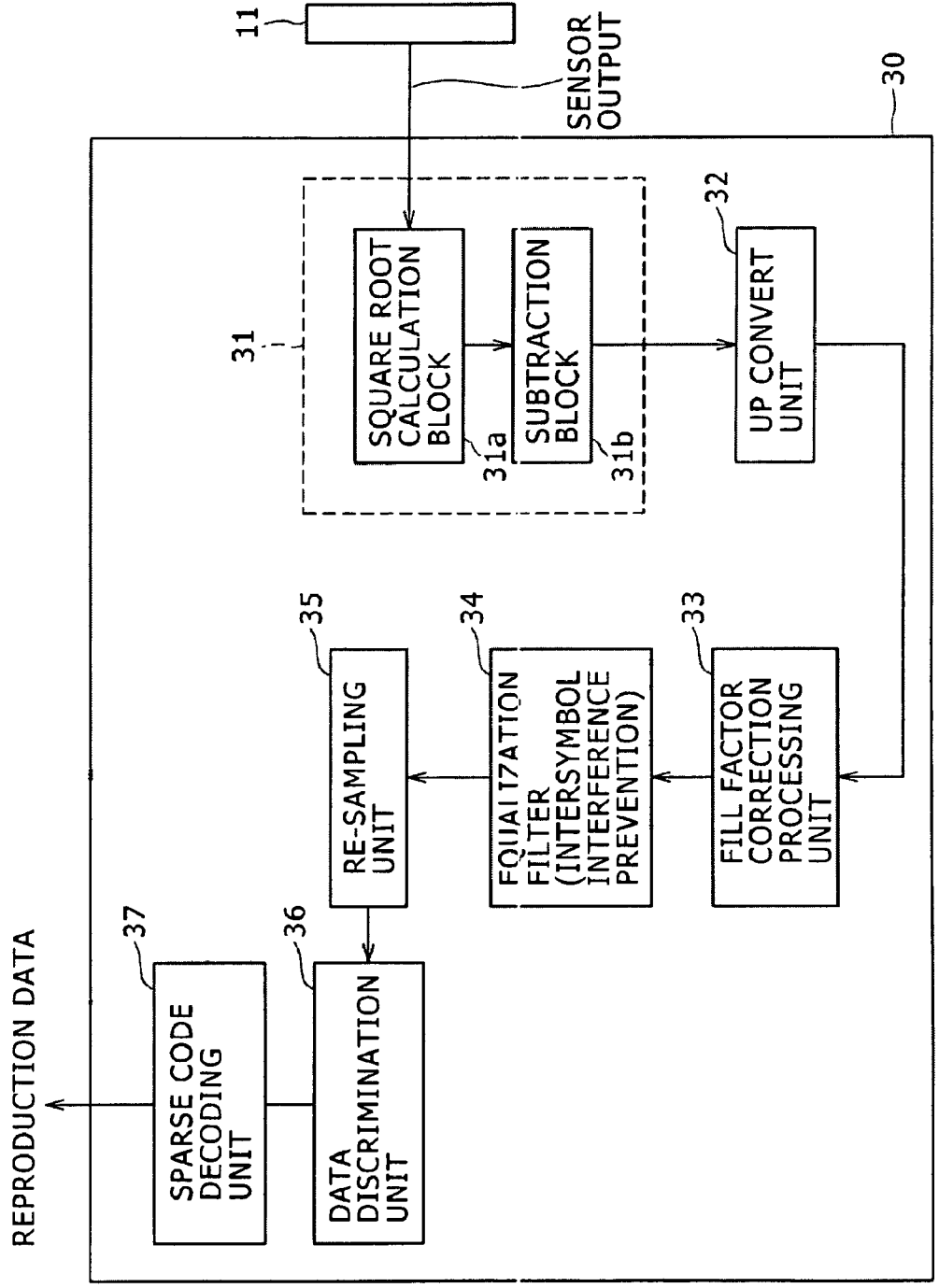
FIG. 14 is a block diagram showing an internal configuration of a data reproduction section which carries out a reproduction signal process for linear reading out.

FIG. 14 is a view showing an internal configuration of a data reproduction section 30 which carries out a reproduction signal process for linear reading out based on the output of the image sensor 11.

As shown in the figure, a linearization processing unit 31, an up convert unit 32, a fill factor correction processing unit 33, an equalization filter 34, a re-sampling unit 35, a data discrimination unit 36 and a sparse code decoding unit 37 are provided in the data reproduction section 30.

In FIG. 14, the image sensor 11 shown in FIG. 1 is shown. The data reproduction section 30 supplies an image signal (light reception signal) based on a reproduction image detected by the image sensor 11 and having such coherent light as described above added thereto to the linearization processing unit 31.

The linearization processing unit 31 carries out a signal process by the present technique described above for an output image signal (sensor output in the figure) from the image sensor 11 to obtain a linear readout signal by reproduction of information of the amplitude and the phase recorded on the hologram recording medium 10. Specifically, a square root calculation block 31a and a subtraction block 31b are provided in such a manner as seen in the figure in the linearization processing unit 31.

The square root calculation block 31a receives an image signal obtained by the image sensor 11 as an input thereto, calculates a square root for each of values which form the image signal and outputs results of the calculation to the subtraction block 31b.

The subtraction block 31b subtracts a value corresponding to the addition amount of the coherent light from the value of the square root obtained by the square root calculation block 31a described above. In particular, since the intensity of the coherent light in this instance is set to a predetermined value higher than the absolute value of the minimum value of the amplitude of the reproduction, a value which can cancel the predetermined value is set in advance and this value is subtracted.

For example, where, as an example, the minimum value of the amplitude of the reproduction is −0.078 and the intensity of the coherent light is set, for example, to 0.1 higher than the absolute value 0.078 of the minimum value, 0.1 is subtracted from the value of the square root.

An image signal obtained as a result of the subtraction by the subtraction block 31b is supplied as an output of the linearization processing unit 31 to the up convert unit 32.

Here, that a linear readout signal wherein the amplitude and the phase are reproduced is obtained by the series of operations from the addition of coherent light to the square root and the subtraction of the added amount of the coherent light described above is described.

First, for comparison, a case wherein reading out is carried out only by irradiation of reference light as in the prior art without carrying out such addition of coherent light as in the present technique is studied. It is to be noted that, in the description here, a case is described wherein the maximum value and the minimum value of the amplitude of the reproduction image by phase modulation of "0" and "π" carried out upon recording are 0.078 and −0.078, respectively.

According to the supposition of a Fourier transform hologram described hereinabove, the output values of the image sensor 11 obtained in response to the maximum value and the minimum value of the amplitude of the reproduction image in this instance are obtained as the same value of 6.1E-3 which is the square value of the output value. Since the maximum value and the minimum value are detected as the same value in this manner by the image sensor 11, whatever signal process is carried out later, the lost phase information cannot be restored accurately. In other words, non-linear distortion is generated.

Meanwhile, in the case of the present technique wherein coherent light having a phase same as that of the reproduction image and having an intensity higher than the highest value of the absolute values of the amplitude of the reproduction image is irradiated together with reference light, a value according to the intensity of the coherent light can be added to the reproduction image. Here, such coherent light does not interfere with a recorded hologram page because it has components whose amplitude and phase are uniform. Then, when a reproduction image obtained in response to irradiation of the reference light is formed on the image sensor 11, the coherent light after irradiation of the medium is added as coherent light of a phase same as that of the reproduction image. In other words, a required amplitude value can be added to the reproduction thereby.

Referring back to FIGS. 12 and 13, it can be recognized that such a phenomenon as just described is proved.

Here, if the addition amount of coherent light which satisfies such a condition that it is "greater than the highest value of the absolute values of the amplitude of a reproduction image" is set, for example, to 0.1, then since a component of 0.1 is added to the reproduction image, the maximum value 0.078 becomes $0.178^2 = 0.032$ and the minimum value $-0.078$ is detected as an intensity of $0.022^2 = 4.8\text{E-}4$ by the image sensor 11. In this instance, for the output of the image sensor 11, it is carried out to calculate the square root of the intensity read out in such a manner as described above to remove the added component. Accordingly, the maximum value 0.078 of the amplitude can be restored the original image by $0.178 - 0.1 = 0.078$, and also the minimum value $-0.078$ can be restored the original value by $0.022 - 0.2 = -0.078$.

In this manner, according to the present technique, linear reading out by which phase information provided upon recording is not lost can be implemented.

It is to be noted that, while FIG. 13 illustrates the case wherein the coherent addition amount is 1.0, it can be recognized that, also where the addition amount is 1.0 in this manner, for intensity information $(0.078+1.0)^2=1.162$ and $(-0.078+1.0)^2=0.850$ detected by the image sensor 11, since that the square root (1.078, 0.922) is calculated and the added amount is subtracted (1.078−1.0, 0.922−1.0) is carried out, the original amplitude of ±0.078 can be restored.

In short, the addition amount of coherent light must only satisfy the condition of "a value higher than the highest value of the absolute values of the amplitude of the reproduction image" so that no negative loop may occur with the intensity detection (squaring) by the image sensor 11.

Description is given referring back to FIG. 14.

Although a liner readout signal with which information of the amplitude and the phase is reproduced is obtained depending upon operation of the linearization processing unit 31 in such a manner as described above, what should be taken notice of is that, even if such a linear readout signal is obtained, this does not signify that recorded data themselves are reproduced. In particular, this is because the image sensor 11 represents a detected intensity of light by an amplitude value by a predetermined gradation such as, for example, the 256th gradation and accordingly the linear readout signal obtained by the linearization processing unit 31 represents such an amplitude value of the predetermined gradation. Data discrimination of the bits "0," "1" and "−1" based on amplitudes represented by such predetermined gradations and processes until recorded data are reproduced finally from the discriminated bit values are carried out by the up convert unit 32 to the sparse code decoding unit 37 shown in FIG. 14.

In the following, such a reproduction signal processing system provided at the succeeding stage of the linearization processing unit 31 as just described is described particularly.

First, in order to understand operation of the reproduction signal processing system, it is necessary for the following point to be grasped. In particular, it must be grasped that, in the hologram recording and reproduction system, it is significant to carry out positioning for specifying to which one of pixels of the SLM 3 each of the pixels on the image sensor 11 corresponds.

Here, it is acknowledged that, in the hologram recording and reproduction system, it is very difficult to adjust each pixel (hereinafter referred to as data pixel) of the spatial light modulation section (SLM) 3 side and each pixel (hereinafter referred to as detector pixel) of the image sensor 11 side strictly in a one-by-one corresponding relationship from a problem of optical distortion or the magnification. Therefore, corresponding to such displacement, it is specified (searched) at which position in the image signal obtained by the image sensor 11$a$ data pixel of the SLM 3 is positioned. Then, a procedure that the amplitude value at the position of the data pixel specified as a result of the search is obtained, and discrimination of the bit value for each data pixel is carried out from the amplitude value is taken.

Although description based on illustration is omitted here, in order to make it possible to cope with a displacement of a reproduction image arising from such optical distortion, magnification or the like as described above, the image sensor 11 is adjusted in advance such that an image for one pixel of the SLM 3 side is received by n pixels (n>1) of the image sensor 11 side (so-called oversampling). For example, a reproduction image for one pixel of the SLM 3 is received by 2×2=4 pixels on the image sensor 11. The reason why such oversampling is carried out is that it is intended to raise the resolution of the detection image side so as to make it possible to cope also with a case wherein such displacement of a reproduction image occurs in a unit smaller than one pixel.

For example, where the oversampling rate is set to 2×2=4 times as in the example described above, an image signal having a resolution four times as high as that of the SLM 3 side is outputted from the image sensor 11. Then, corresponding to this, also a readout signal (image signal) from the linearization processing unit 31 is obtained as a signal having the resolution of four times.

Referring to FIG. 14, the readout signal obtained from the linearization processing unit 31 in this manner is supplied in such a manner as seen in the figure to the up convert unit 32.

The up convert unit 32 carries out, for example, an interpolation process and so forth for the readout signal to upconvert the readout signal into a signal of the predetermined magnification.

By carrying out the upconversion process further for the image after the oversampling in this manner, the resolution can be further raised, and the positioning based on the irradiation position displacement of the reproduction image can be carried out with a higher degree of accuracy.

The image signal after the upconversion by the up convert unit 32 is supplied to the fill factor correction processing unit 33, by which a correction process in accordance with the fill factor of the SLM 3 and the fill factor of the image sensor 11. Namely, since the signal after read out by the image sensor 11 is in a state wherein a high frequency portion thereof is deteriorated by an influence of the fill factor of the SLM 3 and the fill factor of the image sensor 11, as a particular process, such a correction process as to emphasize the deteriorated high frequency portion is executed.

The equalization filter 34 receives the image signal after the correction process by the fill factor correction processing unit 33 as an input thereto and carries out a waveform equalization process for intersymbol interference prevention. The equalization process for intersymbol interference prevention carried out by the equalization filter 34 may be an expanded form of a waveform equalization process for a one-dimensional signal, which is used frequently, for example, in the fields of optical disks and communications, to that for a two-dimensional signal.

The re-sampling unit 35 specifies the position of each data pixel of the SLM 3 in the image signal after the equalization process by the equalization filter 34 described hereinabove and acquires an amplitude value of each of the specified pixels (this is referred to as sampling).

Here, upon position specification of each data pixel in the image signal, as a general technique which is adopted conventionally, insertion of predetermined pattern data called sync into recording data is carried out. In this instance, the re-sampling unit 35 searches the image signal for the sync part as the predetermined pattern and specifies the position of each data pixel from the position of the sync detected as a result of the search.

It is to be noted that, as regard such a position specification technique for each data pixel as just described, detailed description is omitted because it does not have a direct relationship to the reading out operation by the present technique. A technique which is considered optimum such as a conventionally adopted technique or a technique which may be proposed in the future may be adopted, but the position specification technique is not limited specifically.

After the position of each data pixel is specified in this manner, a process of acquiring amplitude values of the data pixels is carried out. Conventionally, for example, an interpolation process is carried out based on values around the specified position of each data pixel and the amplitude value of the data pixel is acquired by calculation. This is a general technique in the field of image processing, and a bilinear interpolation method (Bi-linear interpolation method), a cubic interpolation method (Cubic convolution method), a bicubic spline method (Bicubic spline method) and so forth are known.

Or, also a nearest neighbor method (Nearest neighbor method) wherein a signal value most nearest in timing from a specified position is selected as the amplitude value of the data pixel without depending upon calculation is available.

It is to be noted that various techniques can be adopted also for such an acquisition process of an amplitude value, and here the technique is not limited particularly.

The data discrimination unit 36 carries out data discrimination (bit decision) based on the amplitude value of each data pixel obtained by the re-sampling unit 35 in such a manner as described above.

According to the foregoing description, upon recording, 8 bits of recording data are converted into a data array (symbol) in the form of a block of 4×4 bits by sparse encoding, and such symbols are mapped in a hologram page. In a corresponding relationship, the data discrimination unit 36 carries out data discrimination of the amplitude values obtained by the re-sampling unit 35 in a unit of a symbol, and supplies bit values obtained in a unit of a symbol as a result of the data discrimination to the sparse code decoding unit 37 on the succeeding stage.

Here, in the case of the present technique, as amplitude values obtained by the re-sampling unit 35, not only amplitude values corresponding to the data "1" and "0" but also negative amplitude values corresponding to "−1" are obtained by operation of the linearization processing unit 31 described hereinabove. It is to be noted, however, that, in this instance, the phase modulation of "0" and "π" carried out upon recording are intended to achieve suppression of the DC component like the phase mask 13 and the recording data themselves are recorded only as two values of "0" and "1." In other words, the amplitude value corresponding to "−1" here should be discriminated as the bit "1." From this, the data discrimination unit 36 is configured so as to discriminate a pixel in the proximity of a pixel whose amplitude value obtained by the re-sampling unit 35 is the maximum value and discriminate a pixel in the proximity of a pixel whose amplitude value is the minimum value as pixels of the bit "1" but discriminate a pixel whose amplitude value is proximate to "0" as a pixel of the bit "0."

The sparse code decoding unit 37 receives the bit values of each symbol unit supplied from the data discrimination unit 36 in such a manner as described above as an input thereto and carries out decoding of the sparse codes for each symbol. Namely, the sparse code decoding unit 37 decodes data of 4×4=16 bits into original data of 8 bits thereby to reproduce the recording data.

3. Recording/Reproduction as Embodiments

3-1. First Embodiment

Three-Value Recording/Reproduction

According to the technique formerly proposed by the present applicant, linear reading out by which also information of the phase can be read out together with information of the amplitude recorded on a hologram recording medium can be implemented in such a manner as described hereinabove.

In the first embodiment of the present invention, a technique for three-value recording/reproduction is proposed first as a technique for recording/reproduction in a case wherein it is assumed to carry out such linear reading out.

Figure 15:
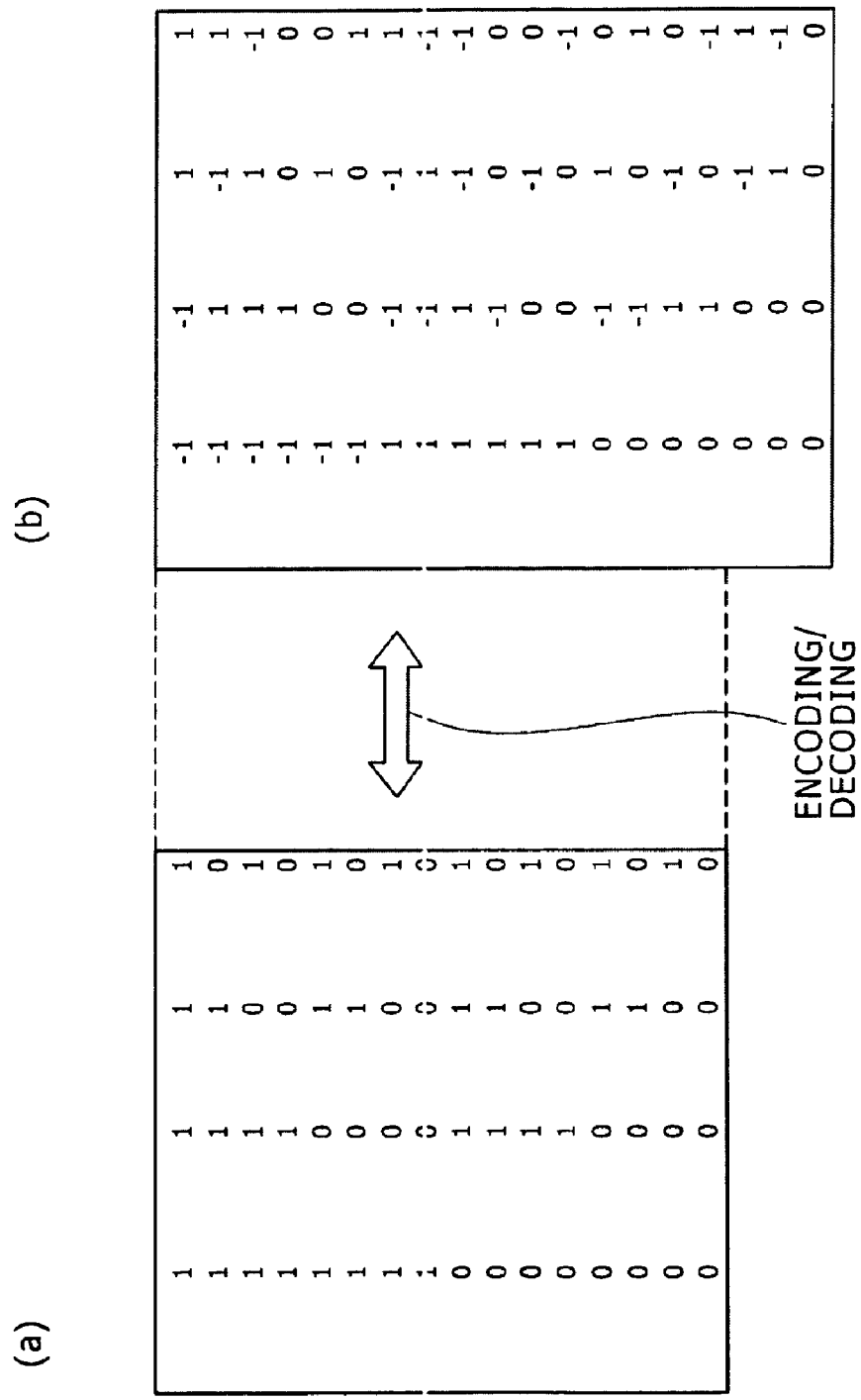
FIG. 15 is a view showing, as an example illustrating a three-value recording/reproduction technique as a first embodiment, an example of recording modulation encoding of the technique.

FIG. 15 shows an example of the recording modulation encoding as a view illustrating the three-value recording/reproduction method as the first embodiment.

First, in (a) of FIG. 15, a combination of recording data when 4 bits of two-value data by "0" and "1" form one symbol is illustrated. As seen in the figure, where 4 bits of two-value data form one symbol, 16 different combinations are available. In other words, 16 different data patterns can be produced.

On the other hand, in (b) of FIG. 15, combinations which exhibit a DC-free state where 4 bits form one symbol in a case wherein three values of "−1," "0" and "1" implemented by combinations of the amplitudes "0" and "1" and the phases "0" and "π" are used are illustrated. It is described here for the confirmation that the "DC-free" state in this instance signifies that the numbers of "1" and "−1" are equal to each other.

Thus, from among combinations of 3 values and 4 bits, totaling 19 combinations exhibit a DC-free state including "0, 0, 0, 0." If 16 different data patterns are used from among such 19 combinations of 3 values and 4 bits are used, then they can be applied to all combinations of two values and 4 bits illustrated in (a) of FIG. 15. Specifically, recording modulation encoding/decoding in this instance may be carried out using a conversion table wherein, for example, to individual ones of the 16 data patterns of two values and 4 bits illustrated in (a)

of FIG. 15, individual ones of 16 data patterns from among the DC-free 19 combinations of 3 values and 4 bits illustrated in (b) of FIG. 15 are allocated (associated).

For example, if it is assumed that such a conversion table as just described is used to carry out recording modulation encoding to carry out three-value recording by "−1," "0" and "1" on the hologram recording medium 10, then data recording can be carried out in such a manner that suppression of the DC component is achieved similarly as in the case wherein the phase mask 13 is used.

It is to be noted that, while a case wherein one symbol on the two-value side and one symbol on the three-value side have 4 bits and coincide with each other and the encoding rate is 100% is described here as an example wherein suppression of the DC component is taken into consideration for simplified illustration, in an alternative case wherein, for example, it is intended to achieve suppression of the DC component and besides achieve increase of the recording capacity, the number of symbols on the three-value side should be further increased.

Here, where 4 bits form one symbol as seen in (b) of FIG. 15, if it is intended to make the numbers of "1" and "−1" equal to each other taking the DC-free condition into consideration, then only two combinations are available including a combination wherein the number of "1" and "−1" is 2 and another combination wherein the number of "1" and "−1" is 1 and the number of "0" is 2 (except All "0"). In contrast, if the number of bits is further increased, then it is possible to increase the number of combinations of "1," "−1" and "0" for making the numbers of "1" and "−1" equal to each other, and the increasing rate of combinations for satisfying the DC-free condition can be inclined to increase further.

Specifically, in this instance, by forming one symbol of the three-value side from 7 bits, it is possible to make the encoding rate higher than 100%.

Where one symbol is formed from 7 bits in this manner, as combinations wherein the number of "1" and the number of "−1" can be made equal to each other, totaling three combinations are available including a combination wherein the number of "1" and "−1" is 1 and the number of "0" is 5, another combination wherein the number of "1" and "−1" is 2 and the number of "0" is 3 and a further combination wherein the number of "1" and "−1" is 3 and the number of "0" is 1. Here, the number of combinations wherein 7 bits include one "−1" and one "1" is 7C2=7*6/2/1=21. Then, the number of combinations of "1" and "−1" is 2C1=2. Accordingly, the number of combinations wherein the number of "1" and "−1" is 1 and the number of "0" is 5 and which satisfy the DC-free condition is 7C2*2C1=42.

Similarly, the number of combinations wherein the number of "1" and "−1" is 2 and the number of "0" is 3 and which satisfy the DC-free condition is 7C4*4C2=(7*6*5*4/4/3/2/1)*(4*3/2/1)=210, and the number of combinations wherein the number of "1" and "−1" is 3 and the number of "0" is 1 and which satisfy the DC-free condition is 7C6*6C3=7C1*6C3=7*(6*5*4/3/2/1)=140.

From this, the number of combinations which satisfy the DC-free condition where one symbol is formed from 7 bits is 42+210+140=392. Here, since, in the case of the two values, the number of combinations of data patterns where one symbol is formed from 8 bits is 28=256, if, from 392>256, one symbol of the three-value side is formed from 7 bits, then the DC-free condition is satisfied and besides the encoding rate can be made higher than 100%. Specifically, if it is assumed that individual ones of the data patterns of the two values and 8 bits are allocated to 256 data patterns from 392 data patterns of 3 values and 7 bits, then the data recording capacity can be increased to 8/7 times while achieving suppression of the DC component.

It is to be noted that, where the DC-free condition is not adopted, naturally it is apparent that the number of combinations of 3 values and 4 bits becomes overwhelmingly greater, and in this instance, further increase of the recording capacity can be achieved.

Figure 16:
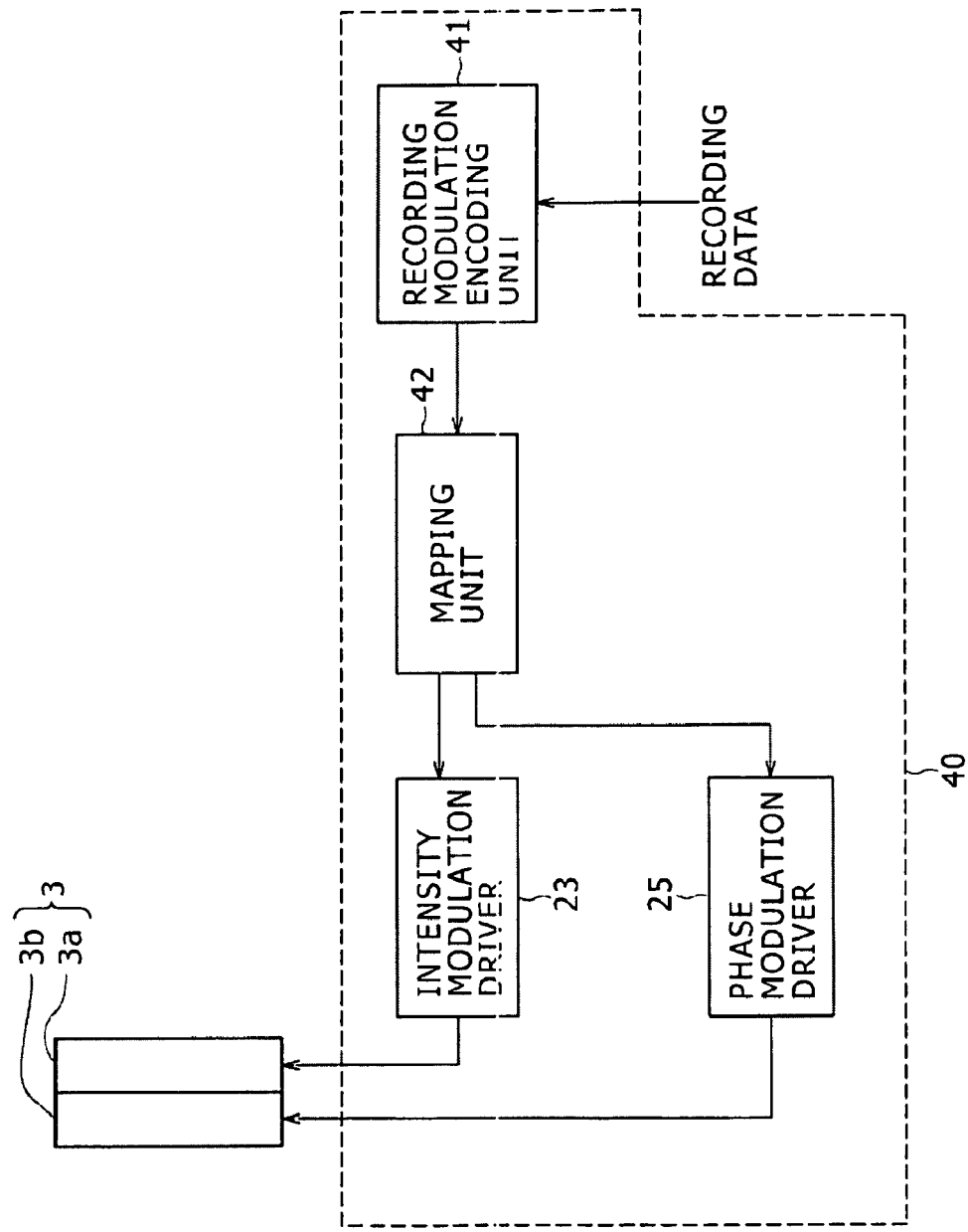
FIG. 16 is a view showing a configuration of a data modulation and amplitude phase control section for driving and controlling an SLM as a view illustrating a configuration of a recording and reproduction apparatus as the first embodiment.
Figure 17:
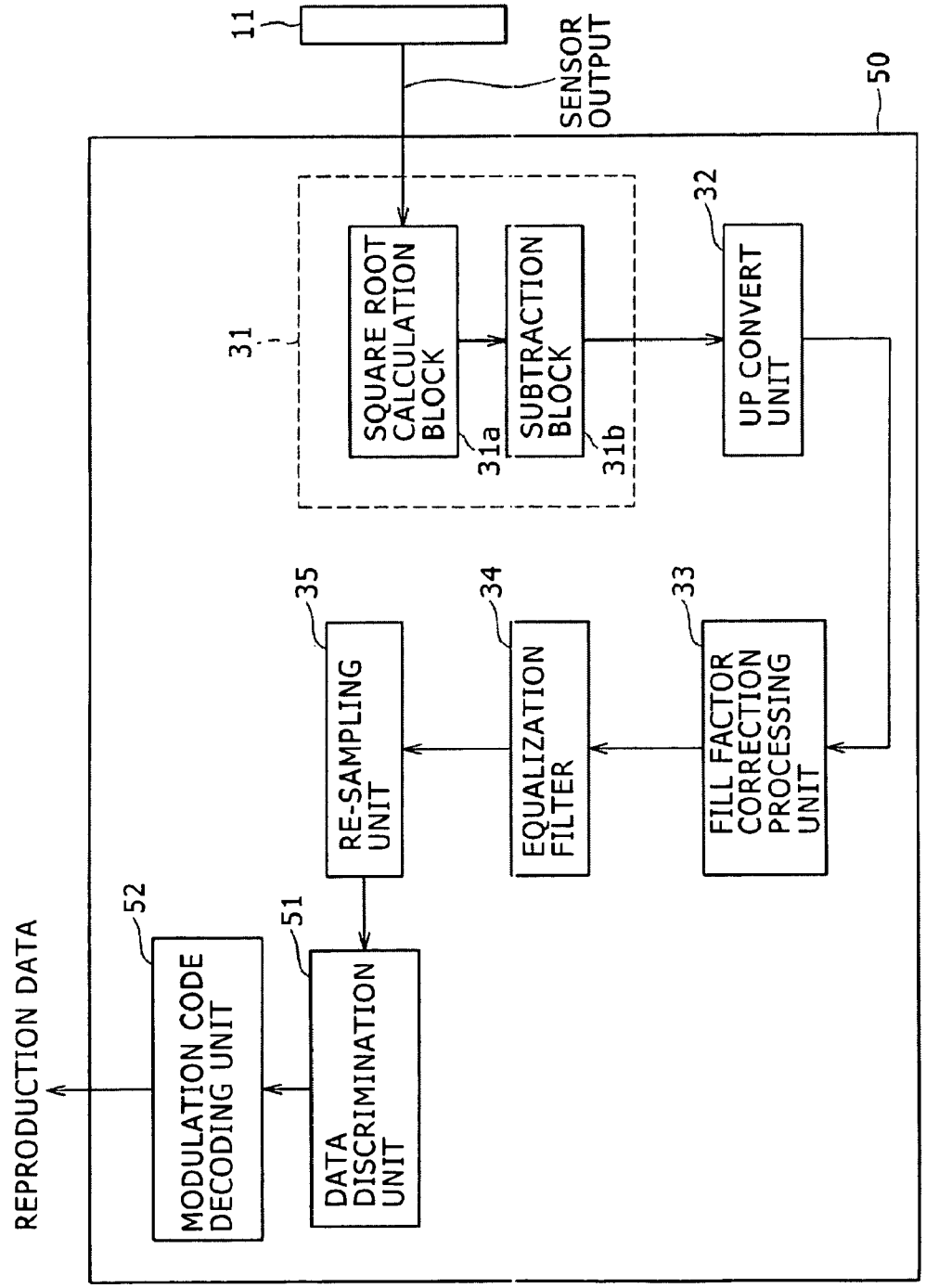
FIG. 17 is a view showing a configuration of a data reproduction section for carrying out a reproduction signal process based on an output of an image sensor as a view illustrating a configuration of the recording and reproduction apparatus as the first embodiment.

FIGS. 16 and 17 are views showing a configuration of a recording and reproduction apparatus as the first embodiment for implementing the 3-value recording/reproduction, and FIG. 16 shows a configuration of a data modulation and amplitude phase controlling section 40 for driving and controlling the SLM 3 and FIG. 17 shows a configuration of a data reproduction section 50 for carrying out a reproduction signal process based on an output of the image sensor 11.

It is to be noted that, in those figures, those elements described with reference to FIGS. 1, 9 and 14 are denoted by like reference characters and description of them is omitted.

Further, FIG. 16 shows only the SLM 3 of the configuration of the recording and reproduction apparatus shown in FIG. 1 in an extracted fashion while the other part is omitted. Similarly, FIG. 17 shows only the image sensor 11 from within the configuration of the recording and reproduction apparatus shown in FIG. 1 in an extracted fashion while the other part is omitted.

Referring first to FIG. 16, the data modulation and amplitude phase controlling section 40 includes a recording modulation encoding unit 41 and a mapping unit 42 and further includes the intensity modulation driver 23 and the phase modulation driver 25 shown also in FIG. 9 as seen in the figure.

First, operation upon recording by the data modulation and amplitude phase controlling section 40 is described.

Upon recording, recording data to be recorded on the hologram recording medium 10 are inputted to the recording modulation encoding unit 41. The recording modulation encoding unit 41 converts one symbol of the recording data (two values of "0" and "1") inputted in this manner into a code by the three values of "−1," "0" and "1" in accordance with a rule for recording modulation encoding determined in advance.

Though not shown, a conversion table wherein individual data patterns which can appear when such a predetermined number of bits of two-value data as illustrated in (a) of FIG. 15 form one symbol and individual data patterns which satisfy the DC-free condition where a predetermined number of bits of such three-value data as illustrated in (b) of FIG. 15 are associated with each other is stored in the recording modulation encoding unit 41. The recording modulation encoding unit 41 converts a data pattern for one symbol of the recording data inputted in accordance with the conversion table. By this, recording modulation encoding by two value→three-value is carried out.

While the description is given in the case of 4 bits and 1 symbol for simplification, it is assumed that actually, for example, the two-value side uses one symbol of eight bits or more while the three-value side uses one symbol of seven bits or more so that increase of the recording capacity may be achieved together with the DC-free condition.

Three-value codes obtained as a result of such recording modulation encoding carried out by the recording modulation encoding unit 41 as described above are successively supplied to the mapping unit 42.

The mapping unit 42 maps the three-value codes supplied from the recording modulation encoding unit 41 on one hologram page. It is to be noted that the mapping process in this instance is similar to the mapping process of the mapping unit 22 described hereinabove with reference to FIG. 9 except that a code handled in the signal light area A2 is changed from "0" and "1" to the three values of "−1," "0" and "1." In particular, also in this instance, since one symbol is determined to a predetermined bit number (in the example of FIG. 15, 4 bits), for each one symbol including the predetermined number of bits, the bits are arrayed, for example, into a block, and such data arrays of one symbol in the form of a block are mapped in the signal light area A2. Then, together with the data pattern in the signal light area A2 obtained by such mapping, a data pattern wherein the reference light area A1 has a predetermined pattern of "0" and "1" and the other regions have all "0s" is produced. Then, they are joined to produce data patterns for all effective pixels of the SLM 3.

Then, the mapping unit 42 controls the output voltages from the intensity modulation driver 23 and the phase modulation driver 25 based on the data patterns for all effective pixels of the SLM 3 obtained in this manner. Specifically, with regard to each pixel to which "0" is mapped, an instruction of a value for setting the output voltage to "0" is issued to the intensity modulation driver 23 and the phase modulation driver 25. Meanwhile, with regard to each pixel to which "1" is mapped, an instruction of a value for setting the output voltage to "1" is issued only to the intensity modulation driver 23 and another instruction of a value for setting the output voltage to "0" is issued to the phase modulation driver 25. Further, with regard to each pixel to which "−1" is mapped, an instruction of a value for setting the output voltage to a value corresponding to "1" is issued to the intensity modulation driver 23 and the phase modulation driver 25.

Also in this instance, the intensity modulation driver 23 drives the pertaining pixel of the intensity modulator 3a based on the instructed value, and the phase modulation driver 25 drives the pertaining pixel of the phase modulator 3b in response to the instructed value.

Accordingly, since such control by the mapping unit 42 as described above is carried out, upon recording, signal light wherein "−1," "0" and "1" are arrayed is outputted together with reference light from the SLM 3. Namely, the three values of "−1," "0" and "1" can be recorded on the hologram recording medium 10 thereby.

It is to be noted that, while phase modulation of the reference light area A1 is not particularly described here, also in this instance, phase modulation by a predetermined pattern determined in advance may be carried out for the reference light area A1 similarly as in the case described hereinabove with reference to FIG. 9.

Subsequently, operation upon reproduction is described.

Operation of the data modulation and amplitude phase controlling section 40 upon reproduction is similar to the operation upon reproduction of the data modulation and phase modulation controlling section 20 described hereinabove with reference to FIG. 9. Namely, upon reproduction, the mapping unit 42 produces a data pattern wherein the reference light area A1 has a pattern of "0" and "1" similar to that upon recording and the gap area A3 and the region on the outer circumferential side with respect to the reference light area A1 are all set to "0" and besides the inside of the signal light area A2 is set to a predetermined value other than "0." Then, the mapping unit 42 supplies the data pattern to the intensity modulation driver 23. Here, also in this instance, for the "predetermined value" to be allocated to the signal light area A2, a value set in advance such that the addition value of coherent light becomes a higher value than the highest value of the absolute values of the amplitude of the reproduction image is used.

Then, together with this, the mapping unit 42 produces a data pattern as a phase modulation pattern similar to that upon recording for the reference light area A1 and produces a data pattern which is filled with the predetermined value over the overall area thereof for the signal light area A2. Then, the data patterns are joined together to produce data for all effective pixels of the phase modulator 3b and are supplied to the phase modulation driver 25. It is to be noted that, for the "predetermined value" to be provided to the phase modulation driver 25 in this manner, "0.5" for providing a phase by "$\pi/2$" (in the case of 256 gradations, a value corresponding to "127") is used.

By such operation of the data modulation and amplitude phase controlling section 40 as described above, upon reproduction, coherent light which has a phase same as that of the reproduction image and has an intensity higher than the highest value of the absolute values of the amplitude of the reproduction image is irradiated upon the hologram recording medium 10 together with reference light.

Subsequently, the data reproduction section 50 shown in FIG. 17 is described.

As seen in the figure, also the data reproduction section 50 includes a linearization processing unit 31 which in turn includes a square root calculation block 31a and a subtraction block 31b so that linear reading out can be carried out corresponding to such coherent light addition as described above. Further, at the succeeding stage of the linearization processing unit 31, an up convert unit 32, a fill factor correction processing unit 33, an equalization filter 34 and a re-sampling unit 35 are provided.

It is to be noted that, also in this FIG. 17, operation from a linearization process to re-sampling carried out for an output image signal by the image sensor 11 is similar to that in the case of FIG. 9 described hereinabove, and therefore, description of the operation is omitted.

In this instance, processes after the amplitude value of each data pixel is specified by the re-sampling unit 35 are different.

First, a data discrimination unit 51 receives the value of each pixel (represented by a predetermined gradation such as, for example, 256 gradations) obtained by the re-sampling unit 35 as an input thereto and discriminates which one of the three values of "−1," "0" and "1" the value of each data pixel is. Here, since mapping in the signal light area A2 in this instance is carried out in a minimum unit of one symbol determined by recording modulation encoding as described hereinabove, for example, also the data discrimination unit 51 carries out such three-value data discrimination of "−1," "0" and "1" in a unit of one symbol.

A result of such data discrimination for each symbol unit obtained by the data discrimination unit 51 as described above is supplied to a modulation code decoding unit 52.

The modulation code decoding unit 52 uses a conversion table similar to that stored in the recording modulation encoding unit 41 described hereinabove with reference to FIG. 16 to decode a data pattern of the two values of "0" and "1" from the data discrimination result for each symbol unit supplied from the data discrimination unit 51 as described above (Namely, a three-value data pattern by "−1," "0" and "1": as occasion demands, also an All "0" pattern is included).

By this, the original recording data by the two values of "0" and "1" are reproduced.

In this manner, according to the three-value recording/reproduction as the first embodiment, as recording modulation encoding, an original data pattern of two-value data by "0" and "1" is allocated to a data pattern by the three values additionally including "−1." Therefore, it is possible to make the encoding rate higher than 100% to achieve increase of the recording capacity.

Further, since only a combination wherein the numbers of "−1" and "1" are equal to each other is allocated as a three-value data pattern, also suppression of the DC component can be achieved. Furthermore, since one symbol of the three-value side is formed from seven bits or more in a corresponding relationship to a case wherein one symbol of the two-value side at this time is formed from eight bits or more, increase of the recording capacity can be achieved while suppression of the DC component is achieved.

It is to be noted that, while, in the foregoing description, a case wherein the phase to be combined with the amplitude in three-value recording/reproduction of the first embodiment is "0" and "1" is described, as the phase to be combined, two phases displaced by π from each other should be used. Also with regard to the amplitude, "0" and a predetermined value other than "0" should be used similarly. At least where combinations of such amplitudes and phases are used, three-value recording can be implemented.

Further, while, in the first embodiment, a case wherein a component added by coherent light is removed by carrying out calculation of a square root for an output of the image sensor 11 and then subtracting a value corresponding to the addition amount of coherent light from a result of the calculation is described, it is possible to remove an added component of coherent light, for example, by a filter process of removing a DC component or a like process in addition to the case wherein the explicit subtraction process is carried out in this manner.

3-2. Second Embodiment

Multi-Value Recording/Reproduction

Subsequently, the second embodiment is described.

As apparent also from the foregoing description, if the linear reading out technique described hereinabove with reference to FIGS. 9 to 14 is used, then also it is possible to reproduce information of the phase together with information of the amplitude recorded on the hologram recording medium 10. If it is taken into consideration that recording/reproduction can be carried out with regard to both of the amplitude and the phase in this manner, then it can be considered that the technique for hologram recording and reproduction is rather near to a technique for data communication than to a recording and reproduction technique for optical disks such as a CD (Compact Disc) or a DVD (Digital Versatile Disc).

Based on this point, the second embodiment proposes a technique for hologram multi-value recording/reproduction wherein such a modulation and demodulation method as QAM (Quadrature Amplitude Modulation) or PSK (Phase Shift Keying) which are used generally in the field of data communication is applied to hologram recording/reproduction.

Here, for the confirmation, the modulation and demodulation methods of the QAM and the PSK are described briefly. The QAM is also called orthogonal amplitude modulation and is a modulation and demodulation method which uses both of the amplitude and the phase of a wave after conversion. For example, 4×4=16 different kinds (4 bits) of information can be sent by one time transfer by distinguishing four states of the amplitude and four stages of the phase.

Meanwhile, the PSK is phase shift keying and is a modulation and demodulation method which represents information by a combination of a plurality of waves having phases displaced from each other. For example, the 4PSK (also called QPSK) can transfer information of four values (2 bits) at a time by using totaling four waves including a sine wave used as a reference and waves having phases displaced, for example, by 90 degrees, 180 degrees and 270 degrees from that of the sine wave and allocating different values to the four waves.

Figure 18:
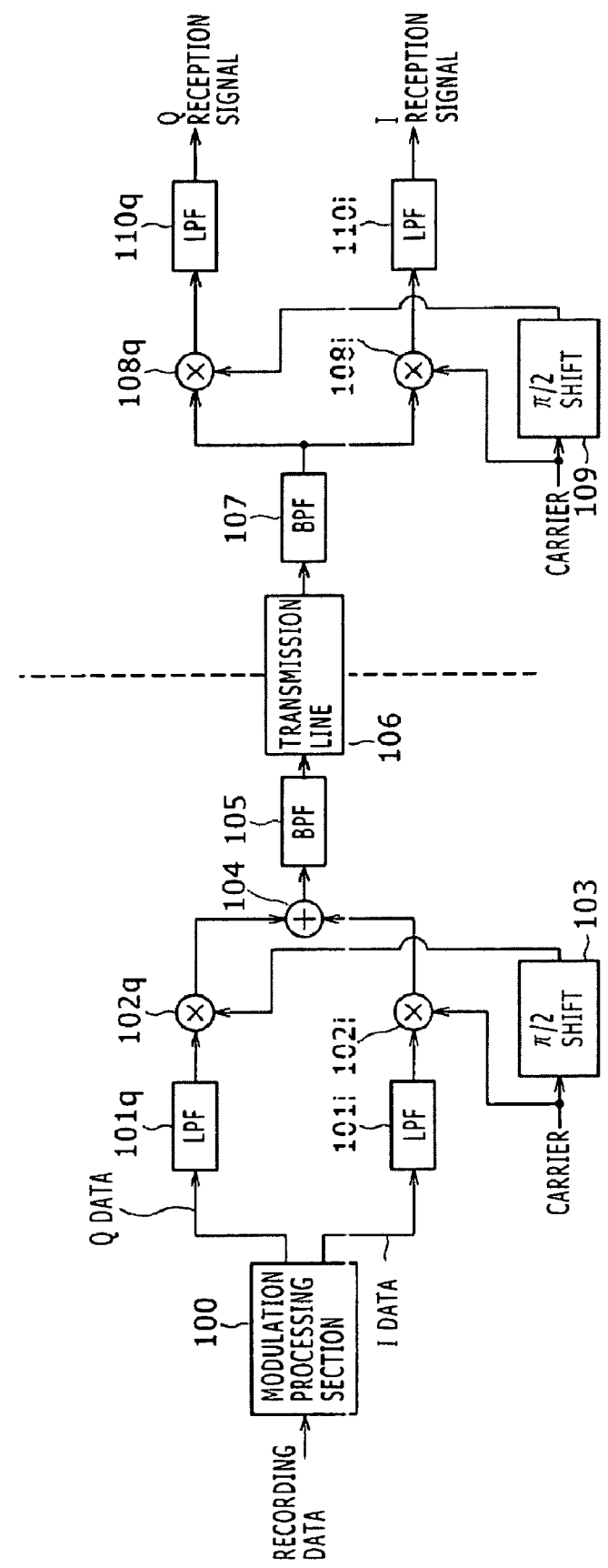
FIG. 18 is a view illustrating a modulation and demodulation method by QAM and PSK.

Here, in both of the QAM and the PSK, recording data are divided into two different data including I (In-phase) data and Q (Quadrature) data, and both of the I data and the Q data are individually passed through LPFs (Low Pass Filters) to limit the bandwidth thereof and then multiplied by carriers having phases of 0 and π/2 having an orthogonal phase relationship as seen in FIG. 18.

Referring to FIG. 18, recording data are first subjected to a modulation process according to the QAM or the PSK by a modulation processing section 100 and divided into I data and Q data as seen in the figure. The I data are band-limited by an LPF 101i and then multiplied by a carrier by a multiplier 102i as seen in the figure. Meanwhile, the Q data are band-limited by an LPF 101q and then multiplied by the carrier, whose phase has been changed by 90 degrees by a π/2 shift unit 103, by a multiplier 102q.

The I data and the Q data multiplied by the carriers having the phases of 0 and π/2 having an orthogonal relationship to each other, respectively, by the multipliers 102 are combined by an adder 104 as seen in the figure, and a result of the combination is band-limited by a BPF (Band Pass Filter) 105 and then outputted to a transmission line 106.

Then, on the reception side, the signal inputted from the transmission line 106 as seen in the figure is band-limited by a BPF 107 and then branched and inputted to a multiplier 108i and another multiplier 108q. A carrier similar to that used on the transmission side is supplied to the multiplier 108i, and the carrier whose phase is changed by 90 degrees by a π/2 shift unit 109 as seen in the figure is supplied to the multiplier 108q.

The signal multiplied by the carrier (phase 0) by the multiplier 108i is band-limited by an LPF 110i as seen in the figure, and a result of this makes an I reception signal. Meanwhile, the signal multiplied by the carrier of the phase π/2 by the multiplier 108q is band-limited by an LPF 110q, and a result of this makes a Q reception signal.

Though not shown, the I reception signal and the Q reception signal are sampled and data-discriminated to restore the original I data and Q data.

Figure 19:
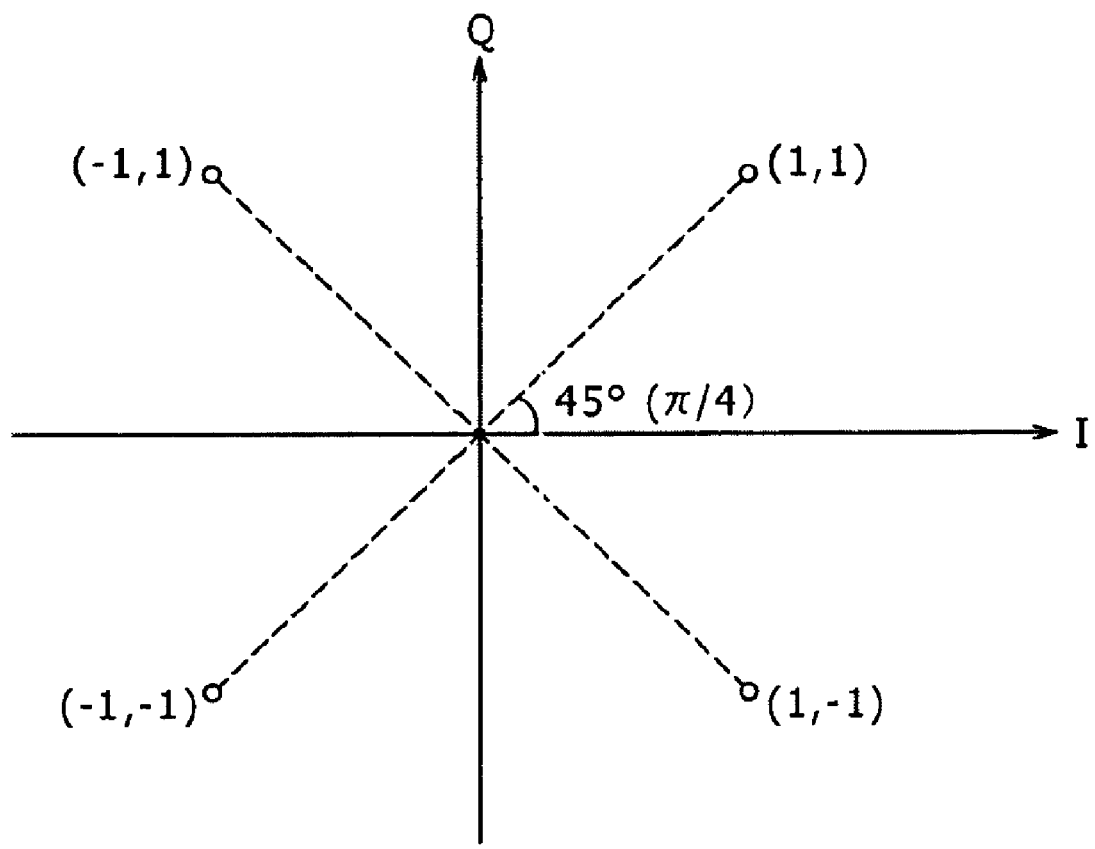
FIG. 19 is a view showing signal point arrangement where a QPSK method is adopted as a view illustrating a combination of I data and Q data in a case wherein the modulation and demodulation method by QAM and PSK is adopted.

FIG. 19 is a view illustrating combinations of I data and Q data where a modulation and demodulation method according to the QAM or the PSK is adopted, and shows a signal point arrangement diagram where the QPSK method is adopted. As described hereinabove, the QPSK method is a method wherein four different phases are combined with one amplitude to transmit four values at a time, and in FIG. 19, combinations of I data and Q data in a case wherein the QPSK method wherein the four phases to be combined are π/4, 3π/4, 5π/4 and 7π/4 are illustrated as an example.

First, from a relationship that, in the modulation and demodulation method of the PSK or the QAM, two carriers whose phases have an orthogonal relationship to each other are multiplied as described above, a signal point arrangement is represented by a coordinate system having an I axis (axis of abscissa in the figure: x axis) and a Q axis (axis of ordinate in the figure: y axis) orthogonal to the I axis as seen in the figure. In this instance, it may be considered that the I axis represents the phase of 0 degree and the Q axis represents the phase of 90 degrees.

Where the four phases of π/4, 3π/4, 5π/4 and 7π/4 are combined with one amplitude as in the example of the PSK illustrated in this figure, the values of the I data and the Q data are represented by (1, 1), (−1, 1), (−1, −1) and (1, −1) as seen in the figure. For example, as seen in the figure, the signal point of the combination with the phase π/2 is represented by a coordinate (1, 1), that is, represented by a coordinate whose amplitude on the I axis is "1" and whose amplitude on the Q axis is "1" as well. Similarly, the signal point according to the combination with the phase 3π/4 is represented by another coordinate (−1, 1), that is, by a coordinate whose amplitude on the I axis is "−1" and whose amplitude on the Q axis is "1." Further, the signal point of the combination with the phase 5π/4 is represented by a further coordinate (−1, −1), that is, by a coordinate whose amplitudes on both of the I axis and the Q axis are "−1," and the signal point of the combination with the phase 7π/4 is represented by a still further coordinate (1, −1), that is a coordinate whose amplitude on the I axis is "1" and whose amplitude on the Q axis is "−1."

As can be recognized also from the fact that signal points where the individual phases are combined are represented by a value on the I axis and a value on the Q axis in this manner, the reception side (demodulation side) can obtain values of the I data and the Q data by sampling the values of the I reception signal and the Q reception signal obtained by the multiplication by carriers whose phases have an orthogonal relationship to each other as seen in FIG. 18 to carry out data discrimination (in short, in this instance, discrimination between "1" and "−1"). Namely, this makes it possible to specify with which phase the received data is combined and specify which one of the four values the received data has.

As described above, in the multi-value modulation and demodulation method according to the PSK or the QAM, a method of multi-value modulation and demodulation applies by multiplying, on the transmission side, I data and Q data by carriers whose phases have an orthogonal relationship to each other and combining and transmitting results of the multiplication and by dividing, on the reception side, a reception signal into two signals and multiplying the signals by carriers whose phases are orthogonal to each other to obtain an I reception signal and a Q reception signal in such a manner.

In order to apply this to a hologram recording and reproduction method, upon recording, an amplitude and a phase calculated from the I data and the Q data should be recorded together. On the other hand, upon reproduction, coherent light beams having phase differences of 0 and π/2 from a reproduction image (the phase differences are π/2 and π from the reference phase of reference light, respectively) should be irradiated separately by two times together with reference light to carry out reading out, and two readout signals obtained by such reading out should be handled as signals corresponding to an I reception signal and a Q reception signal thereby to demodulate the I data and the Q data.

It is to be noted that the reference phase of the reference light points to the phase of light which passes through an ON pixel of the phase "0" (that is, a pixel of "+1" whose phase is "0" and whose amplitude is "1").

An outline of such hologram multi-value recording/reproduction as the second embodiment is described below with reference to FIG. 20.

(a) of FIG. 20 illustrates an outline of operation upon recording, and (b) of FIG. 20 illustrates an outline of operation upon reproduction.

It is to be noted that the following description is given taking a case wherein hologram multi-value recording/reproduction which applies a QPSK method similar to that described hereinabove with reference to FIG. 19 as an example for the simplified description. In other words, the four phases including the phases of π/4, 3π/4, 5π/4 and 7π/4 are combined with one certain amplitude to carry out four-value recording/reproduction.

Referring to (a) of FIG. 20, upon recording, recording data are subjected to multi-value modulation to obtain I data and Q data first at multi-value modulation processing step S1. In this instance, since the QPSK method is adopted as the multi-value modulation and demodulation method, recording data formed from a combination of the two values of "0" and "1" is encoded using the four values represented by (1, 1), (−1, 1), (−1, −1) and (1, −1) described hereinabove with reference to FIG. 19.

For example, if a case wherein one symbol is formed from 2 bits of recording data by the two values of "0" and "1" is considered, then four combinations of "11," "10," "01" and "00" are available. For example, by allocating the four values individually to different four such recording data patterns, 2 bits of the recording data can be represented by 1 bit. In other words, the encoding ratio is 200%.

Here, as an example, it is assumed that the coordinate (1, 1) is allocated to the data pattern of "11" of the recording data and the coordinate (−1, 1) is allocated to "10." Further, it is assumed that the coordinate (−1, −1) is allocated to "01," and the coordinate (1, −1) is allocated to "00."

As can be recognized from the foregoing description given with reference to FIG. 19, each of the values of the coordinates indicates a value on the I axis and a value on the Q axis, and consequently indicates values of I data and Q data. In other words, that such allocation as described above is carried out corresponds to that I data and Q data are obtained in such a manner as seen in the figure.

At subsequent amplitude and phase allocation step S2, allocation of an amplitude and a phase to be recorded on a hologram recording medium is carried out from the values of the I data and the Q data obtained at the multi-value modulation processing step S1. Since the coordinate (1, 1), that is, the combination of the I data="1" and the Q data="1," is the combination of a predetermined amplitude (√2) and the phase π/4, the predetermined amplitude and the phase π/4 are allocated to a code according to the coordinate (1, 1). Similarly, to the combination of the I data="−1" and the Q data="1" (coordinate (−1, 1)), the predetermined amplitude and the phase 3π/4 are allocated, and to the combination of the I data="−1" and the Q data="−1" (coordinate (−1, −1)), the predetermined amplitude and the phase 5π/4 are allocated. Further, to the combination of the I data="1" and the Q data="−1" (coordinate (1, −1)), the predetermined amplitude and the phase 7π/4 are allocated.

Then, at intensity and phase modulation step S3, amplitude and phase conversion is carried out for incident light so that the information of the amplitude and the phase allocated in such a manner as described above at amplitude and phase allocation step S2 may be recorded, and the resulting light is irradiated upon the hologram recording medium. By such intensity and phase modulation step S3 as just described, four values represented by four coordinates shown in FIG. 19 can be recorded as combinations of an amplitude and a phase on the hologram recording medium.

Now, an outline of operation upon reproduction illustrated in (b) of FIG. 20 is described.

First, upon reproduction, also in this instance, coherent light is irradiated together with reference light upon a hologram recording medium so that linear reading out by which recorded information of the phase is read out can be carried out. Then, two different coherent light beams having phase differences of 0 (that is, the same phase) and π/2 from that of the reproduction image are irradiated so that, in this instance, a state which corresponds to the state wherein carriers having phases orthogonal to each other are multiplied is obtained in such a manner as described hereinabove to carry out reading out two times.

Specifically, as illustrated as step S4-1 and step S4-2 in the figure, irradiation of reference light and coherent light is irradiated twice. As described hereinabove, in order to cause the coherent light to have a phase same as that of a reproduction image obtained by irradiation of the reference light, it is necessary to provide a phase difference of π/2 between the phase of the reference light and the phase of the coherent light. Accordingly, a phase pattern same as that upon recording is provided to the reference light (that is, the reference phase of the reference light is "0"), and upon first time irradiation, the phase of the coherent light is set to π/2. Consequently, the phase of the coherent light can be made same as the phase of the reproduction image. Then, upon second time irradiation, the phase of the coherent light is set to π so that the phase of the coherent light is displaced by π/2 from the phase of the reproduction image.

It is to be noted that, also in this instance, in order to make linear reading out possible, it is necessary to satisfy the condition that the addition amount (light intensity) of the coherent light is at least higher than the highest value of the absolute values of the amplitude of the reproduction image.

Since irradiation upon the hologram recording medium is carried out twice at steps S4-1 and S4-2, two readout signals are obtained per one hologram page at reading out step S5.

Then, at multi-value demodulation processing step S6, a multi-value demodulation process by the second embodiment hereinafter described is carried out based on the two readout signals obtained at reading out step S5 in this manner to reproduce I data and Q data.

Here, as described hereinabove with reference to FIG. 20, in the case of the hologram recording/reproduction method, since the reproduction side carries out twice-reading with the phase of the coherent light changed, two signals corresponding to a state wherein carriers whose phases have an orthogonal relationship are combined are obtained on the demodulation side as in the case of communication.

However, it is not proved by this that, also in the case of hologram recording and reproduction, a multi-value demodulation process can be carried out similarly as in the case of communication. In the following, whether or not multi-value demodulation is possible using such a twice-reading technique as described hereinabove with reference to FIG. 20 is verified.

Figure 21:
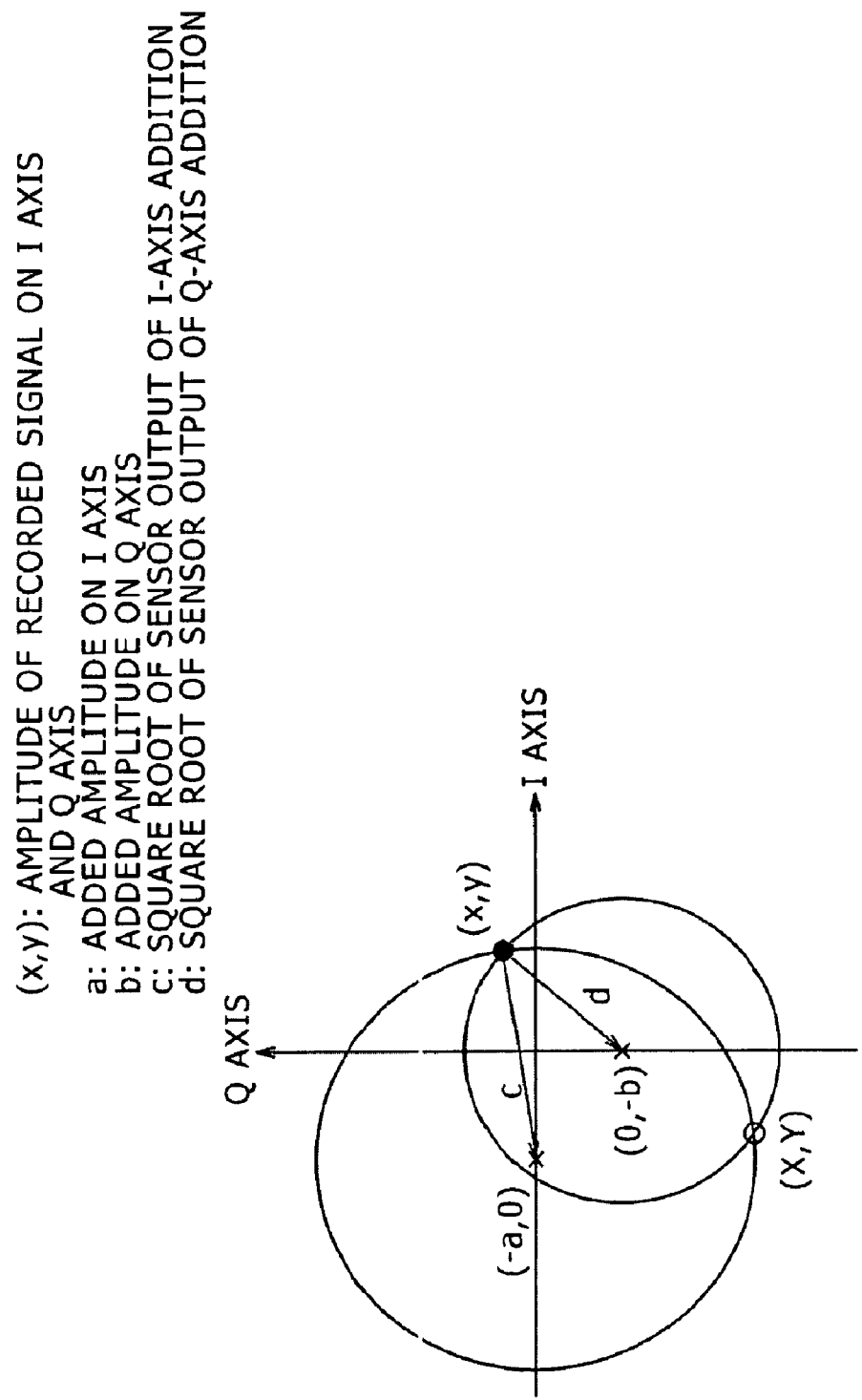
FIG. 21 is a view for verifying whether or not multi-value demodulation based a twice reading technique as the second embodiment applies.
Figure 22:
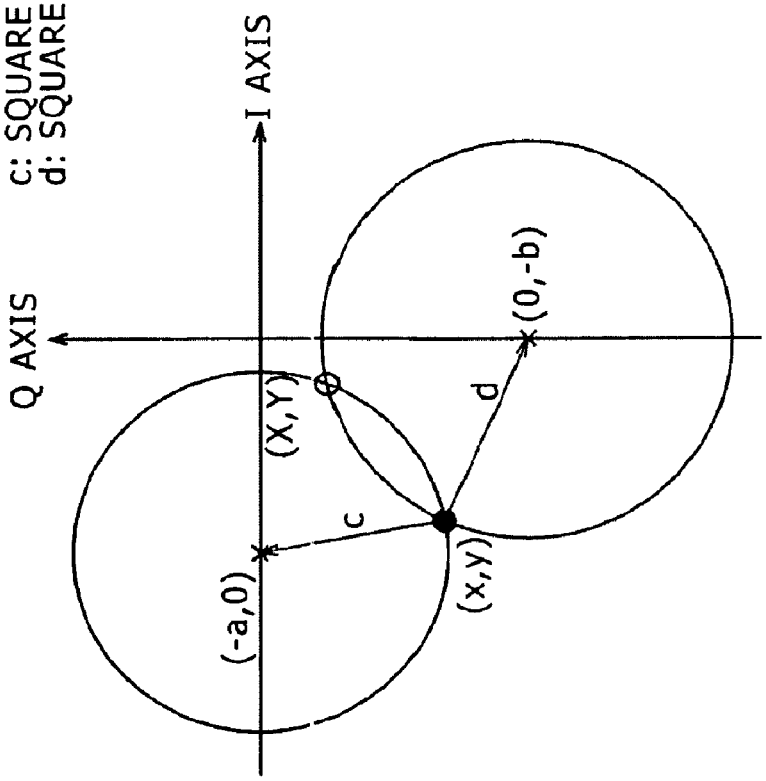
FIG. 22 is a view similarly for verifying whether or not multi-value demodulation based the twice reading technique as the second embodiment applies.
Figure 23:
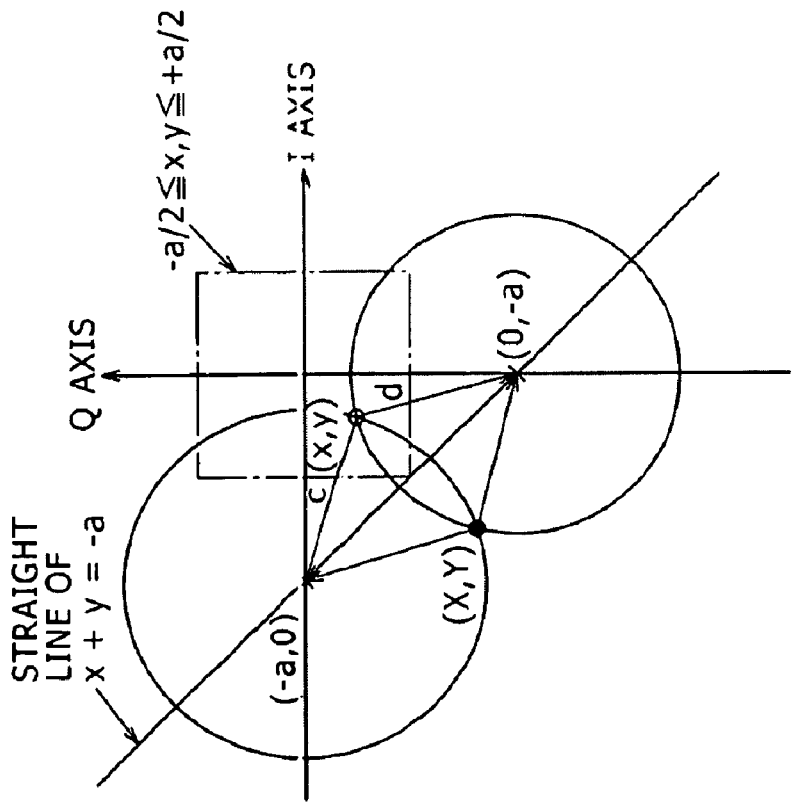
FIG. 23 is a view similarly for verifying whether or not multi-value demodulation based the twice reading technique as the second embodiment applies.

FIGS. 21 to 23 show views for verifying whether or not multi-value demodulation based on such a twice-reading technique of the second embodiment as described above applies.

In those figures, similarly as in FIG. 19, an I axis and a Q axis are used as reference axes, and an amplitude on the I axis and an amplitude on the Q axis of a signal recorded on the hologram recording medium are indicated by a coordinate (x, y). Further, as amplitudes added to the reproduction image by twice irradiation of coherent light for such twice reading as described above, the amplitude added by the coherent light of the phase difference 0 (amplitude on the I axis added in the figure) is indicated by a and the amplitude added by the coherent light of the phase difference π/2 (amplitude on the Q axis added in the figure) is indicated by b (it is to be noted that b is not shown in FIG. 23). Further, the square root of an output of the image sensor when the coherent light of the phase difference 0 is added (square root of the sensor output added on the I axis) is indicated by c, and the square root of the output of the image sensor when the coherent light of the phase difference π/2 (square root of the sensor output added on the Q axis) is indicated by d.

First, in FIG. 21, where
(x, y): amplitudes of the recorded signal on the I axis and the Q axis
a: added amplitude on the I axis
b: added amplitude on the Q axis
c: square root of the sensor output added on the I axis
d: square root of the sensor output added on the Q axis
as described above, the relationships of the following [expression 1] and [expression 2] apply

[Expression 1]

$$(x+a)^2+y^2=c^2 \quad \text{expression 1}$$

$$x^2+(y+b)^2=d^2 \quad \text{expression 2}$$

Here, in the [expression 1] and [expression 2], the values of a and b are values of the addition amount of the coherent light and are values which can be determined in advance. In other words, the values of a and b can be known values.

Meanwhile, the values of c and d can be calculated from signals read out by coherent light addition where the phase is 0 and π/2, respectively, and can be made known values.

If the values of a, b, c and d are known in this manner, then it can be recognized that the values (x, y) of the recorded signal indicate an intersection point of a circle centered at (−a, 0) and another circle centered at (0, −b).

However, where the two circles intersect with each other at two points as seen in the figure, they have a false solution of (X, Y) in addition to the true solution (x, y), and the true solution (x, y) is not decided uniquely. In other words, even if a demodulation process is carried out using the known values a, b, c and d, multi-value modulation cannot be carried out appropriately.

It is to be noted that, where the true solution and the false solution are compared with each other, if it is decided that the true solution is obtained such that it always satisfies a certain condition, then that one of the determined two solutions which satisfies the condition can be determined as the true solution. For example, if a condition that the true solution (x, y) is always obtained at a position nearer to the origin than the false solution (X, Y) as seen in the figure is satisfied, then the true solution can be obtained by selecting that one of two determined solutions which is nearer to the origin.

Further, in the case of the present embodiment, since linear reading out is assumed, the values of a and b which correspond to the addition amounts of the coherent light are not arbitrary, but at least a condition that "they are higher than the highest value of the absolute values of the amplitude of the reproduction image" is applied. Specifically, the condition is:

for the value of a, "a>|x|" (hereinafter referred to as "x+a>0"

for the value of b, "b>|y|" (hereinafter referred to as "y+b>0")

Taking the two points described above into consideration, it has been verified whether or not, if the conditions "x+a>0" and "y+b>0" are satisfied, then that one of two solutions obtained which is nearer to the origin is the true solution (x, y). FIG. 22 indicates a result of the verification.

If the conditions of x<0 and y<0 are set in such a manner as seen in FIG. 22, then a case wherein, even if the conditions "x+a>0" and "y+b>0" described above are applied, the false solution (X, Y) comes nearer to the origin than the true solution (x, y) may possibly occur. Accordingly, if only the conditions of "x+a>0" and "y+b>0" are applied, then a solution is not decided uniquely.

Therefore, when trial calculation was carried out changing the conditions for the addition amounts a and b, it was found that, if the values of the addition amounts a and b are higher than twice the maximum values of the absolute values of x and y, then the solution is decided uniquely.

This is described with reference to FIG. 23.

It is to be noted that, in FIG. 23, since there is no necessity to change the addition amount of coherent light particularly upon twice reading, the addition amounts a and b are treated as the addition amount a as seen in the figure. In short, the solution in this instance is indicated as an intersection point of a circle centered at (−a, 0) and another circle center at (0, −a) as seen in the figure.

Further, according to FIG. 22, since a counterexample occurs with the conditions of x<0 and y<0, also in this instance, the conditions of x<0 and y<0 are set.

First, when two circles are tangent to each other, only one solution is provided naturally. In particular, only the true solution (x, y) is obtained. Where two circles are tangent to each other in this manner, the tangential point lies on a straight line (referred to as straight line L) of x+y=−a illustrated in the figure.

Here, the point on the straight line L at which the distance from the origin is smallest is a point of a coordinate (−a/2, −a/2), and the distance D1 from this point to the origin is $a/2*\sqrt{2}$ to $a/\sqrt{2}$.

At this time, if the distance D2 from the origin to (x, y) is let be equal to x2+y2, then if the distance D2 is lower than the square (a2/2) of the value of the distance D1, then the true solution (x, y) comes to the right upper side of the straight line without fail. Simultaneously, it is assured that the false solution (X, Y) comes to the right lower side of the straight line without fail.

From this, if x2+y2≦a2/2, that is, if 2(x2+h2)≦a2, then where two solutions are obtained, it is assured that the true solution (x, y) is nearer to the origin without fail.

At this time, 2(x2+y2) exhibits the maximum value naturally when both of the absolute values of x and y are their maximum values. If it is assumed that both of the absolute values of x and y are MAX, then the value of 2(x2+y2) is 2MAX2+2MAX2=4MAX2, and accordingly, 2(x2+h2)≦a2 can be represented as 4MAX2≦a2, that is, 2MAX≦a.

From this, where 2MAX≦2, that is, where the addition amount a is higher than twice the maximum value MAX of the absolute values of x and y, it can be assured that the true solution (x, y) is nearer to the origin without fail and the true solution can be determined uniquely. In other words, multi-value demodulation can be carried out appropriately by adding coherent light of the addition amount a (that is, the intensity a) which is higher than twice the maximum value MAX of the absolute values of x and y to carry out reading out.

It is to be noted that, in this instance, if the addition amount a is tentatively set to a=2MAX, then the true solution (x, y) is within a range of −a/2≦x and y≦a/2 surrounded by a square of an alternate long and short dash line in the figure.

From the verification above, it was confirmed that, if the condition that the addition amount a (or b) is set to a value higher than twice the highest value of the absolute values of x and y is set, then also where the value of the addition amount a (b) and the values of the two sensor outputs c and d obtained by twice reading are used to solve the [expression 1] and [expression 2], a solution can be determined uniquely.

Therefore, in the following, an actual calculation process for determining a true solution using such values a (b), c and d as mentioned above (that is, a process for demodulating I data and Q data) is described.

First, the solutions of the [expression 1] and the [expression 2] above are given by the following [expression 3] and [expression 4], respectively.

[Expression 2]

$$x = \{-a^*(A+b^2) \pm b\sqrt{B}\}/(a^2+b^2) \qquad \text{expression 3}$$

$$y = \{-b^*(A-b^2) \pm a\sqrt{B}\}/(a^2+b^2) \qquad \text{expression 4}$$

It is to be noted that A and B in the [expression 3] and [expression 4] are values represented by the following [expression 5] and [expression 6], respectively.

[Expression 3]

$$2A = a^2 - b^2c^2 + d^2 \qquad \text{expression 5}$$

$$B = a^2 * d^2 + b^2 * c - a^2 * b^2 - A^2 \qquad \text{expression 6}$$

In order to determine the solution (x, y), the known values a, b, c and d may be used to solve the [expression 3] and [expression 4]. Specifically, in order to calculate A and B used in the [expression 3] and [expression 4], the values a, b, c and d are first substituted into the [expression 5] and [expression 6] given above. Then, A and B obtained thereby are substituted into the [expression 3] and [expression 4], respectively, to solve them to calculate the solutions.

At this time, where two solutions are obtained, that one of them which is nearer to the origin is selected as the true solution (x, y).

By carrying out calculation using such [expression 3] to [expression 6] as given above and values of the addition amounts a and b of coherent light, the square root c of the sensor output obtained by the coherent light addition by the phase 0 and the square root d of the sensor output obtained by the coherent light addition by the phase π/2, information of the amplitude x on the I axis and the amplitude y on the Q axis of the recorded signal can be obtained. In other words, I data and Q data can be demodulated by this.

If the I data and the Q data are demodulated in this manner, then a combination of two-value data (for example, in this instance, one of "11," "10," "01" and "00") in accordance with the combination of the I data and the Q data should be selected in accordance with an encoding rule. In particular, for example, where the example described above is used, if the combination of the I data and the Q data is (1, 1), then "11" is selected; if the combination is (−1, 1), then "10" is selected; if the combination is (−1, −1), then "01" is selected; and if the combination is (1, −1), then "00" is selected. Decoding from a four-value code to a two-value code can be carried out in this manner.

Now, an apparatus configuration for implementing the technique of the hologram multi-value recording/reproduction as the second embodiment described above is described.

Figure 24:
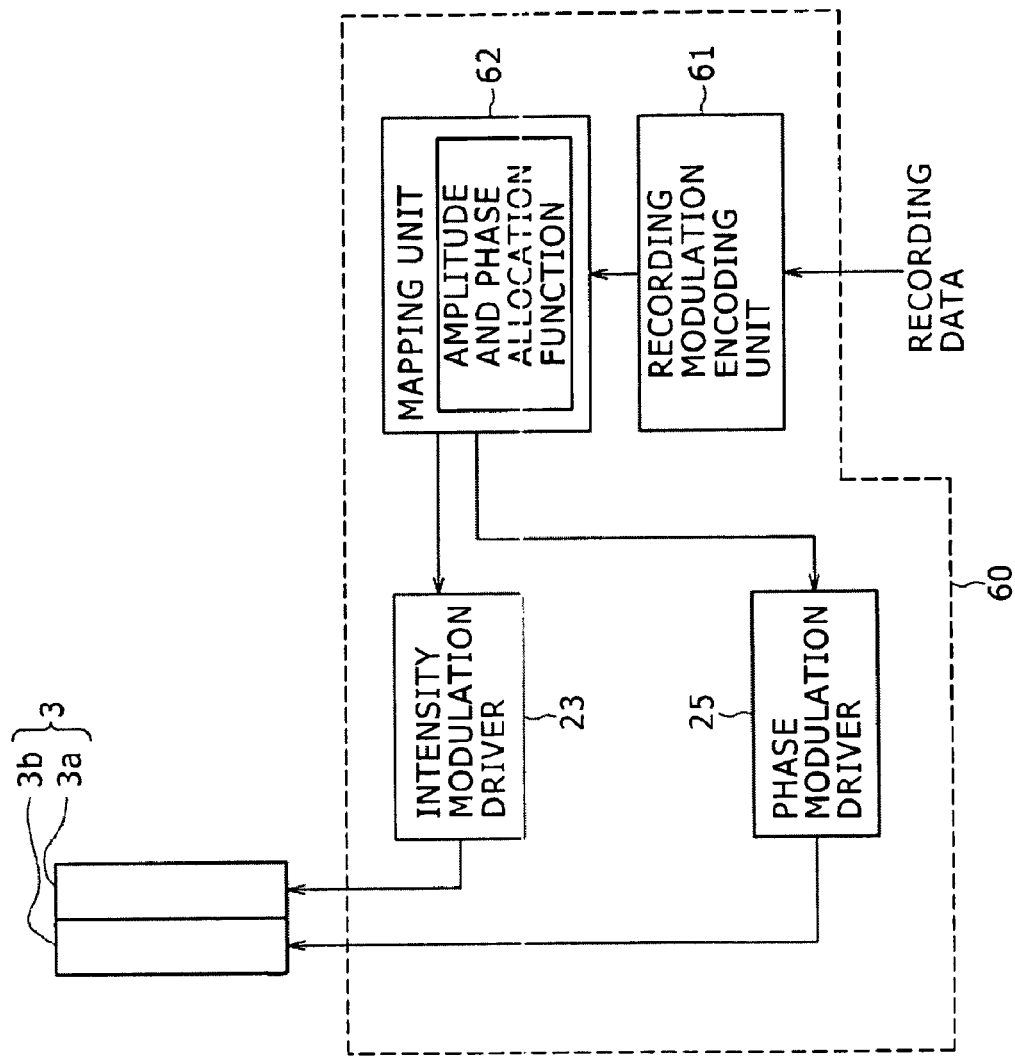
FIG. 24 is a view showing only a configuration of the SLM, and the data modulation and amplitude phase control section extracted from a configuration of a recording and reproduction apparatus as the second embodiment.

First, FIG. 24 illustrates only a configuration of the SLM 3 and a data modulation and amplitude phase controlling section 60 extracted from the configuration of the recording and reproduction apparatus for implementing the hologram multi-value recording/reproduction as the second embodiment. It is to be noted that, also in this instance, the configuration of the optical system of the hologram recording and reproduction apparatus is similar to that described hereinabove with reference to FIG. 1. Also in this instance, those elements described hereinabove are denoted by like reference characters and description thereof is omitted.

First, also in the SLM 3 in this instance, similarly to that described hereinabove with reference to FIG. 9, the intensity modulator 3a and the phase modulator 3b are formed integrally. Further, the data modulation and amplitude phase controlling section 60 is provided as an element for driving and controlling the intensity modulator 3a and the phase modulator 3b in the recording and reproduction apparatus.

As seen in the figure, in the data modulation and amplitude phase controlling section 60, an intensity modulation driver 23 and a phase modulation driver 25 shown also in FIGS. 9 and 16 are provided together with a recording modulation encoding unit 61 and a mapping unit 62.

First, upon recording, recording data are inputted to the data modulation and amplitude phase controlling section 60. The recording modulation encoding unit 61 carries out multi-value modulation encoding for the recording data inputted in this manner to modulate the recording data according to two values of "0" and "1" into a recording code according to multi-values. Specifically, in this instance, four-value encoding corresponding to the QPSK is carried out to modulate the recording data into a code (four-value code) according to a combination of I data and Q data. It is to be noted that, since an example of modulating two-value data into a code according to a combination of I data and Q data is described hereinabove, overlapping description here is omitted.

The mapping unit 62 receives the four-value codes obtained by the modulation encoding of the recording modulation encoding unit 61 as an input thereto and carries out mapping so that signal light and reference light upon recording may be obtained.

In short, as regards the signal light area A2, the inputted four-value codes are mapped to settle the positions of data pixels to which the codes are to be arranged. Further, with regard to each of the codes whose allocation position is settled, allocation of the amplitude and the phase according to its value is carried out. In particular, according to the foregoing description, when the combination of I data and Q data is (1, 1), the predetermined amplitude (for example, in this instance, $\sqrt{2}$) and the phase $\pi/4$ are allocated. Meanwhile, to (−1, 1), the predetermined amplitude and the phase $3\pi/4$ are allocated, and to (−1, −1), the predetermined amplitude and the phase $5\pi/4$ are allocated. Further, to (1, −1), the predetermined amplitude and the phase $7\pi/4$ are allocated. By such allocation, values of the amplitude and the phase to be recorded are determined for each of the pixels in the signal light area A2.

Together with this, the mapping unit 62 produces a data pattern wherein a predetermined data pattern is applied only in the reference light area A1 and any other than "0" is applied to the other part of the region outside the signal light area A2. Further, such a data pattern outside the signal light area A2 as just described and the data pattern in the signal light area A2 obtained by the amplitude allocation described above are joined together to produce a data pattern for all effective pixels of the SLM 3 (intensity modulator 3a).

Also with regard to the phase, a data pattern for all effective pixels of the SLM 3 (phase modulator 3b) is produced similarly by producing a data pattern wherein a predetermined pattern is set only to the reference light area A1 outside the signal light area A2 and the phase "0" is set to all of the other portion outside the signal light area A2 and joining this data pattern and the data pattern in the signal light area A2 obtained by the phase allocation described above.

Further, the mapping unit 62 controls the output voltage of each pixel by the intensity modulation driver 23 and the phase modulation driver 25 based on the data patterns on the amplitude side and the phase side produced in this manner. Also in this instance, the intensity modulation driver 23 drives a pertaining pixel of the intensity modulator 3a with the driving voltage value based on the control (instruction value) of the mapping unit 62, and also the phase modulation driver 25 drives a pertaining pixel of the phase modulator 3b with a driving voltage value based on the control (instruction value) of the mapping unit 62.

It is to be noted that, in this instance, the phase requires modulation up to $7\pi/4$ as described hereinabove. In response to this, the thickness d of the liquid crystal elements in the inside of the phase modulator 3b in this instance is set so that the phase can be modulated within the range from 0 to $7\pi/4$.

Where such operation upon recording by the data modulation and amplitude phase controlling section 60 is carried out, signal light to which a combination of an amplitude and a phase as a four-value code and reference light are outputted for each pixel from the SLM 3. Namely, a multi-value code according to a combination of an amplitude and a phase can be recorded thereby on the hologram recording medium 11.

Then, in this instance, where modulation encoding of the recording modulation encoding unit 61 described hereinabove is carried out, recording data can be recorded for a plurality of bits by a combination of an amplitude and a phase recorded for each pixel. In short, increase of the recording capacity is achieved thereby. For example, in the case of the QPSK in this instance, recording data for 2 bits can be recoded by a combination of an amplitude and a phase recorded for each one pixel, and as a result, the recording capacity can be increased to twice.

Now, operation upon reproduction is described.

Referring to FIG. 24, in the data modulation and amplitude phase controlling section 60 upon reproduction, amplitude and phase control for carrying out twice-reading operation by coherent light addition described hereinabove is carried out by the mapping unit 62.

Specifically, as regards amplitude control upon reproduction, the mapping unit 62 produces a data pattern wherein a pattern of "0" and "1" similar to that upon recording is applied to the reference light area A1 and "0" is applied to the gap area A3 and the region on the outer periphery side with respect to the reference light area A1 and besides a predetermined value other than "0" is set to the inside of the signal light area A2. Then, the mapping unit 62 controls the output voltage by the intensity modulation driver 23 based on this data pattern.

Here, in this instance, the "predetermined value" to be allocated to the signal light area A2 is set to a value which satisfies the condition of a$\geq$2MAX given hereinabove. Namely, the "predetermined value" is set to a value which is determined depending upon the values of the amplitude and the phase to be combined upon recording modulation described hereinabove and which is higher than twice the value of a higher one of the maximum values of the absolute values of the amplitude (x) on the I axis and the amplitude (y) on the Q axis of the signal to be recorded. It is to be noted that, in the case of the QPSK in this instance, the maximum values of the absolute values of the amplitude (x) on the I axis and the amplitude (y) on the Q axis of the signal to be recorded are both "1" and equal, and accordingly, a$\geq$2x, 2y should be satisfied.

To the mapping unit 62, the value of the addition amount a (=b) which satisfies such a condition as described above is set in advance, and the value of the addition amount a set in this manner is allocated as the "predetermined value" described above.

Further, in this instance, the coherent light outputs an equal intensity upon reading out carried out twice. Accordingly, also in amplitude control upon second time reading out by the mapping unit 62, similar control to that described hereinabove is carried out.

Further, the mapping unit 62 carries out a process for applying predetermined phase modulation to the reference light area A1 and the signal light area A2 together with such control regarding the amplitude as described above.

In this instance, after the phase of the reference light is modulated to that same as that upon recording as described hereinabove with reference to (b) of FIG. 20, upon first time reading out, the phase of the signal light is modulated into "0," but upon second time reading out, the phase of the signal light is modulated into "π/2."

From this, the mapping unit 62 produces, first as first time control, a data pattern for making the phase in the overall area of the reference light area A1 same as that upon recording and produces a data pattern wherein the overall area of the signal light area A2 is filled with a value corresponding to "π/2." Then, the data patterns are joined together to produce a data pattern for all effective pixels of the phase modulator 3b, and the output voltage of the phase modulation driver 25 is controlled based on the data pattern.

Further, as second time control, a data pattern wherein the same pattern as that upon recording described above is maintained for the reference light area A1 and the signal light area A2 is filled with a value corresponding to the phase "π" is produced. Then, the data patterns are joined together to produce a data pattern for all effective pixels of the phase modulator 3b, and the output voltage of the phase modulation driver 25 is controlled based on the data pattern.

By such control upon reproduction of the mapping unit 62 as described above, two different readout signals to which two coherent light beams whose phases have a relationship different by π/2 from each other (that is, a relationship wherein the phases are orthogonal to each other) are obtained with regard to one hologram page recorded on the hologram recording medium 10.

In this instance, by the amplitude control described above, the intensity of the coherent light to be added can satisfy the condition that it is higher than twice that one of the maximum values of the absolute values of the amplitude on the I axis and the amplitude on the Q axis of a signal to be recorded.

Figure 25:
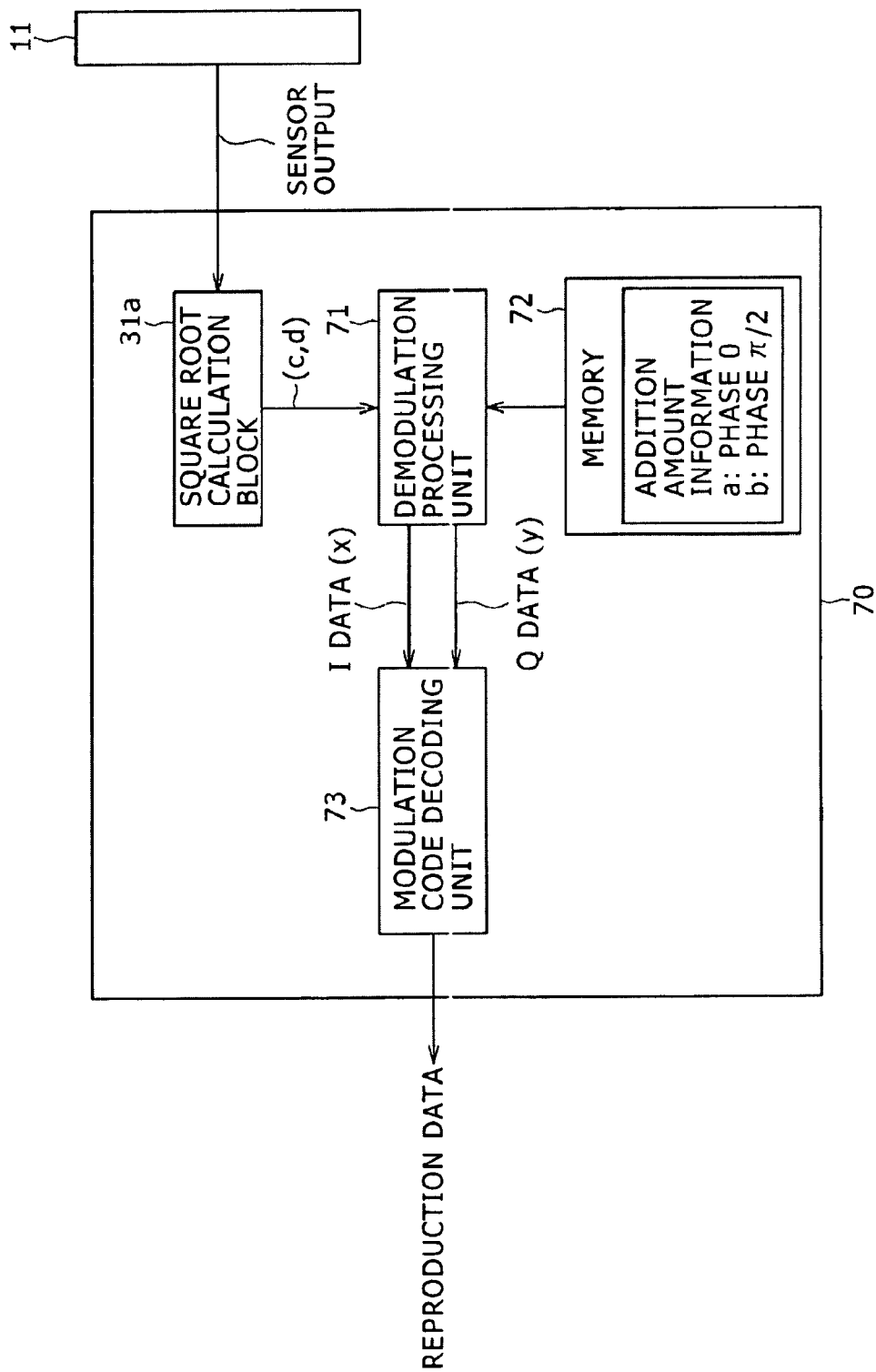
FIG. 25 is a view principally showing a configuration of a data reproduction section provided in the recording and reproduction apparatus as the second embodiment.

FIG. 25 shows a configuration of a data reproduction section 70 for carrying out data reproduction based on two different readout signals obtained in such a manner as described above. It is to be noted that, also in FIG. 25, elements described hereinabove are denoted by like reference characters and description of them is omitted.

Further, for simplified description, it is assumed that the image sensor 11 is configured so as to detect the value for one data pixel of the SLM 3 from one pixel thereof, and such an oversampling or upconversion process as described hereinabove with reference to FIG. 17 is not carried out. Further, in this instance, a case wherein it is assumed that the pixels of the SLM 3 side and the image sensor 11 side coincide strictly in a one-by-one corresponding relationship with each other and a process (re-sampling process) for the positioning described hereinabove is omitted is described.

As shown in the figure, the data reproduction section 70 includes a square root calculation block 31a, a demodulation processing unit 71, a memory 72 and a modulation code decoding unit 73.

While FIG. 25 shows the image sensor 11 shown also in FIG. 1, from the image sensor 11 in this instance, two different readout signals described hereinabove are obtained from one hologram page by operation upon reproduction by the data modulation and amplitude phase controlling section 60 described hereinabove with reference to FIG. 24.

In the data reproduction section 70, the two different readout signals obtained for one hologram page from the image sensor 11 are inputted to the square root calculation block 31a. The square root calculation block 31a calculates a square root of each of the values of image signals as the two different readout signals. By this, for each of the pixels (for each data pixel), values as the "squire root c of the sensor output for 1 axis addition" and the "square root d of the sensor output for Q axis addition" described hereinabove are obtained.

The demodulation processing unit 71 demodulates the recorded signal based on the values of the square root c of the sensor output for 1 axis addition and the square root d of the sensor output for Q axis addition obtained from the square root calculation block 31a and the values of the addition amount information a and b stored in the memory 72 in such a manner as seen in the figure.

It is to be noted here that, although it is illustrated that the addition amount information amount stored in the memory 72 is the two kinds of information including the addition amount a (upon addition of coherent light of the phase 0) and the addition amount b (upon addition of coherent light of the phase π/2) for the convenience of description, as described hereinabove, since the intensity of coherent light in this instance is set to an equal intensity for the first and second time irradiation operations, a=b. Accordingly, the addition amount information to be stored in the memory 72 need not necessarily be two values but may be only one value. For example, only the addition amount a may be stored, and in the later calculation process, a and b may be handled as a=b.

Here, a processing procedure carried out by the demodulation processing unit 71 for demodulating I data and Q data using the values of a, b, c and d is described with reference to a flow chart of FIG. 26.

Figure 26:
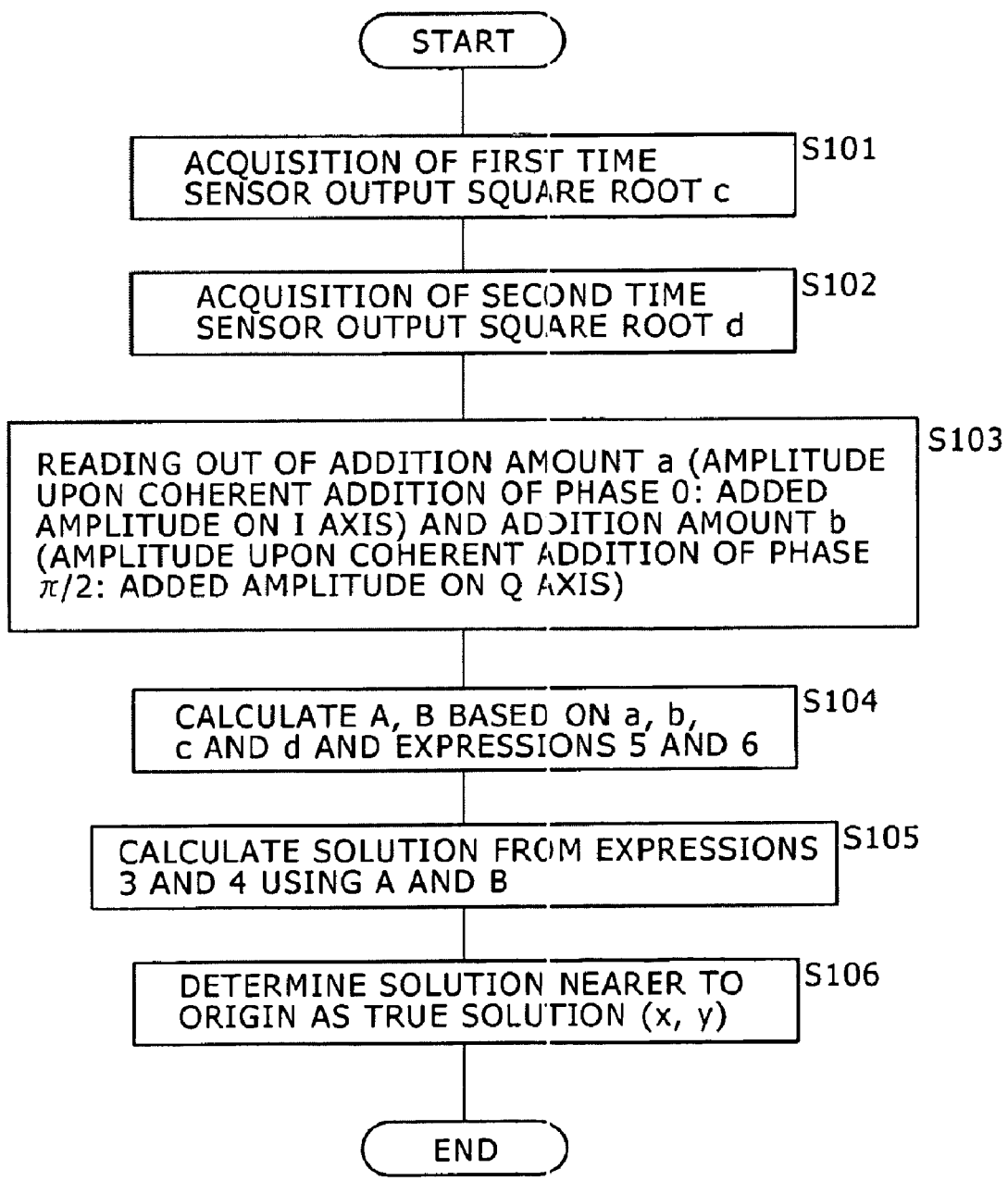
FIG. 26 is a flow chart illustrating a processing procedure for implementing multi-value demodulation as the second embodiment.

Referring to FIG. 26, first time acquisition of the sensor output square root c at step S101 and second time acquisition of the sensor output square root d at step S102 correspond to that the values of the square root c of the sensor output for 1 axis addition and the square root d of the sensor output for Q axis addition obtained from the square root calculation block 31a in such a manner as described above are inputted.

Then at subsequent step S103, the values of the addition amount a and the addition amount b are read out from the memory 72. Where only one value such as, for example, only the addition amount a is stored in the memory 72 as described hereinabove, the value may be read out and handled as the values of both of the addition amount a and the addition amount b.

Then at subsequent step S104, the values of A and B are calculated based on the values of a, b, c and d and the [expression 5] and [expression 6] In other words, a, b, c and d are substituted into the [expression 5] and [expression 6] given hereinabove to determine the values of A and B.

Further, at subsequent step S105, the values of A and B are used to calculate solutions from the [expression 3] and [expression 4]. In particular, the values of A and B determined at step S104 and the values of a, b, c and d are substituted into the [expression 3] and [expression 4] to determine the solutions of x and y.

Thereafter, at step S106, that one of the solutions which is nearer to the origin is determined as the true solution (x, y). In other words, where two values are determined at step S105, that one of the solutions which is nearer to the origin is selected as the true solution (x, y).

Referring to FIG. 25, the demodulation processing unit 71 carries out a process of determining the solution (x, y) for each of the pixels through such a procedure as described above. By this, I data (x) and Q data (y) are demodulated for each signal recorded in each pixel in one hologram page, and a result of the demodulation is supplied to the modulation code decoding unit 73.

The modulation code decoding unit 73 decodes the combination of the I data and the Q data (that is, a multi-value code) supplied from the demodulation processing unit 71 into a two-value code. Namely, the modulation code decoding unit 73 selects a combination of two-value data corresponding to the combination of the I data and the Q data supplied thereto in accordance with a rule for modulation encoding determined in advance and outputs the selected combination. For example, in the case of the preceding example, with regard to pixels where the combination of the I data and the Q data is (1, 1), "11" is selected and outputted; with regard to pixels where the combination is (−1, 1), "10" is selected and outputted; with regard to pixels where the combination is (−1, −1), "01" is selected and outputted; and with regard to pixels where the combination is (1, −1), "00" is selected and outputted.

As conversion of a multi-value code→two-value code is carried out in this manner, recording data are reproduced.

It is to be noted that also the decoding process in this instance may be carried out such that a conversion table which indicates a corresponding relationship between multi-value codes and two-value codes is stored in advance and a corresponding two-value code is selected based on the table.

By such a configuration of the recording and reproduction apparatus as described above, the hologram multi-value recording/reproduction of the second embodiment described hereinabove can be implemented.

It is to be noted that, while, in the foregoing description, the recording capacity is increased to twice because a case wherein the QPSK is applied as the multi-value modulation and demodulation method is described, for example, if the 8PSK method is applied as the multi-value modulation and demodulation method by the same PSK, then the recording capacity can be increased to three times. Or, a technique which applies not only the PSK method but also the QAM method may be used. In this instance, a multi-value code may be represented by a combination not of a single amplitude but of a plurality of amplitudes with a phase. For example, where the 4QAM is used to carry out modulation encoding wherein two amplitudes and two phases are combined, the recording capacity can be increased to twice similarly as in the case of the QPSK. Or, if the 16QAM is applied to combine four amplitudes and four phases, then the recording capacity can be increased to four times.

By increasing the number of amplitudes and phases to be combined in this manner, the number of values which can be represented per one bit (per one pixel) can be increased as much, and further increase of the recording capacity can be achieved thereby.

It is to be noted that, also where not only a plurality of phases but also a plurality of amplitudes are used as in the QAM, if the demodulation process (process for determining the solution (x, y)) itself uses a similar technique to that described hereinabove, then I data and Q data can be obtained similarly. Then, by selecting, from the combination of the I data and the Q data, a corresponding two-value data pattern also in this instance in accordance with the recording modulation encoding rule, recorded multi-value codes can be appropriately decoded into two-value codes.

Further, although, in the description of the second embodiment, description of configurations for positioning such as configurations for oversampling, an upconversion process and a re-sampling process is omitted for the convenience of description, also where the multi-value recording/reproduction technique of the second embodiment is adopted, the configurations for positioning can be combined similarly as in the first embodiment described hereinabove. For example, such a technique as conventionally known wherein a sync pattern is inserted in recording data and positioning is carried out on the reproduction side based on a result of detection of the position of the sync pattern can be combined. It is to be noted that, as the technique for positioning to be combined with the recording/reproduction technique of the embodiment, not only such a technique wherein a sync pattern is inserted but also some other technique may be combined.

3-3. Modification to the Second Embodiment

Here, according to the foregoing description, in the case of the second embodiment, in order to make it possible to appropriately carry out multi-value demodulation in such a manner that a true solution from between two solutions obtained based on the [expression 3] and [expression 4] is determined uniquely, it is necessary to satisfy the condition of a≧2MAX as the condition for the addition amount a (b).

However, this is a condition where it is assumed to use a combination of an arbitrary amplitude and an arbitrary phase to carry out multi-value encoding to the end, but, for example, where the phase to be combined is limited to 0, $\pi/2$, $\pi$ and $3\pi/2$ (in other words to 0 degree, 90 degrees, 180 degrees and 270 degrees), the condition for the addition amount a need not necessarily be a≧2MAX, but the condition that the addition amount a is "higher than the absolute value of the maximum value of the amplitude of the reproduction image" for allowing linear reading out (in other words, the condition of a>x, y) may be used as it is.

This is described below with reference to FIG. 27.

In FIG. 27, in both of (a) of FIG. 27 and (b) of FIG. 27, signal point arrangements where the phases 0, $\pi/2$, $\pi$ and $3\pi/2$ are combined with one certain amplitude with reference to the I axis and the Q axis are indicated by dark spots. Then, in (a) of FIG. 27, a manner in which each of the signal points varies where an amplitude a of the phase 0 is added (that is, where coherent light of the phase 0 and the addition amount a is added) is indicated by an arrow mark and a dark square mark. Meanwhile, in (b) of FIG. 27, a manner in which each of the signal points where an amplitude b of the phase $\pi/2$ is added (that is, where coherent light of the phase $\pi/2$ and the addition amount b is added) is indicated by an arrow mark and a dark square mark similarly. It is to be noted that, also in this instance, a=b is assumed.

Here, as can be recognized by referring to (a) and (b) of FIG. 27, when the phase 0 or the phase $\pi$ is combined with a certain amplitude, the value of the signal point on the Q axis is 0. In other words, y=0. From this, the [expression 1] given hereinabove becomes $[x+a]2=c2$, and from this, it can be recognized that, if x+a≧0, then x=c−a. By substituting this into the [expression 2], $$\Delta x = (c-a)2 + b2 - d2 \quad \text{[expression 7]}$$

is obtained.

On the other hand, when the phase $7\pi/2$ or the phase $3\pi/2$ is combined, since the coordinate of the signal point on the I axis becomes 0 (x=0), the [expression 2] becomes $(y+b)2=d2$. From this, if y+b≧0, then y d−b. By substituting this into the [expression 1], $$\Delta y = (d-b)2 + a2 - c2 \quad \text{[expression 8]}$$

is obtained.

Accordingly, where $\Delta x$ and $\Delta y$ after twice reading are calculated, if $|\Delta x| < |\Delta y|$, then $x = c-a$, $y = 0$, but if $|\Delta x| \geq |\Delta y|$, then $x = 0$, $y = d-b$ and the solution (x, y) can be determined uniquely thereby.

Here, if it is tried to implement such a technique as a modification to the second embodiment as described above, then upon recording, the mapping unit 62 shown in FIG. 24 does not use any other phase than 0, π/2, π and 3π/2 as a phase to be combined with an amplitude. In particular, for example, where four phases are combined with one certain amplitude to carry out four-value recording, a four-value code is represented by combining the four phases 0, π/2, π and 3π/2 with the amplitude.

Further, in this instance, upon reproduction, the necessity for the mapping unit 62 to set a value for satisfying a≧2MAX given hereinabove as a value to be allocated to the inside of the signal light area A2 is eliminated, but at least a value with which a>x, y is satisfied (that is, the value is set higher than the highest value of the absolute values of the amplitude of the reproduction image) may be allocated.

Further, for the confirmation, operation of the demodulation processing unit 71 described hereinabove with reference to FIG. 25 for implementing the demodulation process as such a modification to the second embodiment as described above is described. Also in this instance, the values of the square root c of the sensor output for I axis addition and the square root d of the sensor output of the Q axis addition calculated by the square root calculation block 31a upon twice reading out operations by coherent light addition are acquired first. Then, in this instance, the values of c and d and the values of a and b read out from the memory 72 are used to calculate Δx and Δy in accordance with the [expression 7] and [expression 8] given hereinabove, respectively.

Then, if |Δx|<|Δy|, then x=c−a is calculated, and a result of the calculation and y=0 are joined together to determine a solution (x, y). On the other hand, if |Δx|≧|Δy|, then y=d−b is calculated, and a result of the calculation and x=0 are joined together to determine a solution (x, y).

In this manner, with the modification to the second embodiment, by adopting multi-value recording wherein the phase for combination is limited to 0, π/2, π and 3π/2, the condition for the addition amount of coherent light can be made equal to the condition for allowing linear reading out.

4. Modifications

Although the embodiments of the present invention are described above, the present invention shall not be limited to the examples described above.

For example, while, in the foregoing description, a case wherein the present invention is applied to a recording and reproduction apparatus which can carry out both of recording and reproduction, the present invention can be applied suitably to an apparatus for exclusive use for recording (recording apparatus) which can carry out only recording or an apparatus for exclusive use for reproduction (reproduction apparatus) which can carry out only reproduction.

Describing for the confirmation, where a recording apparatus is based on the recording and reproduction apparatus of the first embodiment, the recording apparatus provided can achieve increase of the data recording capacity by making three-value recording possible.

On the other hand, where a recording apparatus is based on the recording and reproduction apparatus of the second embodiment, the recording apparatus provided can achieve increase of the data recording capacity by making it possible to record multi-value codes obtained by modulation encoding by the PSK or QAM method. Further where a reproduction apparatus is based on the recording and reproduction apparatus of the second embodiment, the reproduction apparatus provided can appropriately reproduce data recorded on a hologram recording medium on which multi-value recording is carried out during modulation encoding by the PSK or QAM method.

Further, while the embodiments indicate a case wherein the recording and reproduction apparatus are compatible with the hologram recording medium 10 of the reflection type having a reflection film, the present invention can be applied appropriately also where the recording and reproduction apparatus is made compatible with a hologram recording medium of the transmission type which does not include a reflection film.

In this instance, in the reproduction system, the beam splitter 4 for introducing diffraction light obtained as reflection light in response to irradiated reference light toward the image sensor side can be omitted. Instead, in this instance, since diffraction light obtained in response to irradiation of reference light is transmitted through the hologram recording medium itself, the reproduction system should be configured such that an additional objective lens (condensing lens) is provided on the opposite side of the hologram recording medium as viewed from the emitting point side of the laser light such that diffraction light as transmission light is introduced to the image sensor side through the condensing lens.

Describing for the confirmation, also in the case of such a transmission type as just described, the basic operation itself of hologram recording and reproduction is similar to that in the case of the reflection type, and upon recording, reference light is irradiated together with signal light to record data in the form of interference fringes of the reference light and the signal light upon the hologram recording medium. Then, upon reproduction, reference light and coherent light are irradiated upon the hologram recording medium, and diffraction light (reproduction image) and coherent light obtained from the hologram recording medium are detected by means of an image sensor to reproduce data similarly.

Further, while, in the foregoing description, a case is described wherein the present invention is applied to a case wherein a coaxial method wherein reference light and signal light are disposed on the same axis and irradiated upon a hologram recording medium is adopted, the present invention can be applied suitably also where a so-called two-light flux method wherein signal light and reference light are irradiated at different angles is adopted.

Further, while, in the foregoing description, a case is described wherein an intensity modulator for carrying out spatial light intensity modulation for production of signal light and reference light and a phase modulator for carrying out spatial light phase modulation for the signal light and the reference light are formed integrally, also it is possible to adopt a different configuration wherein the intensity modulator and the phase modulator are formed separately from each other and disposed at different positions in the optical system.

However, even where the intensity modulator and the phase modulator are formed as separate members in this manner, it is necessary for pixels of them to correspond strictly in a one-by-one corresponding relationship to each other. In other words, where the intensity modulator and the phase modulator are formed as separate members in this manner, it is necessary for positioning of them and adjustment in optical magnification to be carried out so that the pixels of the intensity modulator and the phase modulator may correspond strictly in a one-by-one corresponding relationship to each other.

Further, while, in the foregoing description, a liquid crystal panel wherein intensity modulation can be carried out variably in response to the driving voltage level is used as the intensity modulator, if it is assumed that the intensity of light to be added as the coherent light is "1, 0" in the case of the first embodiment, only it is necessary to simply control only ON/OFF of light. In such an instance, also it is possible to use, for example, a DMD (Digital Micromirror Device) as the intensity modulator.

Also in the second embodiment, for example, where the amplitude to be combined as a multi-value code upon recording is "0" or "1" and besides the intensity of light to be added as the coherent light is "1.0," a DMD can be used as the intensity modulator similarly.

Also it is possible to form the intensity modulator not only as a liquid crystal panel of the transmission type used in the embodiments but also as a liquid crystal panel of the reflection type.

Further, while, in the foregoing description, a case wherein a liquid crystal panel of the transmission type is used as the phase modulator is described, also it is possible to use any other element only if it can variably modulate the phase in a unit of a pixel in response to the driving voltage level of each pixel.

The invention claimed is:

1. A recording apparatus for carrying out recording on a hologram recording medium on which data are recorded as interference fringes of reference light and signal light, comprising:
    a spatial light intensity modulator configured to carry out spatial light intensity modulation in a unit of a pixel;
    a spatial light phase modulator configured to carry out spatial light phase modulation in a unit of a pixel;
    an optical system configured to introduce light emitted from a light source to the hologram recording medium through the spatial light intensity modulator and the spatial light phase modulator;
    a convertor configured to convert an input data train formed from combinations of two different values into another data train formed from combinations of three or more different values; and
    an amplitude and phase controller configured to control a light intensity and phase of each of the pixels of the spatial light intensity modulator and the spatial light phase modulator in response to each of the values of the another data train obtained from the converter, wherein
    the converter carries out a modulation process according to a method using both amplitude and phase data or a method using a plurality of phase data displaced from each other to convert the input data train into combinations of in-phase data and quadrature data, and
    the amplitude and phase controller is configured to perform control so that the light intensity and the phase of each of the pixels of the spatial light intensity modulator and the spatial light phase modulator may be a predetermined light intensity and a predetermined phase which correspond to a combination of the in-phase data and quadrature data obtained by the convertor.

2. The recording apparatus according to claim 1, wherein the converter is configured to convert the input data train into the another data train formed from combinations of three different values, and the amplitude and phase controller is configured to
    control the light intensity of each of the pixels of the spatial light intensity modulator to 0 or a predetermined intensity other than 0, and
    control the phase of each of the pixels of the spatial light phase modulator to 0 or a predetermined phase other than 0 in response to each of the values of the another data train obtained by the converter.

3. The recording apparatus according to claim 2, wherein the converter is configured to carry out the conversion of the input data train into the another data train formed from combinations of the three different values such that a respective number of the two different values other than 0 in the another data train are equal to each other.

4. The recording apparatus according to claim 3, wherein the converter is configured to convert the input data train into the another data train formed from combinations of the three different values where one symbol of the input data train is formed from more than 8 bits and one symbol of the another data train formed from combinations of the three different values is formed from more than 7 bits.

5. The recording apparatus according to claim 1, wherein the amplitude and phase controller is configured to control the phase of each of the pixels of the spatial light phase modulator to 0, $\pi/2$, $\pi$, or $3\pi/2$ in response to each value of the another data train obtained by the converter.

6. The recording apparatus according to claim 1, wherein the recording apparatus is configured to reproduce a program recording medium,
    the converter is configured to convert the input data train into the another data train formed from combinations of three different values,
    the amplitude and phase controller is configured to
        control, upon recording, the spatial light intensity modulator so that, where a reference light area for producing the reference light and a signal light area for producing the signal light are defined in advance by the spatial light intensity modulator and the spatial light phase modulator, the light intensity at least in the reference light area may have a predetermined pattern, and control, in the signal light area, the light intensity and the phase of each of the pixels of the spatial light intensity modulator and the spatial light phase modulator in response to each value of the another data train obtained by the converter, and
        control, upon reproduction, the spatial light intensity modulator so that, when a reproduction image according to the data recorded on the hologram recording medium is to be obtained by irradiation of the reference light, the light intensity in the reference light area may have a pattern same as the predetermined pattern used upon recording and an overall light intensity in the signal light area may be a predetermined light intensity higher than a maximum value of absolute values of the amplitude of the reproduction image, and control the spatial light phase modulator so that a phase difference of $\pi/2$ may be provided between a reference phase in the reference light area and the phase in the signal light area, and
    the recording apparatus further includes:
        an image signal acquisition unit configured to
            receive the reproduction image according to the data recorded on the hologram recording medium and obtained in response to introduction of the reference light and coherent light to the hologram recording medium by the optical system, the reference light being produced during the control in the reference light area upon reproduction by the amplitude and phase controller, and the coherent light being of the predetermined light intensity produced during the control in the signal light area, and
            obtain an image signal based on a result of the reception of the reproduction image and the coherent light;
        a square root calculator configured to calculate a square root of each of values that form the image signal obtained by the image signal acquisition unit;
        a remover configured to remove a component of the coherent light from the image signal based on the result of the square root calculation by the square root calculator;

a pixel value acquisition unit configured to acquire the pixel values recorded on the hologram recording medium based on the image signal obtained by the remover;

a data discriminator configured to carry out data discrimination regarding the pixel values obtained by the pixel value acquisition unit to obtain a data train formed from combinations of the three different values; and a decoder configured to decode the data train obtained by the data discriminator and formed from combinations of the three different values into another data train formed from combinations of two different values in accordance with a conversion rule by the convertor.

7. The recording apparatus according to claim 6, wherein the remover is configured to subtract a value corresponding to the predetermined light intensity of the coherent light from the result of the square root calculation to remove the component of the coherent light.

8. The recording apparatus according to claim 1, wherein the recording apparatus is configured to reproduce the hologram recording medium, the amplitude and phase controller is configured to control, upon recording, the spatial light intensity modulator so that, where a reference light area for producing the reference light and a signal light area for producing the signal light are defined in advance by the spatial light intensity modulator and the spatial light phase modulator, the light intensity at least in the reference light area may have a predetermined pattern, and control, in the signal light area, so that the light intensity and the phase of each of the pixels of the spatial light intensity modulator and the spatial light phase modulator may be a predetermined light intensity and a predetermined phase corresponding to a combination of in-phase data and quadrature data obtained by the converter, and control, upon reproduction, the spatial light intensity modulator so that, when a reproduction image according to the data for one hologram page recorded on the hologram recording medium is to be obtained by irradiation of the reference light, the light intensity in the reference light area may have a pattern same as the predetermined pattern used upon recording and an overall light intensity in the signal light area may be, where a higher one of maximum values of absolute values of the amplitude on an in-phase axis and the amplitude on a quadrature axis of the recording signal determined from a combination of a light intensity and a phase to be modulated by the spatial light modulator and the spatial light modulator is represented by MAX, higher than twice MAX, and control the phase of each of the pixels of the spatial light phase modulator so that two different beams of coherent light having a light intensity obtained by the control of the light intensity in the signal light area and higher than twice MAX are produced separately at two different timings such that the phase difference thereof from the reproduction image is 0 and $\pi/2$, and the recording apparatus further includes:

an image signal acquisition unit configured to receive the reproduction image according to the data recorded on the hologram recording medium and obtained twice in response to introduction of the two beams of the coherent light and the reference light produced during the control for each one hologram page upon reproduction by the amplitude and phase controller to the hologram recording medium by the optical system and the coherent light, and obtain two different image signals based on a result of the reception of the reproduction image and the coherent light;

a square root calculator configured to calculate a square root of each of values that form the two image signals obtained by the image signal acquisition unit;

a multi-value demodulator configured to carry out a mathematic operation using square root calculation results of the two different image signals obtained by the square root calculator and the values of the light intensity of the coherent light to calculate a combination of in-phase data and quadrature data recorded on each of the pixels in the hologram page; and a decoder configured to decode the data formed from combinations of in-phase data and quadrature data obtained as calculation results of the multi-value demodulator into data formed from combinations of the two different values in accordance with a conversion rule by the converter.

9. The recording apparatus according to claim 8, wherein the multi-value demodulator is configured to calculate, where the square root calculation results of the two different image signals obtained by the square root calculator are represented by c and d, the light intensity when the value of the light intensity of the coherent light when the phase difference of the coherent light from the reproduction image is 0 is represented by a and the light intensity when the value of the light intensity of the coherent light when the phase difference is $\pi/2$ is represented by b, the value of the in-phase data recorded is represented by x, the value of the quadrature data recorded is represented by y and A and B are variables, the values of x and y using the expressions $x=\{-a^*(A+b^2)\pm b\sqrt{B}\}/(a^2+b^2)$ $y=\{-b^*(A-b^2)\pm a\sqrt{B}\}/(a^2+b^2)$ $2A=a^2-b^2-c^2+d^2$ $B=a^2*d^2+b^2*c^2-a^2*b^2-A^2$ to calculate the combination of the recorded in-phase data and quadrature data.

10. A recording and reproduction method for a recording and reproduction apparatus that carries out recording and reproduction on and from a hologram recording medium on which data are recorded as interference fringes of reference light and signal light and includes a spatial light intensity modulator that carries out spatial light intensity modulation in a unit of a pixel, a spatial light phase modulator that carries out spatial light phase modulation in a unit of a pixel, and an optical system that introduces light emitted from a light source to the hologram recording medium through the spatial light intensity modulator and the spatial light phase modulator, comprising:

a three-value modulation encoding step of converting an input data train formed from combinations of two different values into another data train formed from combinations of three different values by carrying out a modulation process according to a method using both amplitude and phase data or a method using a plurality of phase data displaced from each other to convert the input data train into combinations of in-phase data and quadrature data;

an amplitude and phase controlling step of controlling, upon recording, the spatial light intensity modulator so that, where a reference light area for producing the reference light and a signal light area for producing the signal light are defined in advance by the spatial light intensity modulator and the spatial light phase modulator, the light intensity at least in the reference light area may have a predetermined pattern, and controlling, in the signal light area, the light intensity and the phase of each of the pixels of the spatial light intensity modulator and the spatial light phase modulator in response to each value of the data train obtained by the three-value modulation encoding step, wherein the light intensity and the phase of each of the pixels of the spatial light intensity modulator and the spatial light phase modulator is controlled to be a predetermined light intensity and a predetermined phase which correspond to a combination of the in-phase data and quadrature data obtained in the step of three-value modulation, and controlling, upon reproduction, the spatial light intensity modulator so that, when a reproduction image according to the data recorded on the hologram recording medium is to be obtained by irradiation of the reference light, the light intensity in the reference light area may have a pattern same as the predetermined pattern used upon recording and an overall light intensity in the signal light area may be a predetermined light intensity higher than a maximum value of absolute values of the amplitude of the reproduction image, and controlling the spatial light phase modulator so that a phase difference of $\pi/2$ may be provided between a reference phase in the reference light area and the phase in the signal light area;

an image signal acquisition step of receiving the reproduction image according to the data recorded on the hologram recording medium and obtained in response to introduction of the reference light produced during the control in the reference light area upon reproduction by the amplitude and phase controlling step and coherent light of the predetermined light intensity produced during the control in the signal light area to the hologram recording medium by the optical system and the coherent light and obtaining an image signal based on a result of the reception of the reproduction image and the coherent light;

a square root calculation step of calculating a square root of each of values which form the image signal obtained by the image signal acquisition step;

a removal step of removing a component of the coherent light from the image signal based on the result of the square root calculation by the square root calculation step;

a pixel value acquisition step of acquiring the pixel values recorded on the hologram recording medium based on the image signal obtained by the removal step;

a data discrimination step of carrying out data discrimination regarding the pixel values obtained by the pixel value acquisition step to obtain a data train formed from combinations of the three different values; and a decoding step of decoding the data train obtained by the data discrimination step and formed from combinations of the three different values into another data train formed from combinations of two different values in accordance with a rule for modulation encoding by the three-value modulation encoding step.

11. The recording and reproduction method according to claim 10, wherein at the removal step, a value corresponding to the predetermined light intensity of the coherent light is subtracted from the result of the square root calculation to remove the component of the coherent light.

12. A recording and reproduction method for a recording and reproduction apparatus that carries out recording and reproduction on and from a hologram recording medium on which data are recorded as interference fringes of reference light and signal light and includes a spatial light intensity modulator that carries out spatial light intensity modulation in a unit of a pixel, a spatial light phase modulator that carries out spatial light phase modulation in a unit of a pixel, and an optical system that introduces light emitted from a light source to the hologram recording medium through the spatial light intensity modulator and the spatial light phase modulator, comprising:

a multi-value modulation encoding step of carrying out a modulation process according to a method using both amplitude and phase data or a method using a plurality of phase data displaced from each other to convert an input data train formed from combinations of two different values into combinations of in-phase data and quadrature data;

an amplitude and phase controlling step of controlling, upon recording, the spatial light intensity modulator so that, where a reference light area for producing the reference light and a signal light area for producing the signal light are defined in advance by the spatial light intensity modulator and the spatial light phase modulator, the light intensity at least in the reference light area may have a predetermined pattern, and controlling, in the signal light area, so that the light intensity and the phase of each of the pixels of the spatial light intensity modulator and the spatial light phase modulator may be a predetermined light intensity and a predetermined phase corresponding to a combination of in-phase data and quadrature data obtained by the multi-value modulation encoding step, and controlling, upon reproduction, the spatial light intensity modulator so that, when a reproduction image according to the data for one hologram page recorded on the hologram recording medium is to be obtained by irradiation of the reference light, the light intensity in the reference light area may have a pattern same as the predetermined pattern used upon recording and an overall light intensity in the signal light area may be, where a higher one of maximum values of absolute values of the amplitude on an in-phase axis and the amplitude on a quadrature axis of the recording signal determined from a combination of a light intensity and a phase to be modulated by the spatial light modulater and the spatial light phase modulator is represented by MAX, higher than twice MAX, and controlling the phase of each of the pixels of the spatial light phase modulator so that two different beams of coherent light having a light intensity obtained by the control of the light intensity in the signal light area and higher than twice MAX are produced separately at two different timings such that the phase difference thereof from the reproduction image is 0 and $\pi/2$;

an image signal acquisition step of receiving the reproduction image according to the data recorded on the hologram recording medium and obtained twice in response to introduction of the two beams of the coherent light and the reference light produced during the control for each one hologram page upon reproduction by the amplitude and phase controlling step to the hologram recording medium by the optical system and the coherent light and obtaining two different image signals based on a result of the reception of the reproduction image and the coherent light;

a square root calculation step of calculating a square root of each of values which form the two image signals obtained by the image signal acquisition step;

a multi-value demodulation step of carrying out a mathematic operation using square root calculation results of the two different image signals obtained by the square root calculation step and the values of the light intensity of the coherent light to calculate a combination of the in-phase data and quadrature data recorded on each of the pixels in the hologram page; and a decoding step of decoding the data formed from the combinations of the in-phase data and quadrature data obtained as calculation results of the multi-value demodulation step into data formed from combinations of the two different values in accordance with a rule for modulation encoding by the multi-value modulation encoding step.

13. The recording and reproduction method according to claim 12, wherein at the multi-value modulation step, where the square root calculation results of the two different image signals obtained at the square root calculation step are represented by c and d, the light intensity when the value of the light intensity of the coherent light when the phase difference of the coherent light from the reproduction image is 0 is represented by a and the light intensity when the value of the light intensity of the coherent light when the phase difference is $\pi/2$ is represented by b, the value of the in-phase data recorded is represented by x, the value of the quadrature data recorded is represented by y and A and B are variables, the values of x and y are calculated using the expressions $$x=\{-a*(A+b^2)\pm b\sqrt{B}\}/(a^2+b^2)$$

$$y=\{-b*(A-b^2)\pm a\sqrt{B}\}/(a^2+b^2)$$

$$2A=a^2-b^2-c^2+d^2$$

$$B=a^2*d^2+b^2*c^2-a^2*b^2-A^2$$

to calculate the combination of the recorded in-phase data and quadrature data.

14. A reproduction method for a reproduction apparatus which that carries out reproduction from a hologram recording medium on which information of light intensity and phase based on combinations of in-phase data and quadrature data obtained by a modulation process according to a method using both amplitude and phase data or a method using a plurality of phase data displaced from each other is recorded as interference fringes of reference light and signal light and includes a spatial light intensity modulator that carries out spatial light intensity modulation in a unit of a pixel, a spatial light phase modulator that carries out spatial light phase modulation in a unit of a pixel, and an optical system for introducing light emitted from a light source to the hologram recording medium through the spatial light intensity modulator and the spatial light phase modulator, comprising:

an amplitude and phase controlling step of
controlling the light intensity of each of the pixels of the spatial light intensity modulator so that, when a reproduction image according to the data for one hologram page recorded on the hologram recording medium is to be obtained by irradiation of the reference light, the light intensity in a reference light area for producing the reference light may have a predetermined pattern same as that used upon recording and an overall light intensity in a signal light area for producing the signal light may be, where a higher one of maximum values of absolute values of the amplitude on an in-phase axis and the amplitude on a quadrature axis of a signal recorded on the hologram recording medium is represented by MAX, higher than twice MAX, and controlling the phase of each of the pixels of the spatial light phase modulator so that two different beams of coherent light having a light intensity obtained by the control of the light intensity in the signal light area and higher than twice MAX are produced separately at two different timings such that the phase difference thereof from the reproduction image is 0 and $\pi/2$;

an image signal acquisition step of receiving the reproduction image according to the data recorded on the hologram recording medium and obtained twice in response to introduction of the two beams of the coherent light and the reference light produced during the control for each one hologram page upon reproduction by the amplitude and phase controlling step to the hologram recording medium by the optical system and the coherent light and obtaining two different image signals based on a result of the reception of the reproduction image and the coherent light;

a square root calculation step of calculating a square root of each of values which form the two image signals obtained by the image signal acquisition step;

a multi-value demodulation step of carrying out a mathematic operation using square root calculation results of the two different image signals obtained by the square root calculation step and the values of the light intensity of the coherent light to calculate a combination of the in-phase data and quadrature data recorded on each of the pixels in the hologram page; and a decoding step of decoding the data formed from the combinations of the in-phase data and quadrature data obtained as calculation results of the multi-value demodulation step into data formed from combinations of the two different values in accordance with a rule for modulation encoding determined in advance.

15. The recording and reproduction method according to claim 14, wherein at the multi-value modulation step, where the square root calculation results of the two different image signals obtained at the square root calculation step are represented by c and d, the light intensity when the value of the light intensity of the coherent light when the phase difference of the coherent light from the reproduction image is 0 is represented by a and the light intensity when the value of the light intensity of the coherent light when the phase difference is $\pi/2$ is represented by b, the value of the in-phase data recorded is represented by the value of the quadrature data recorded is represented by y and A and B are variables, the values of x and y are calculated using the expressions $$x=\{-a*(A+b^2)\pm b\sqrt{B}\}/(a^2+b^2)$$

$$y=\{-b*(A-b^2)\pm a\sqrt{B}\}/(a^2+b^2)$$

$$2A=a^2-b^2-c^2+d^2$$

$$B=a^2*d^2+b^2*c^2-a^2*b^2-A^2$$

to calculate the combination of the recorded in-phase data and quadrature data.

* * * * *